US012692434B2

(12) United States Patent
Deng et al.

(10) Patent No.: US 12,692,434 B2

(45) Date of Patent: Jul. 28, 2026

(54) ORGANIC COMPOUND AND APPLICATION THEREOF

(71) Applicants: Wuhan Tianma Microelectronics Co., Ltd., Wuhan (CN); Wuhan Tianma Microelectronics Co., Ltd. Shanghai Branch, Shanghai (CN)

(72) Inventors: Dongyang Deng, Wuhan (CN); Qing Chen, Wuhan (CN); Ying Liu, Wuhan (CN); Lei Zhang, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 1050 days.

(21) Appl. No.: 17/457,225

(22) Filed: Dec. 1, 2021

(65) Prior Publication Data

US 2022/0093862 A1 Mar. 24, 2022

(30) Foreign Application Priority Data

Jun. 30, 2021 (CN) ........................ 202110739461.0

(51) Int. Cl.

*C09K 11/06* (2006.01)

*C07F 5/02* (2006.01)

(Continued)

(52) U.S. Cl.

CPC .............. *C09K 11/06* (2013.01); *C07F 5/027* (2013.01); *C07F 7/0816* (2013.01); *H10K 85/40* (2023.02);

(Continued)

(58) Field of Classification Search

None

See application file for complete search history.

(56) References Cited

U.S. PATENT DOCUMENTS

2022/0259187 A1* 8/2022 Lee ...................... C07D 405/14
2023/0006169 A1* 1/2023 Karri ..................... H01L 51/529

FOREIGN PATENT DOCUMENTS

CN 109705100 A 5/2019
CN 110759937 A 2/2020
WO WO2011055914 A1 * 5/2011 ............. C09K 11/06

OTHER PUBLICATIONS

English translation of CN 110054643 A and the original CN 110054643 A, Wei Gao, Jul. 26, 2019 (Year: 2019).*

(Continued)

*Primary Examiner* — Seokmin Jeon

(74) *Attorney, Agent, or Firm* — ALSTON & BIRD LLP

(57) ABSTRACT

Provided are an organic compound and an application thereof. The organic compound has a structure as shown in Formula I. The overlap degree between HOMO and LUMO is effectively reduced through structural framework design and specific group introduction, thus the energy level difference between the triplet state and the singlet state is reduced to below 300 meV, the reverse crossing of the energy from the triplet to the singlet is satisfied. The organic compound obtains a relatively balanced radiative transition rate and good TADF characteristics, and has excellent carrier transport performance, balance and stability of electron mobility and hole mobility, low preparation cost, and environmental friendliness. The organic compound can be used as a light-emitting layer material of an OLED device, and the material has a TADF light-emitting mechanism and high light-emitting quantum efficiency, which can reduce the drive voltage and energy consumption, and improve luminous efficiency and working life.

15 Claims, 1 Drawing Sheet

(51) Int. Cl.
*C07F 7/08* (2006.01)
*H10K 50/11* (2023.01)
*H10K 85/40* (2023.01)
*H10K 85/60* (2023.01)

(52) U.S. Cl.
CPC .... *H10K 85/658* (2023.02); *C09K 2211/1018* (2013.01); *H10K 50/11* (2023.02)

(56) References Cited

OTHER PUBLICATIONS

English translation of CN 108409762 A and the original CN 108409762 A, Zaifeng Xie, Aug. 17, 2018 (Year: 2018).*

* cited by examiner

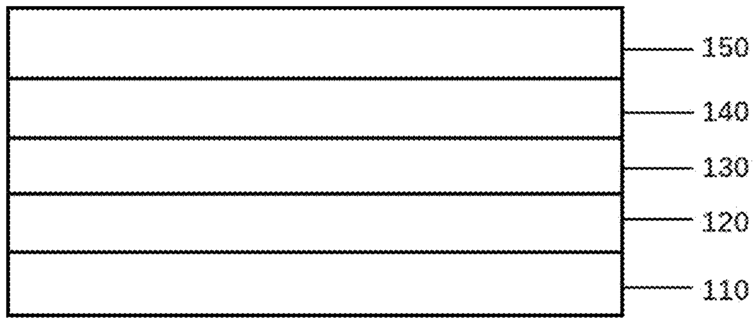
150
140
130
120
110

ORGANIC COMPOUND AND APPLICATION THEREOF

CROSS-REFERENCE TO RELATED APPLICATIONS

The application claims the benefit of the earlier filing date of Chinese Patent Application No. CN202110739461.0, filed on Jun. 30, 2021 to the China National Intellectual Property Administration (CNIPA), the contents of which are incorporated by reference herein in their entirety.

TECHNICAL FIELD

The present disclosure belongs to the technical field of organic electroluminescent materials, and specifically, relates to an organic compound and an application thereof.

BACKGROUND

Organic Electroluminescence, as an emerging photoelectric technology, has attracted great attention from both science and industry since the rise of organic light emitting diodes (OLEDs) in 1987 and has been regarded as the most competitive display technology. Compared with conventional inorganic electroluminescent devices, the OLED devices have been widely used in various industries such as flat panel display, flexible display, solid-state lighting, and vehicle-mounted display due to the advantages of fast response, high efficiency, low power consumption, wide color gamut, ease bending, wide viewing angle, self-luminescence, ultra-thin thickness, large display area, and simple production process.

The OLED device usually has a sandwich-like stacked structure which includes a cathode, an anode, and an organic layer sandwiched between the cathode and the anode. When a voltage is applied to the electrode of the device, the charge migrates and recombines in the organic layer under the action of the electric field to emit light. In the organic layer of the OLED device, the properties of the light-emitting layer are very important, which directly determine the luminous performance of the OLED device. As studies show, according to the light-emitting mechanism, the light-emitting layer materials of the OLED device are mainly divided into the following four types: fluorescent materials, phosphorescent materials, triplet-triplet annihilation (TTA) materials, and thermally activated delayed fluorescent (TADF) materials.

The singlet excited state $S_1$ of the fluorescent material returns to the ground state $S_0$ through radiative transition. According to the spin-statistics theorem, the ratio of singlet excitons to triplet excitons among excitons is 1:3, and thus the maximum internal quantum yield of the fluorescent material is not greater than 25%. According to the Lambert luminescence mode, the light extraction efficiency is about 20%, and thus the external quantum efficiency (EQE) of the OLED device based on the fluorescent material is generally less than 5%.

The triplet excited state $T_1$ of the phosphorescent material directly decays to the ground state $S_0$. Due to the heavy atom effect, intersystem crossing within molecules can be strengthened through spin coupling, and 75% triplet excitons can be directly used to realize the emission with the participation of both $S_1$ and $T_1$ at room temperature with the theoretical maximum internal quantum yield approaching 100%. According to the Lambert luminescence mode, the light extraction efficiency is about 20%, and thus the EQE of the OLED device based on the phosphorescent material can reach 20%. However, since the phosphorescent material is mainly heavy metal complexes such as Ir, Pt, Os, Re, Ru, etc., the production cost of the phosphorescent material is high, which is not conducive to large-scale production. Moreover, under a high current density, the phosphorescent material has a serious efficiency roll-off phenomenon, and the stability of the phosphorescent OLED device is not good.

In the TTA material, two triplet excitons interact to produce a singlet exciton, and the singlet exciton returns to the ground state $S_0$ through radiative transition. Two adjacent triplet excitons recombine to produce a singlet excited state molecule with a higher energy level and a ground state molecule, but two triplet excitons produce a singlet exciton, and thus the theoretical maximum internal quantum yield can only reach 62.5%. In order to prevent large efficiency roll-off, the concentration of triplet excitons needs to be controlled during this process.

In the TADF material, when the energy level difference between $S_1$ state and $T_1$ state is small and the lifetime of excitons of $T_1$ state is long, reverse intersystem crossing (RISC) occurs within molecules at a certain temperature, and the exciton of $T_1$ state is converted to the $S_1$ state by absorbing ambient heat and then decays from the $S_1$ state to the ground state $S_0$. Therefore, 75% triplet excitons and 25% singlet excitons in the TADF material can be utilized at the same time, and the theoretical maximum internal quantum yield can reach 100%. The TADF material is mainly organic compounds and does not need rare metal elements, and thus the production cost of the TADF material is low. Moreover, the TADF material can be chemically modified by various methods to realize property further optimization.

At present, a lot of research work has been devoted to the development of TADF materials, but few TADF materials have been found so far, and their properties are difficult to satisfy the high-performance requirements of the OLED device. TADF materials have great room for improvement in luminescence properties, stability, and preparation technology. Therefore, it is urgent to develop more types of novel TADF materials with higher performance in the art.

SUMMARY

To develop more types of TADF materials with higher performance, a first aspect of the present disclosure is to provide an organic compound having a structure as shown in Formula I:

Formula I

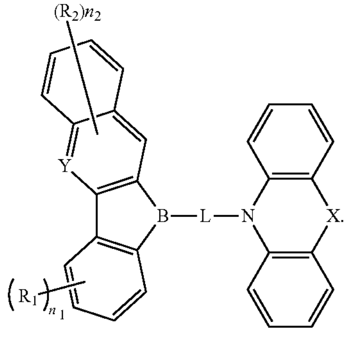

In Formula I, Y is N or CR.

In Formula I, X is selected from O, S, $NR_N$, $CR_{C1}R_{C2}$ or $SiR_{S1}R_{S2}$.

R, $R_N$, $R_{C1}$, $R_{C2}$, $R_{S1}$, and $R_{S2}$ are each independently selected from any one of hydrogen, deuterium, substituted or unsubstituted C1 to C30 linear or branched alkyl, substituted or unsubstituted C6 to C40 aryl, or substituted or unsubstituted C3 to C40 heteroaryl.

In Formula I, L is selected from any one of substituted or unsubstituted C6 to C40 arylene, or substituted or unsubstituted C3 to C40 heteroarylene.

In Formula I, $R_1$ and $R_2$ are each independently selected from any one of deuterium, halogen, cyano, substituted or unsubstituted C1 to C30 linear or branched alkyl, C1 to C30 alkoxy, substituted or unsubstituted C6 to C40 aryl, or substituted or unsubstituted C3 to C40 heteroaryl.

In Formula I, $n_1$ is an integer selected from 0 to 4 and for example, may be 0, 1, 2, 3 or 4.

In Formula I, $n_2$ is an integer selected from 0 to 5 and for example, may be 0, 1, 2, 3, 4 or 5.

In the present disclosure, C1 to C30 may each independently be C1, C2, C3, C4, C5, C6, C7, C8, C9, C10, C12, C14, C15, C16, C18, C20, C22, C24, C26, C28, etc.

C6 to C40 may each independently be C6, C8, C10, C12, C13, C14, C15, C16, C18, C20, C22, C24, C26, C28, C30, C32, C34, C36, C38, etc.

C3 to C40 may each independently be C3, C4, C5, C6, C8, C10, C12, C13, C14, C15, C16, C18, C20, C22, C24, C26, C28, C30, C32, C34, C36, C38, etc.

In the present disclosure, the halogen includes fluorine, chlorine, bromine or iodine.

Through the design of the molecular structure, the organic compound provided by the present disclosure, as a new TADF material, satisfies two conditions: (1) the energy level difference $\Delta E_{ST}$ between $S_1$ state and $T_1$ state is small, $\Delta E_{ST}$ is positively correlated with the overlap degree between HOMO and LUMO, the overlap degree between HOMO and LUMO is reduced by introducing an electron donor unit D, an electron acceptor unit A, and a building unit L with large steric hindrance, and thus $\Delta E_{ST}$, which is less than or equal to 300 meV, is obtained as the low energy level difference between $S_1$ state and $T_1$ state; (2) compared with the relatively balanced radiative transition rate, the number of electrons transitioning from the triplet state to the singlet state is basically the same as the number of electrons transitioning from the singlet state to ground state in unit time, which avoids the energy loss in the form of heat. The organic compound is applied to the OLED device and is suitable to be used as a light-emitting layer material. Such a light-emitting layer material has a light-emitting mechanism of TADF and a high light-emitting quantum efficiency, which significantly improves the luminous performance of the OLED device.

A second aspect of the present disclosure is to provide an OLED device. The OLED device includes an anode, a cathode, and an organic thin film layer disposed between the anode and the cathode, and the organic thin film layer includes at least one organic compound as described in the first aspect.

A third aspect of the present disclosure is to provide a display panel including the OLED device as described in the second aspect.

A fourth aspect of the present disclosure is to provide a display device including the display panel as described in the third aspect.

Compared with the related art, the present disclosure has beneficial effects described below.

For the organic compound provided by the present disclosure, with the design of the structural framework and the introduction of specific groups, the overlap degree between HOMO and LUMO is effectively reduced, and thus the energy level difference between the triplet state and the singlet state is reduced to below 300 meV, the reverse crossing of the energy from the triplet state to the singlet state is satisfied, and the organic compound obtains a relatively balanced radiative transition rate and good TADF characteristics. The organic compound has the advantages of excellent carrier transport performance, balance and stability of electron mobility and hole mobility, low preparation cost, and environmental friendliness. The organic compound is applied to the OLED device and is suitable to be used as a light-emitting layer material. Such a light-emitting layer material has a light-emitting mechanism of TADF and a high light-emitting quantum efficiency, which can improve the luminous efficiency of the device, reduce the drive voltage and energy consumption, and prolong the working life of the device.

BRIEF DESCRIPTION OF THE DRAWINGS

The FIGURE is a structural schematic diagram of an OLED device according to the present disclosure.

DETAILED DESCRIPTION

The technical solutions of the present disclosure are further described below through particular embodiments. Those skilled in the art should understand that the embodiments described herein are used for a better understanding of the present disclosure and should not be construed as specific limitations to the present disclosure.

A first aspect of the present disclosure is to provide an organic compound. The organic compound has a structure as shown in Formula I:

Formula I

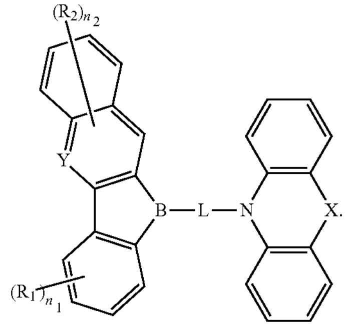

In Formula I, Y is N or CR.

In Formula I, X is selected from O, S, $NR_N$, $CR_{C1}R_{C2}$ or $SiR_{S1}R_{S2}$.

R, $R_N$, $R_{C1}$, $R_{C2}$, $R_{S1}$, and $R_{S2}$ are each independently selected from any one of hydrogen, deuterium, substituted or unsubstituted C1 to C30 linear or branched alkyl, substituted or unsubstituted C6 to C40 aryl, or substituted or unsubstituted C3 to C40 heteroaryl.

In Formula I, L is selected from any one of substituted or unsubstituted C6 to C40 arylene, or substituted or unsubstituted C3 to C40 heteroarylene.

In Formula I, $R_1$ and $R_2$ are each independently selected from any one of deuterium, halogen, cyano, substituted or unsubstituted C1 to C30 linear or branched alkyl, C1 to C30 alkoxy, substituted or unsubstituted C6 to C40 aryl, or substituted or unsubstituted C3 to C40 heteroaryl.

In Formula I, $n_1$ is an integer selected from 0 to 4 and for example, may be 0, 1, 2, 3 or 4; when $n_1$ is more than or equal to 2, multiple $R_1$ are identical to each other or different from each other.

In Formula I, $n_2$ is an integer selected from 0 to 5 and for example, may be 0, 1, 2, 3, 4 or 5; when $n_2$ is more than or equal to 2, multiple $R_2$ are identical to each other or different from each other.

In the present disclosure, C1 to C30 may each independently be C1, C2, C3, C4, C5, C6, C7, C8, C9, C10, C12, C14, C15, C16, C18, C20, C22, C24, C26, C28, etc.

C6 to C40 may each independently be C6, C8, C10, C12, C13, C14, C15, C16, C18, C20, C22, C24, C26, C28, C30, C32, C34, C36, C38, etc.

C3 to C40 may each independently be C3, C4, C5, C6, C8, C10, C12, C13, C14, C15, C16, C18, C20, C22, C24, C26, C28, C30, C32, C34, C36, C38, etc.

In the present disclosure, the halogen includes fluorine, chlorine, bromine or iodine. The same expression hereinafter has the same meaning.

The organic compound provided by the present disclosure has a structure as shown in Formula I, and the molecular structure is a structural framework of D-π-A, wherein, D represents an electron donor portion and is an N-embedded heterotriaromatic ring fused structure, A represents an electron acceptor portion and is a B-embedded heterofused ring structure, and π represents a bridging portion corresponds to L in Formula I and has a large steric hindrance. The overlap degree between HOMO and LUMO of the compound is reduced through the synergy of the specific structure framework and groups, and the energy level difference $\Delta E_{ST}$ between the $S_1$ state and the $T_1$ state can be as low as 300 meV or even as low as 0.5 meV to 200 meV. At the same time, the organic compound has a relatively balanced radiative transition rate and shows excellent carrier transport performance, excellent balance between electron mobility and hole mobility, and great stability. As a light-emitting layer (including a red light-emitting layer, a green light-emitting layer, etc.) material of the OLED device, the organic compound is especially suitable to be used as the host material of the light-emitting layer, and such a light-emitting material has a light-emitting mechanism of TADF and a high light-emitting quantum efficiency, which can effectively improve the luminous efficiency of the device, prolong the working life, reduce the drive voltage and energy consumption, and make the OLED device obtain more excellent comprehensive performance.

In an embodiment, the substituted substituents in R, $R_N$, $R_{C1}$, $R_{C2}$, $R_{S1}$, $R_{S2}$, L, $R_1$, and $R_2$ are each independently selected from at least one of deuterium, halogen, cyano, C1 to C10 (for example, C1, C2, C3, C4, C5, C6, C7, C8, C9, etc.) linear or branched alkyl, C3 to C20 (for example, C3, C4, C5, C6, C8, C10, C12, C14, C16, C18, etc.) cycloalkyl, C1 to C10 (for example, C1, C2, C3, C4, C5, C6, C7, C8, C9, etc.) alkoxy, C1 to C10 (for example, C1, C2, C3, C4, C5, C6, C7, C8, C9, etc.) alkylthio, C6 to C20 (for example, C6, C9, C10, C12, C14, C16, C18, etc.) aryl, C2 to C20 (for example, C2, C3, C4, C5, C6, C8, C10, C12, C14, C16, C18, etc.) heteroaryl, or C6 to C20 (for example, C6, C9, C10, C12, C14, C16, C18, etc.) arylamino.

In an embodiment, Y is N or CR, and R is selected from any one of hydrogen, deuterium, phenyl, pyridyl, biphenyl or naphthyl.

In an embodiment, $R_N$, $R_{C1}$, $R_{C2}$, $R_{S1}$, and $R_{S2}$ are each independently selected from any one of C1 to C6 linear or branched alkyl, substituted or unsubstituted C6 to C18 aryl, or substituted or unsubstituted C3 to C18 heteroaryl.

In the present disclosure, the C1 to C6 linear or branched alkyl may be C1, C2, C3, C4, C5 or C6 linear or branched alkyl and for example, includes, but is not limited to, methyl, ethyl, n-propyl, isopropyl, n-butyl, isobutyl, tert-butyl, n-amyl, isoamyl, neopentyl or n-hexyl.

The C6 to C18 aryl may be C6, C9, C10, C12, C13, C14, C15, C16 or C18 aryl, and for example, includes, but is not limited to, phenyl, biphenylyl, terphenyl, naphthyl, anthryl, phenanthryl, pyrenyl, fluorenyl, indenyl, perylenyl or triphenylene.

The C3 to C18 heteroaryl may be C3, C4, C5, C6, C8, C10, C12, C13, C14, C15, C16 or C18 heteroaryl in which the heteroatom may be N, O, S, Si, B or P, and for example, includes, but is not limited to, pyridyl, pyrrolyl, furanyl, thiophenyl, indolyl, carbazole, N-phenylcarbazolyl, N-pyridylcarbazolyl, azacarbazolyl, dibenzofuranyl, dibenzothienyl, phenothiazinyl, phenoxazinyl or hydroacridinyl. The substituted substituents are each independently selected from at least one of deuterium, C1 to C6 (for example, C1, C2, C3, C4, C5 or C6) linear or branched alkyl, C3 to C6 (for example, C3, C4, C5 or C6) cycloalkyl, C1 to C6 (for example, C1, C2, C3, C4, C5 or C6) alkoxy, C1 to C6 (for example, C1, C2, C3, C4, C5 or C6) alkylthio, or C6 to C18 (for example, C6, C9, C10, C12, C14, C16, C18, etc.) arylamino.

In an embodiment, $R_N$, $R_{C1}$, $R_{C2}$, $R_{S1}$, and $R_{S2}$ are each independently selected from any one of methyl, ethyl, phenyl, biphenyl, naphthyl, anthryl, phenanthryl, pyrenyl or pyridyl.

In an embodiment, L is selected from any one of the following groups or any one of the following groups substituted with a substituent:

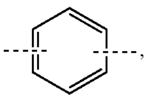,
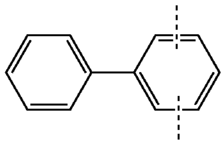,
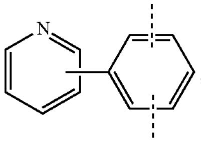,
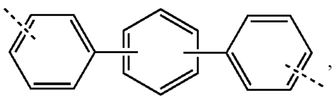,
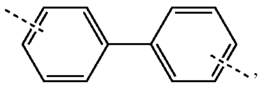
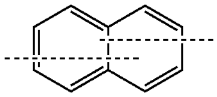,
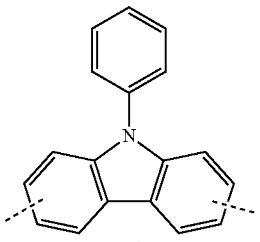,
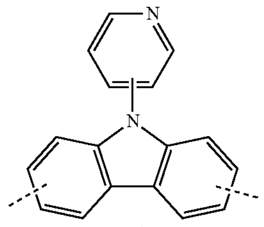,
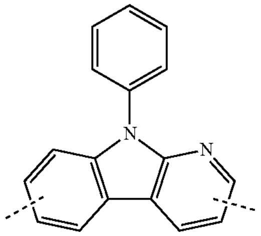,
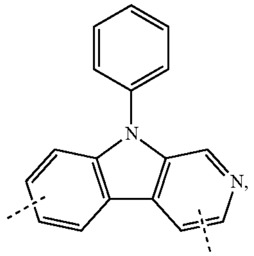

-continued

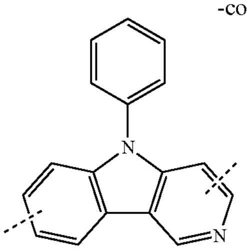 , 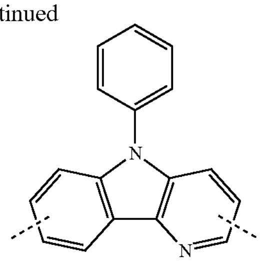 ,

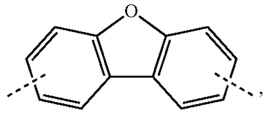 ,

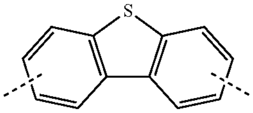 , 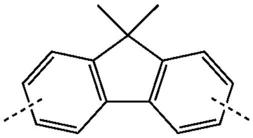 ,

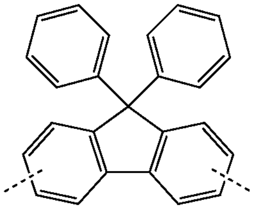 , and 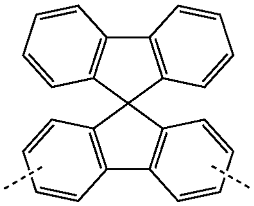 .

In the above groups, the dashed line represents a linkage site of a group.

The substituents are each independently selected from at least one of deuterium, C1 to C6 (for example, C1, C2, C3, C4, C5 or C6) linear or branched alkyl, C3 to C6 (for example, C3, C4, C5 or C6) cycloalkyl, C1 to C6 (for example, C1, C2, C3, C4, C5 or C6) alkoxy, C1 to C6 (for example, C1, C2, C3, C4, C5 or C6) alkylthio, C6 to C20 (for example, C6, C9, C10, C12, C14, C16, C18, etc.) aryl, C2 to C20 (for example, C2, C3, C4, C5, C6, C8, C10, C12, C14, C16, C18, etc.) heteroaryl, or C6 to C18 (for example, C6, C9, C10, C12, C14, C16, C18, etc.) arylamino.

In an embodiment, $R_1$ and $R_2$ are each independently selected from any one of deuterium, halogen, cyano, C1 to C10 (for example, C1, C2, C3, C4, C5, C6, C7, C8, C9, etc.) linear or branched alkyl, C1 to C10 (for example, C1, C2, C3, C4, C5, C6, C7, C8, C9, etc.) alkoxy, phenyl, biphenyl, naphthyl, pyridyl, phenylpyridyl or pyridylphenyl.

In an embodiment, $n_1$ is 0 or 1, and $n_2$ is an integer selected from 0 to 2 and for example, may be 0, 1 or 2.

In an embodiment, the organic compound has a structure as shown in Formula II:

Formula II

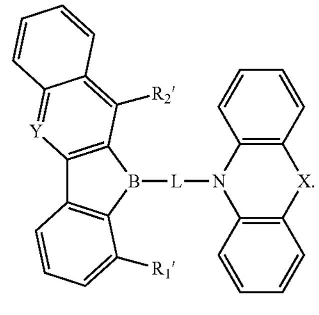

In Formula II, Y, X, and L have the same ranges as defined in Formula I.

In Formula II, $R_1'$ and $R_2'$ are each independently selected from any one of hydrogen, deuterium, halogen, cyano, substituted or unsubstituted C1 to C30 (for example, C1, C2, C3, C4, C5, C6, C7, C8, C9, C10, C12, C14, C15, C16, C18, C20, C22, C24, C26, C28, etc.) linear or branched alkyl, C1 to C30 (for example, C1, C2, C3, C4, C5, C6, C7, C8, C9, C10, C12, C14, C15, C16, C18, C20, C22, C24, C26, C28, etc.) alkoxy, substituted or unsubstituted C6 to C40 (for example, C6, C8, C10, C12, C13, C14, C15, C16, C18, C20, C22, C24, C26, C28, C30, C32, C34, C36, C38 etc.) aryl, or substituted or unsubstituted C3 to C40 (for example, C3, C4, C5, C6, C8, C10, C12, C13, C14, C15, C16, C18, C20, C22, C24, C26, C28, C30, C32, C34, C36, C38, etc.) heteroaryl.

In an embodiment, the substituted substituents in $R_1'$ and $R_2'$ are each independently selected from at least one of deuterium, halogen, C1 to C10 (for example, C1, C2, C3, C4, C5, C6, C7, C8, C9, etc.) linear or branched alkyl, C3 to C20 (for example, C3, C4, C5, C6, C8, C10, C12, C14, C16, C18, etc.) cycloalkyl, C1 to C10 (for example, C1, C2, C3, C4, C5, C6, C7, C8, C9, etc.) alkoxy, C1 to C10 (for example, C1, C2, C3, C4, C5, C6, C7, C8, C9, etc.) alkylthio, C6 to C20 (for example, C6, C9, C10, C12, C14, C16, C18, etc.) aryl, C2 to C20 (for example, C2, C3, C4, C5, C6, C8, C10, C12, C14, C16, C18, etc.) heteroaryl, or C6 to C20 (for example, C6, C9, C10, C12, C14, C16, C18, etc.) arylamino.

In an embodiment, $R_1'$ and $R_2'$ are each independently selected from any one of hydrogen, deuterium, halogen, cyano, C1 to C6 (for example, C1, C2, C3, C4, C5 or C6) linear or branched alkyl, phenyl, biphenyl, naphthyl or pyridyl.

In a particular embodiment, the organic compound is selected from any one of the following compounds P1 to P110:

P1

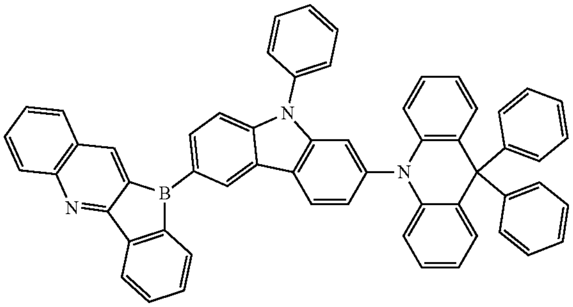

P2

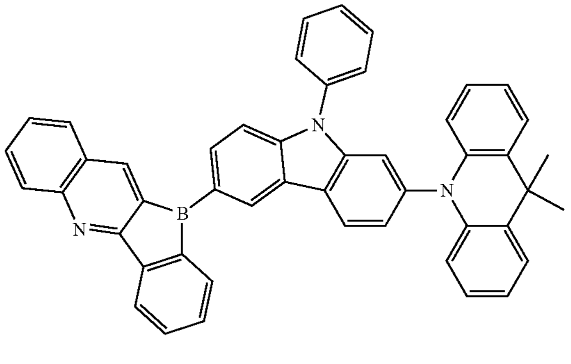

-continued
P3
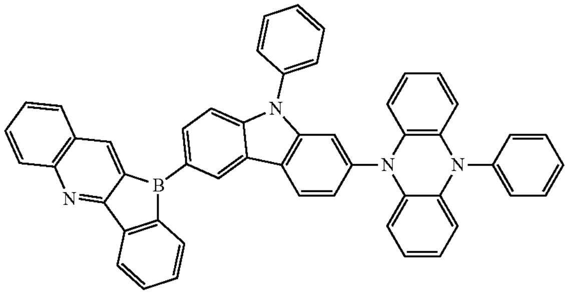
P4
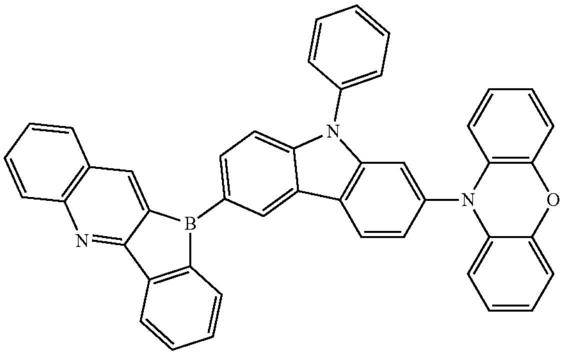
P5
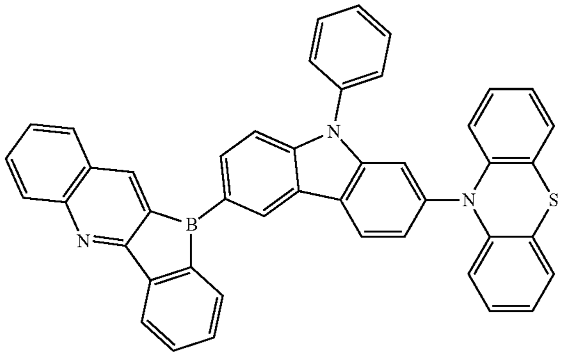
P6
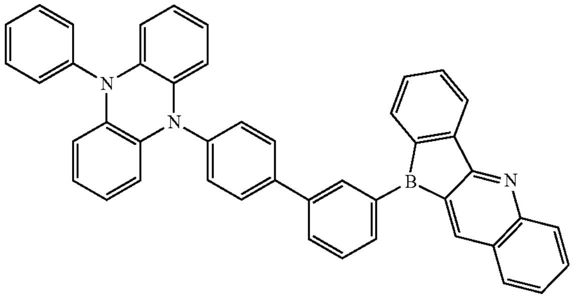
-continued
P7
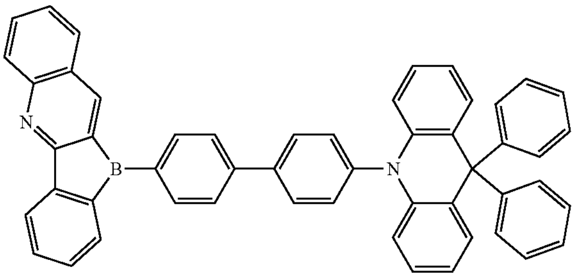
P8
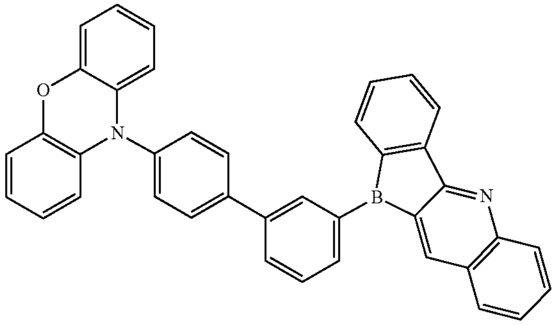
P9
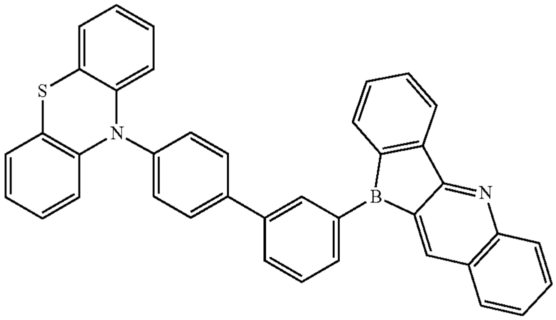
P10
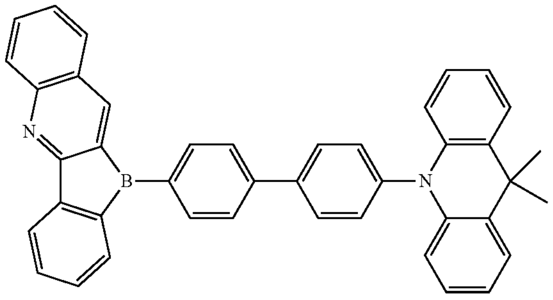
P11
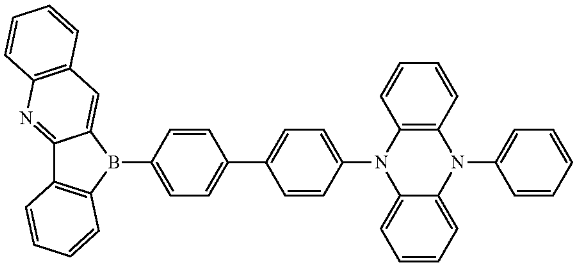

-continued
P12
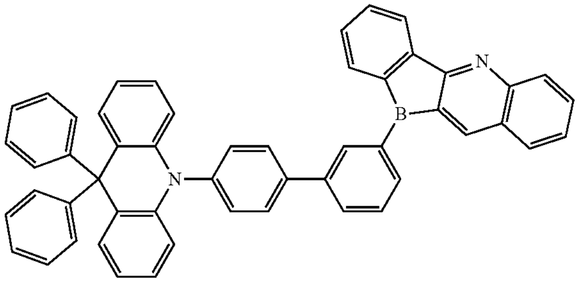
P13
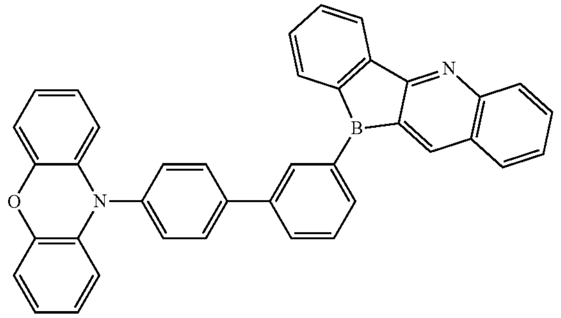
P14
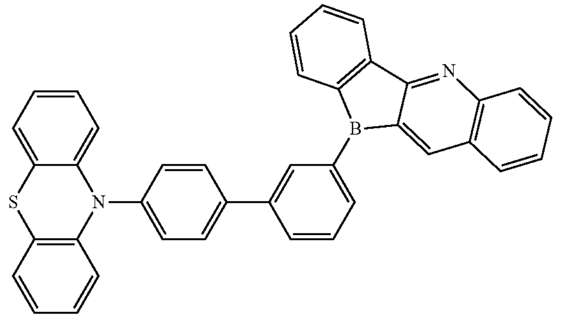
P15
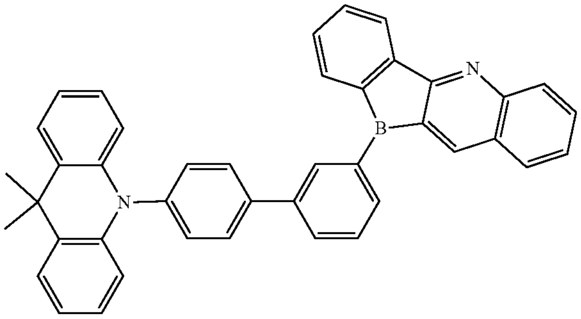
-continued
P16
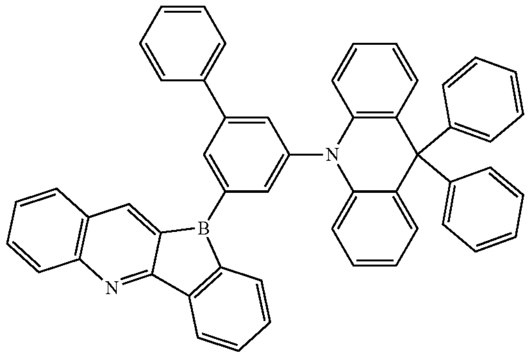
P17
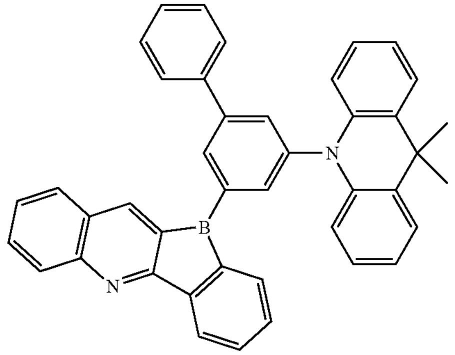
P18
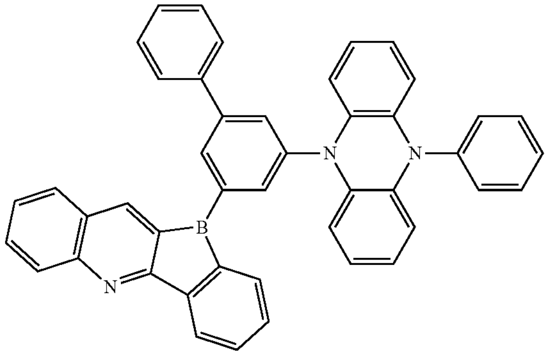
P19
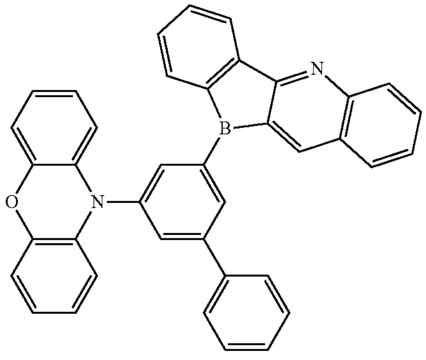

-continued
P20
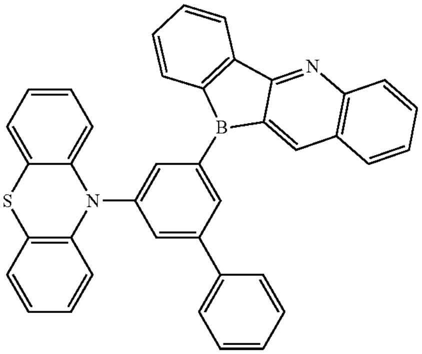
P21
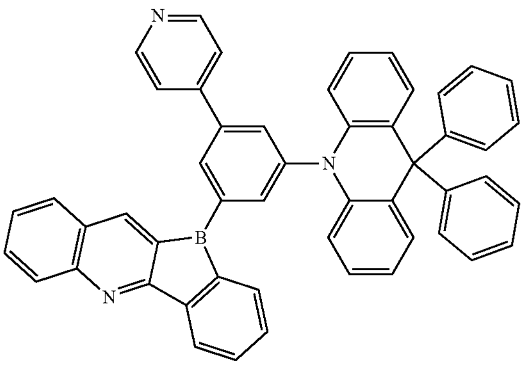
P22
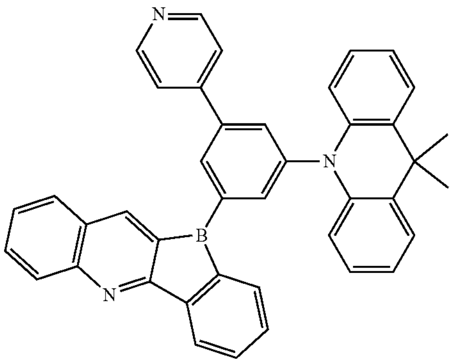
P23
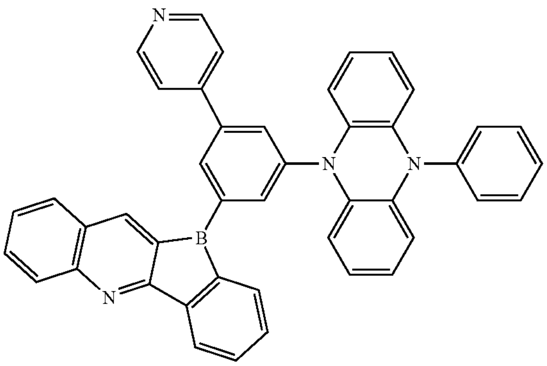
-continued
P24
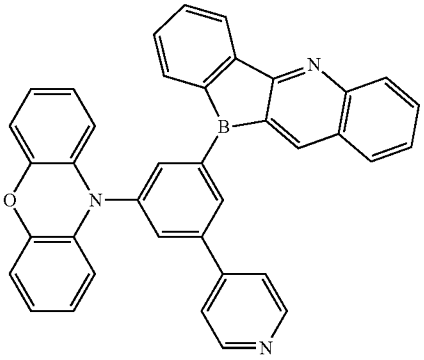
P25
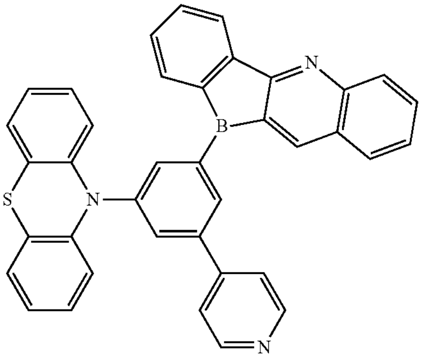
P26
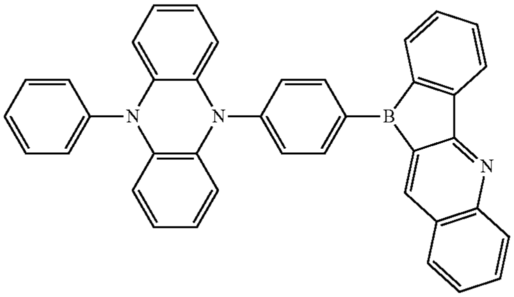
P27
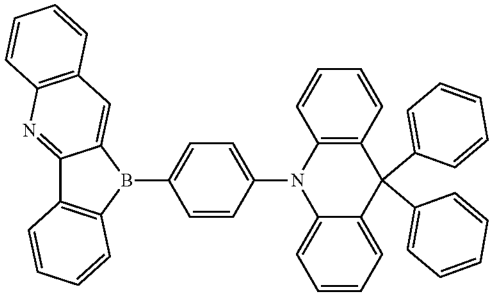
P28
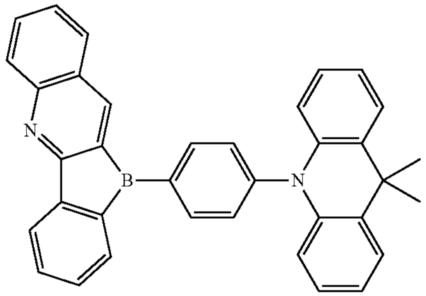

-continued
P29
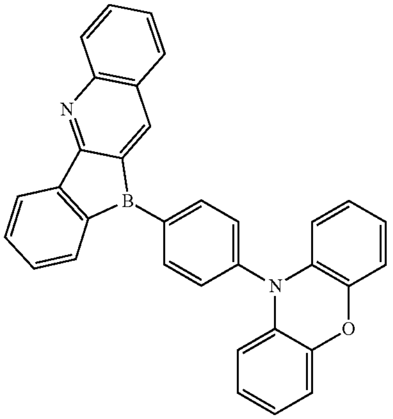
P30
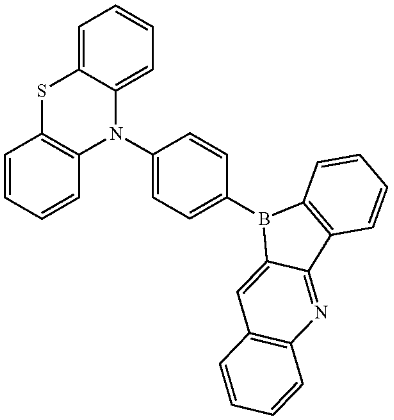
P31
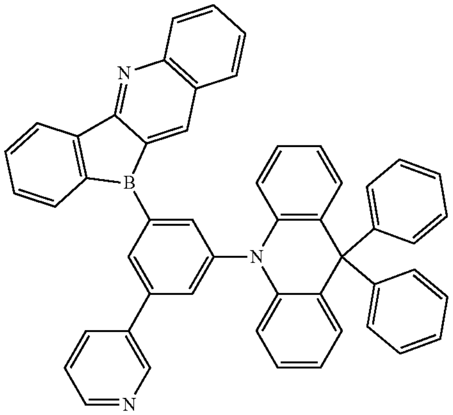
P32
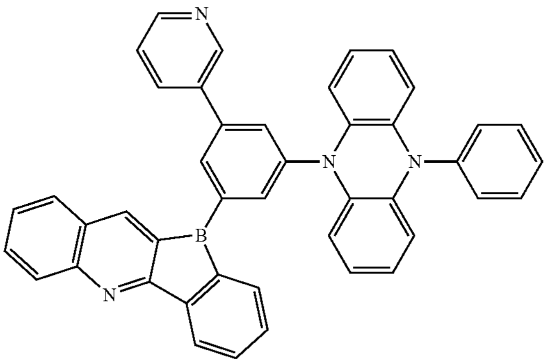
-continued
P33
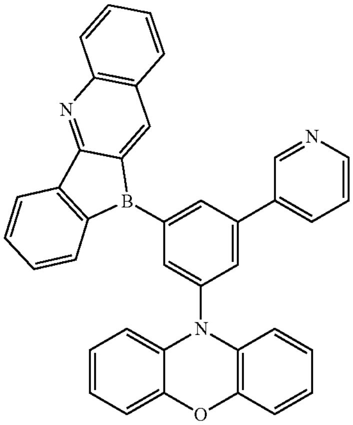
P34
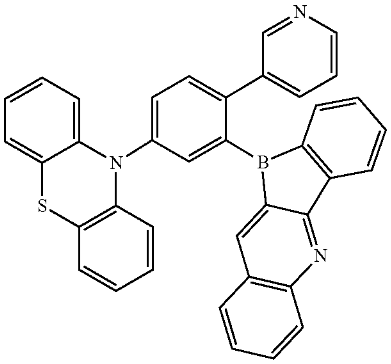
P35
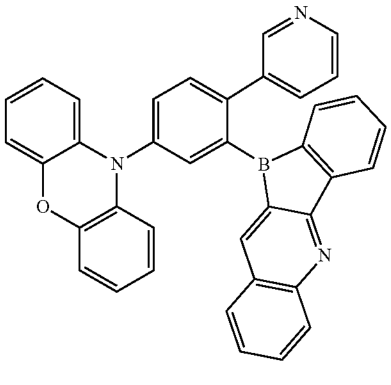
P36
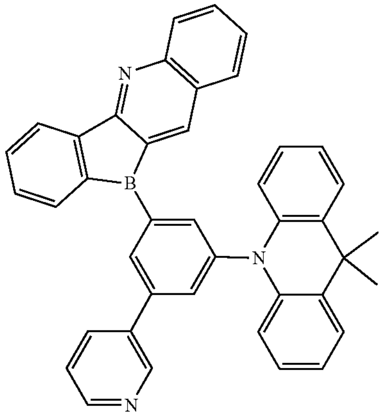

-continued
P37
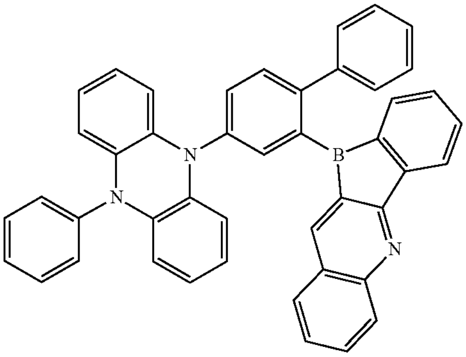
P38
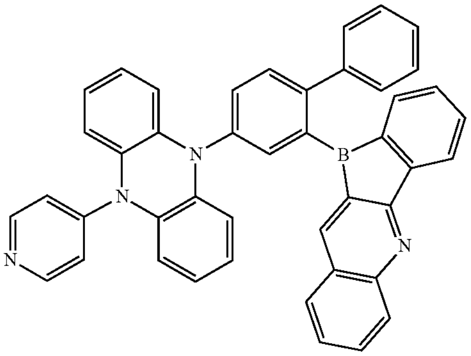
P39
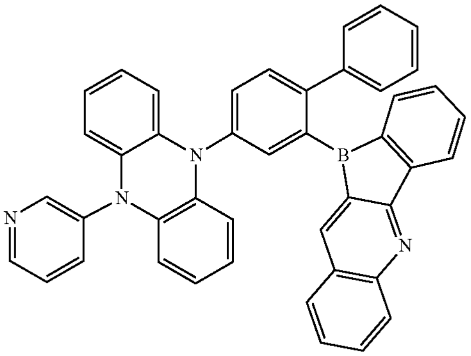
P40
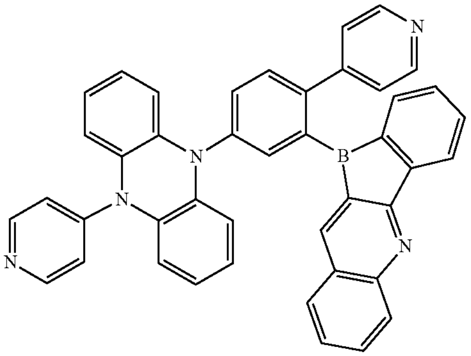
-continued
P41
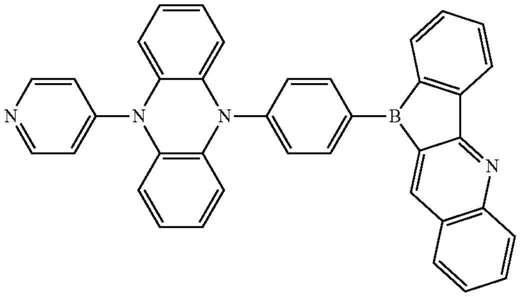
P42
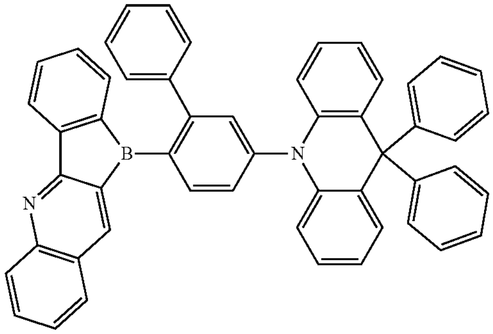
P43
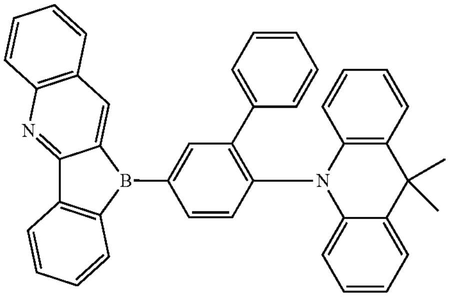
P44
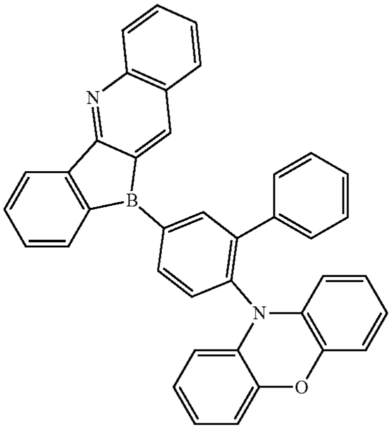

-continued
P45
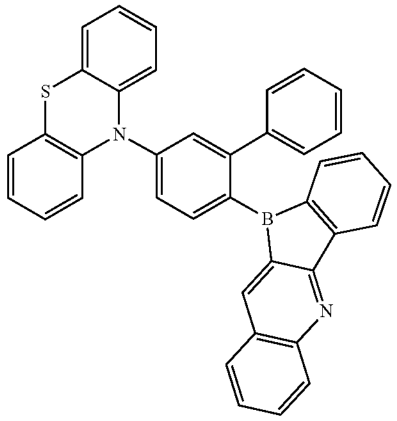
P46
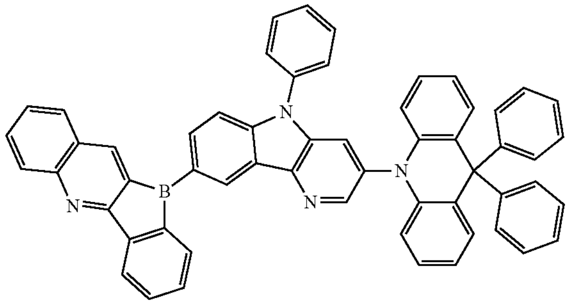
P47
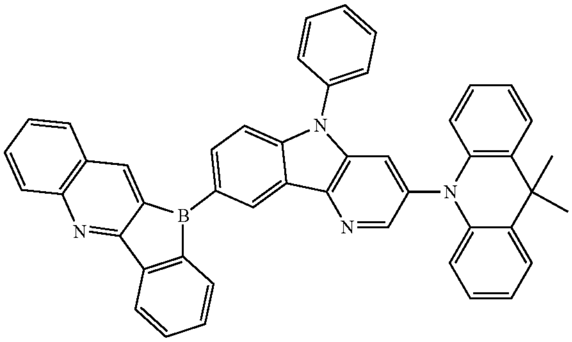
P48
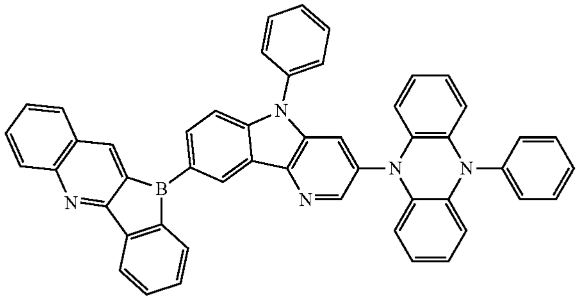
-continued
P49
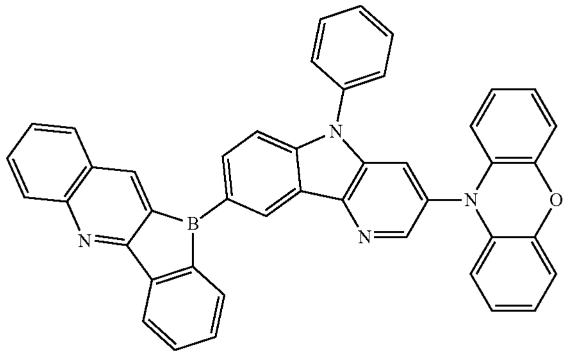
P50
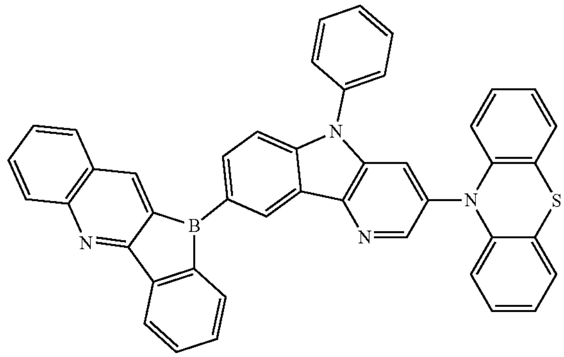
P51
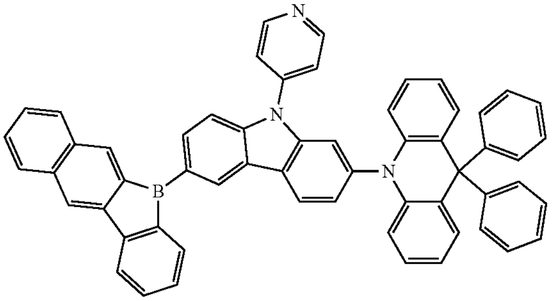
P52
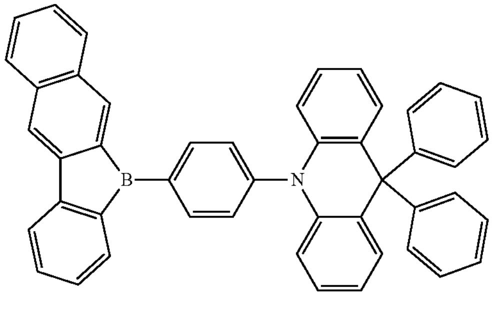

-continued
P53
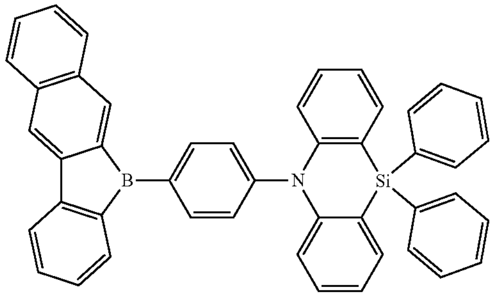
P54
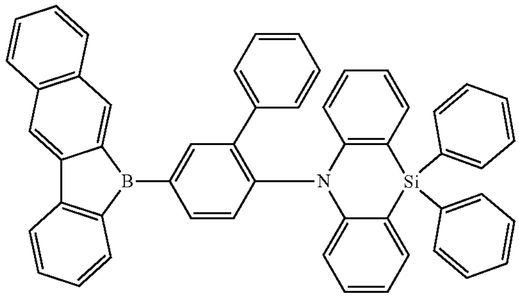
P55
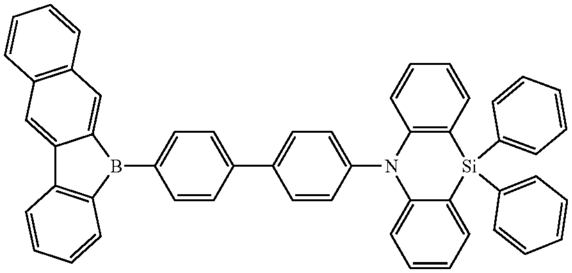
P56
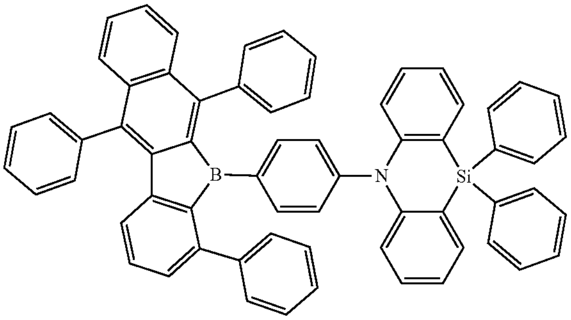
P57
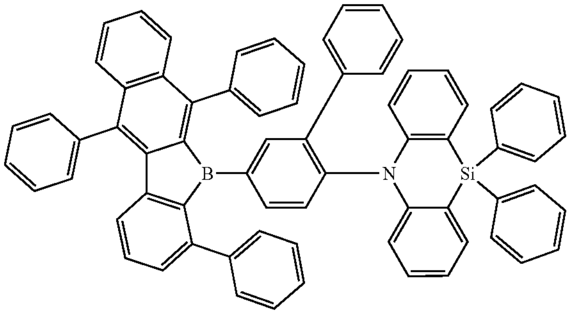
-continued
P58
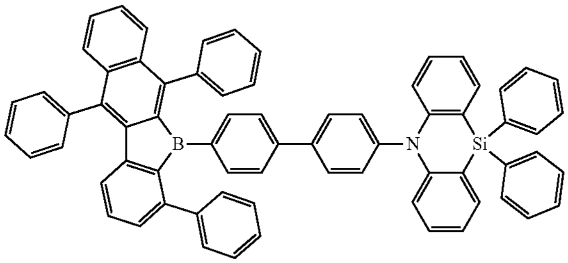
P59
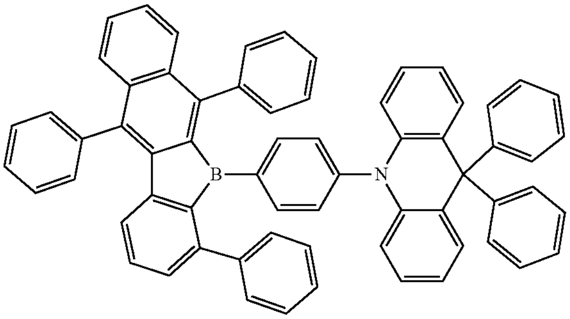
P60
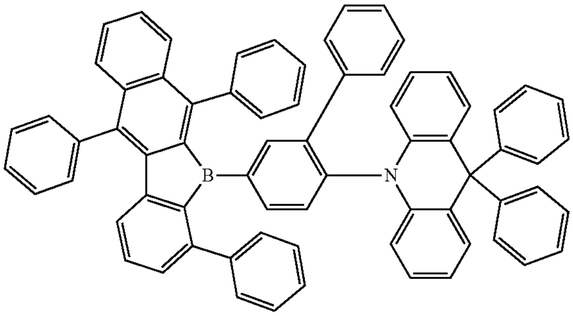
P61
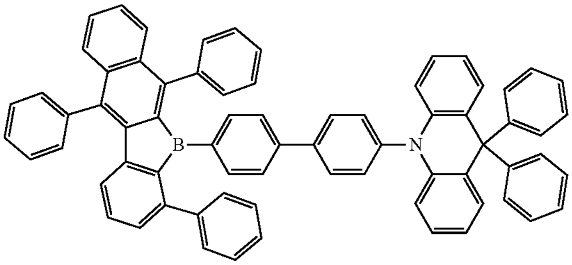
P62
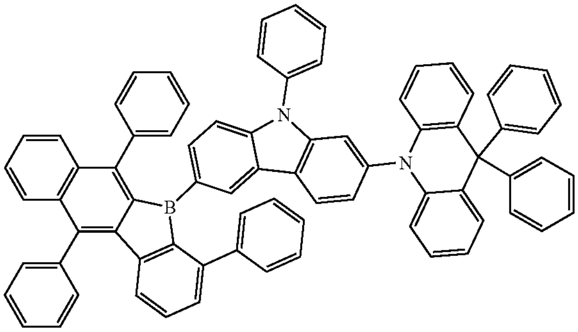

-continued
P63
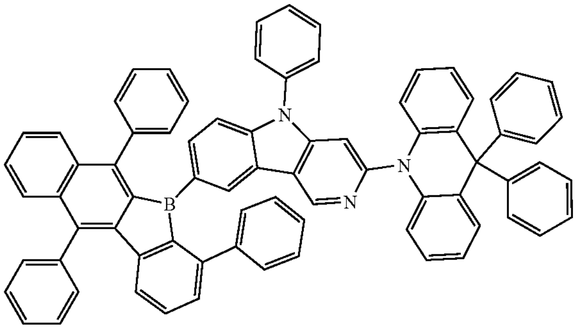
P64
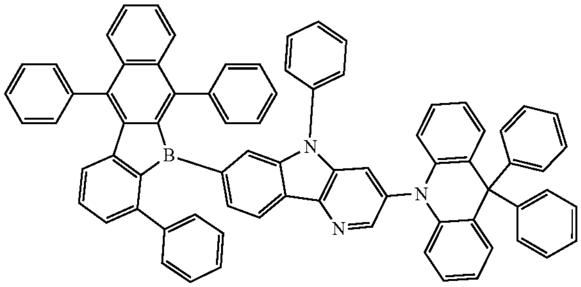
P65
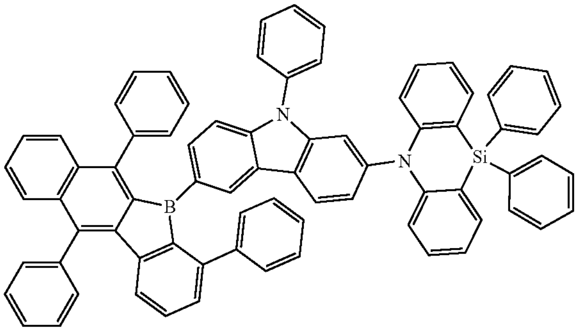
P66
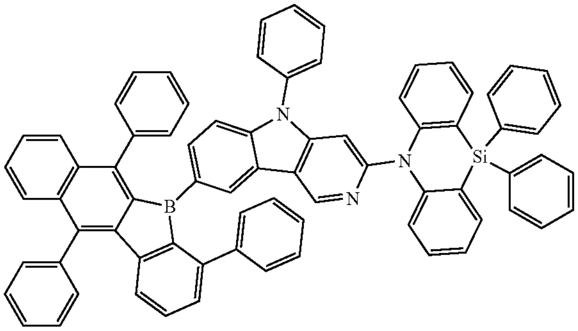
-continued
P67
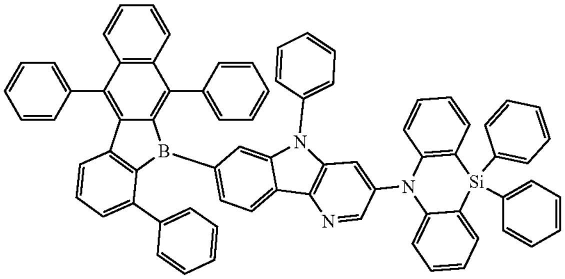
P68
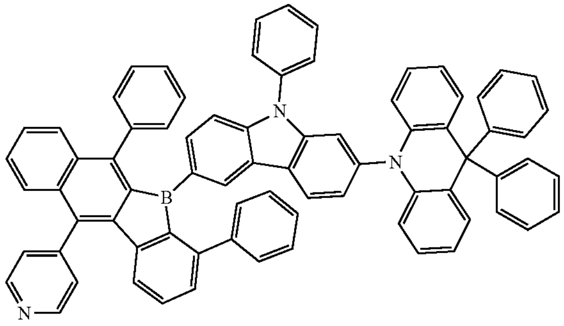
P69
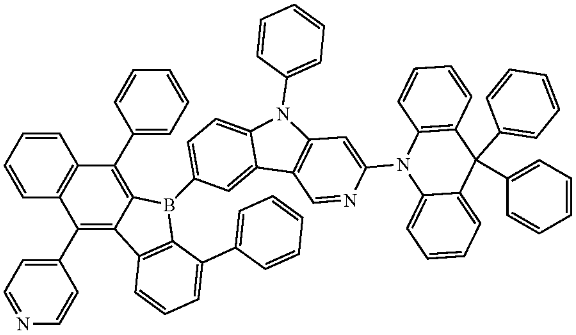
P70
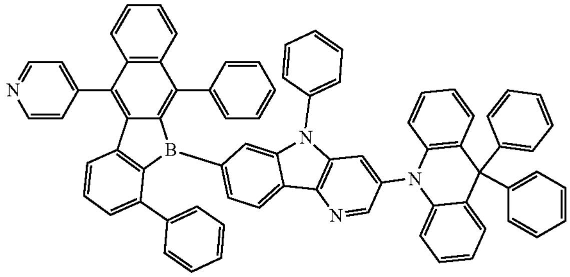

-continued
P71
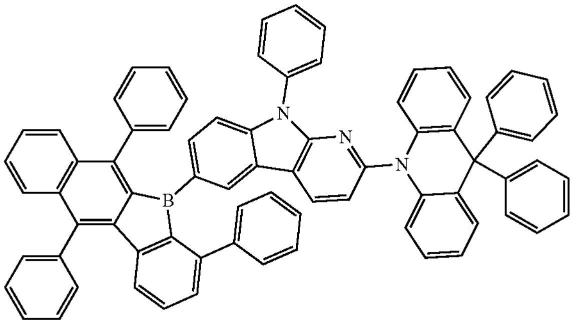
P72
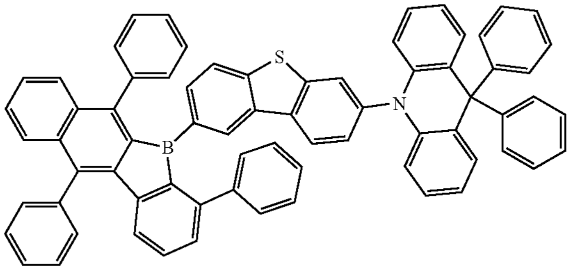
P73
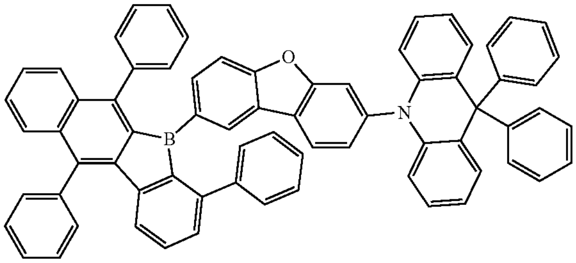
P74
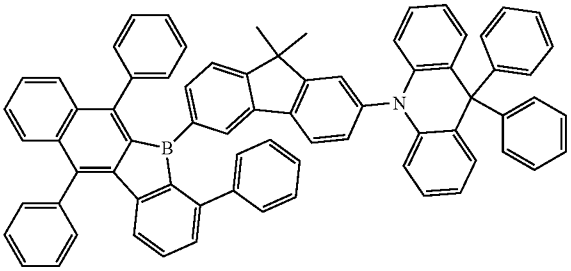
P75
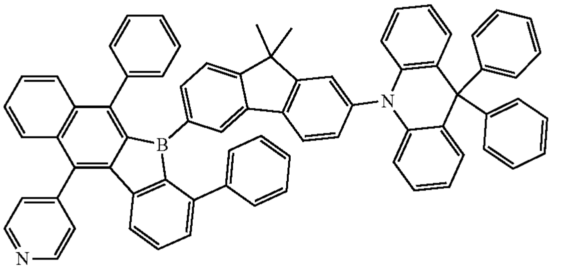
-continued
P76
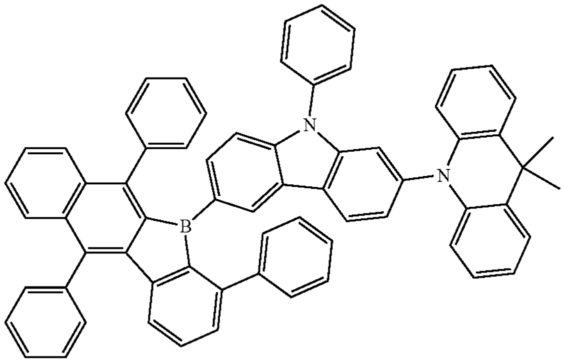
P77
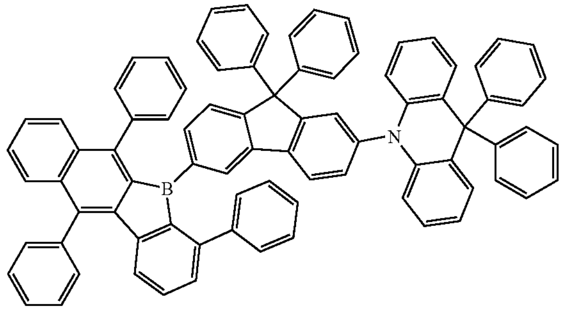
P78
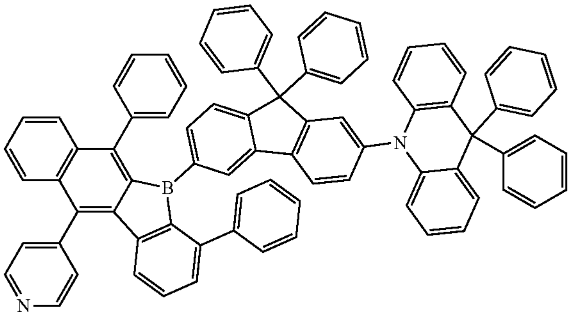
P79
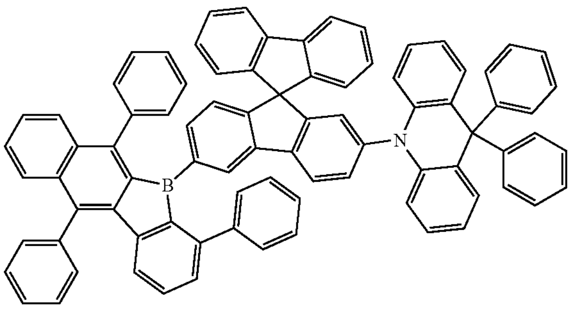

-continued
P80
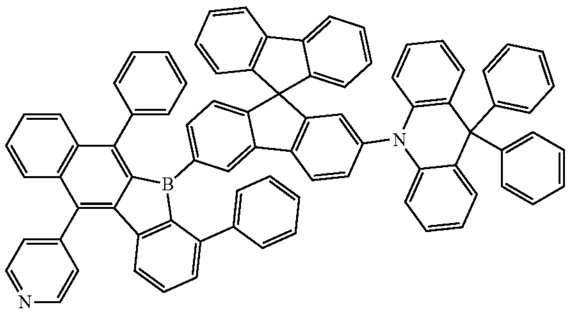
P81
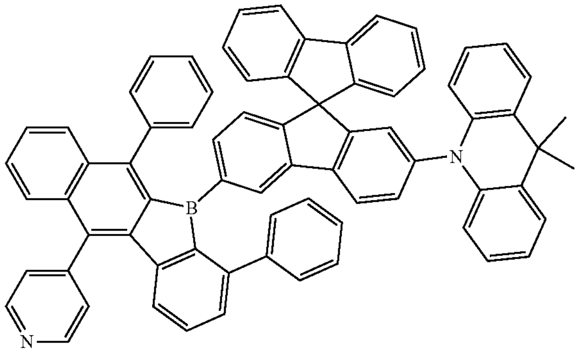
P82
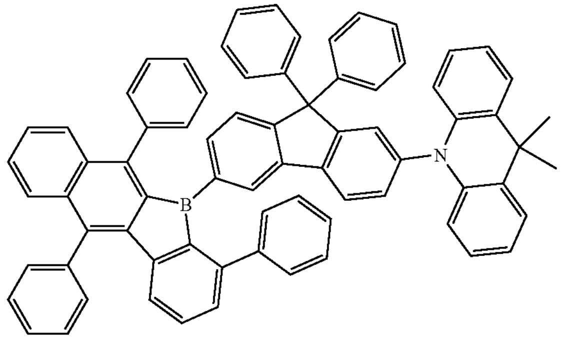
P83
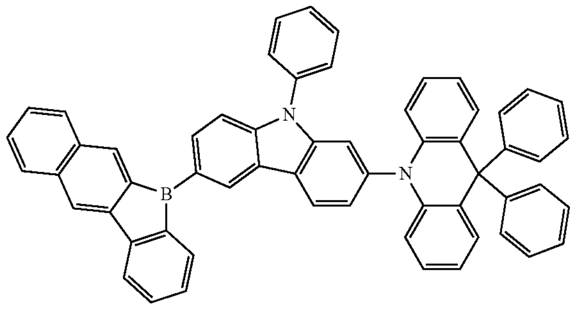
-continued
P84
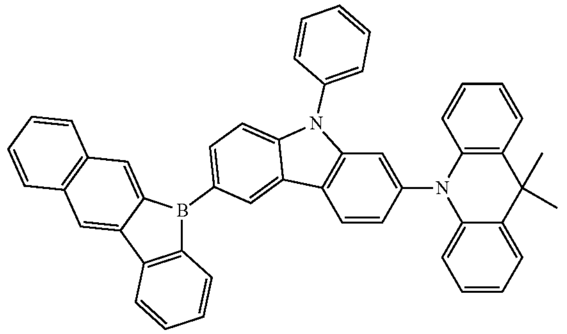
P85
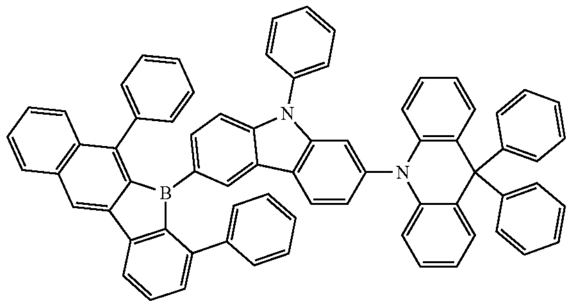
P86
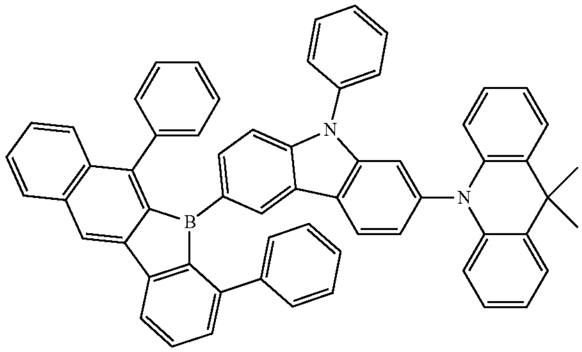
P87
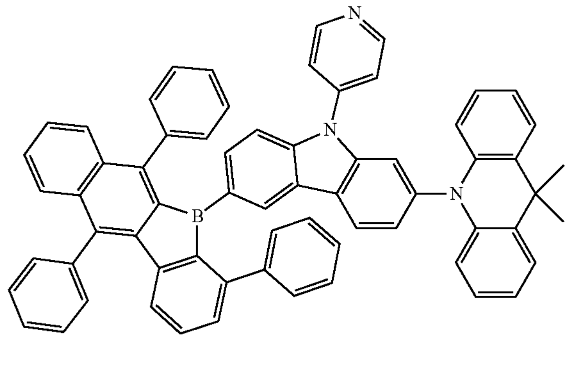

-continued
P88
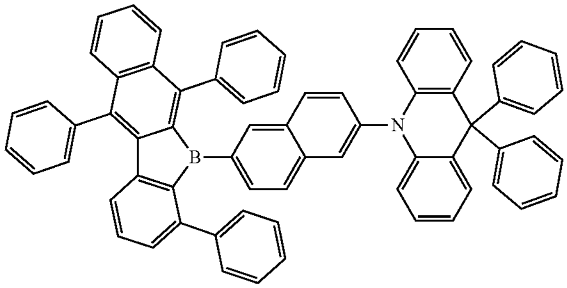
P89
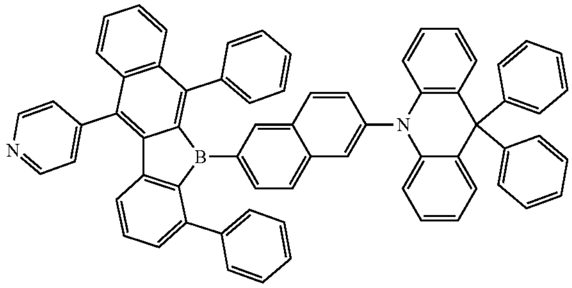
P90
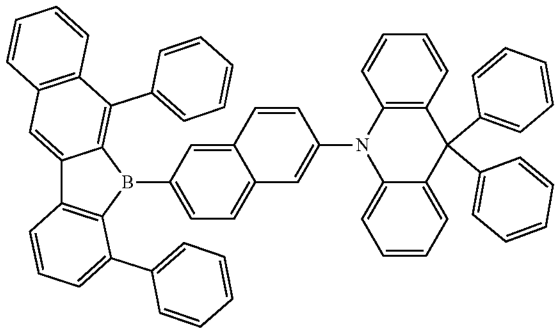
P91
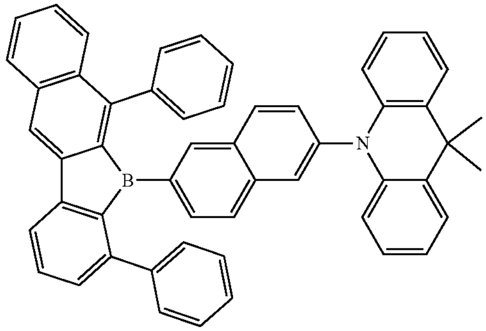
-continued
P92
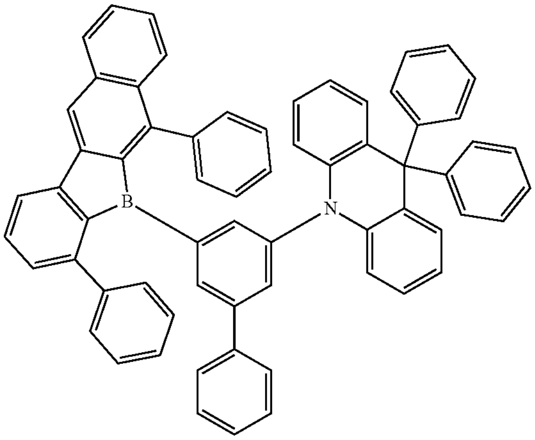
P93
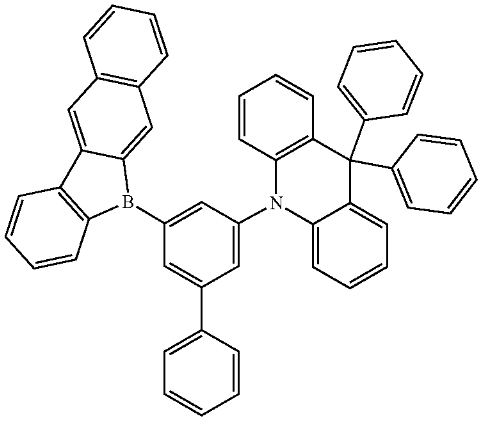
P94
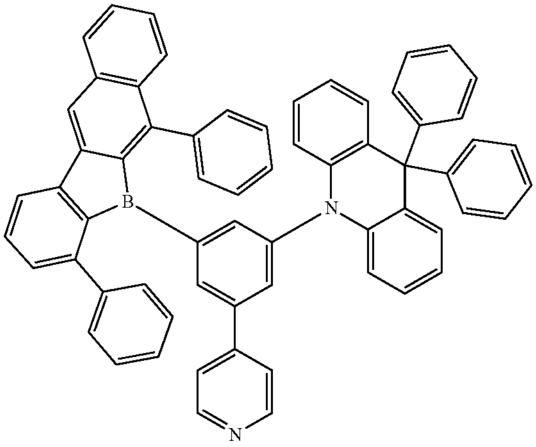

-continued
P95
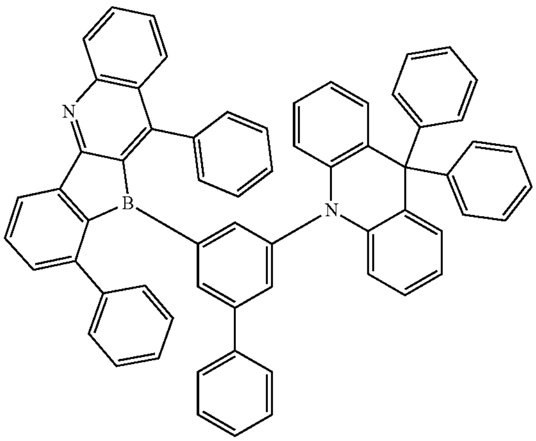
P96
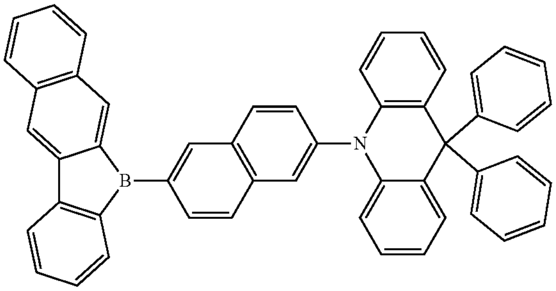
P97
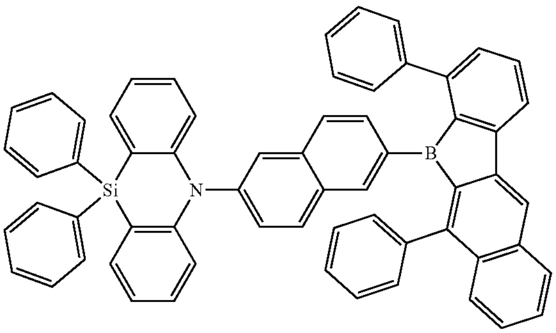
P98
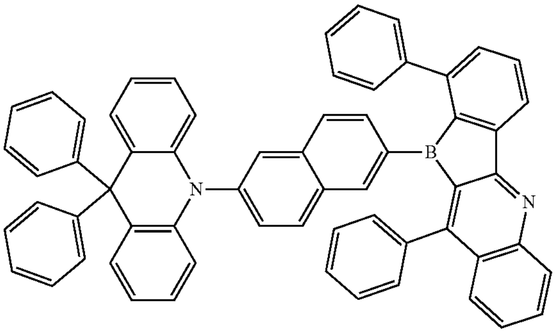
-continued
P99
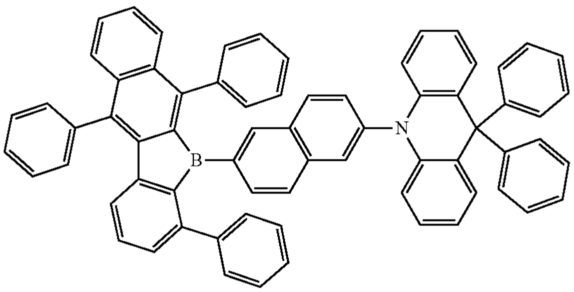
P100
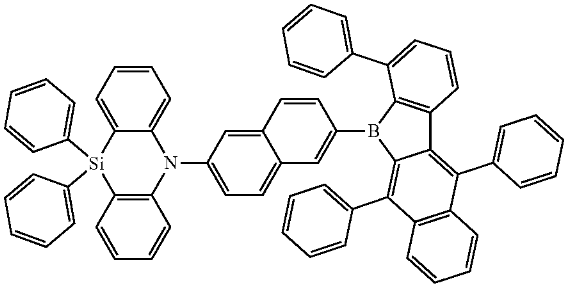
P101
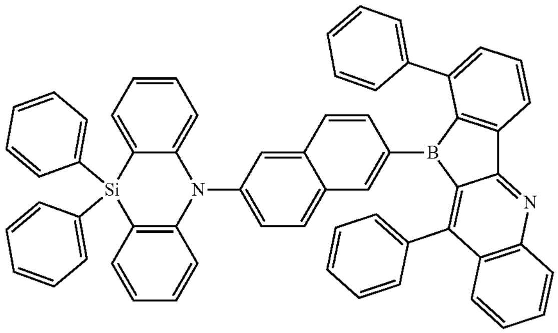
P102
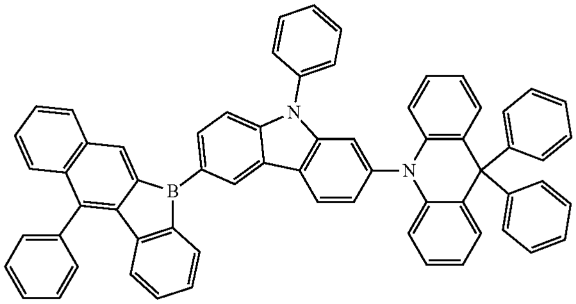
P103
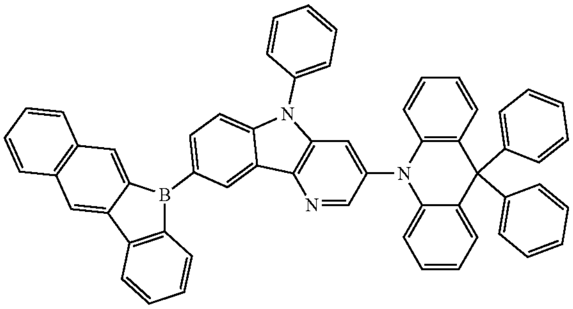

-continued

P104

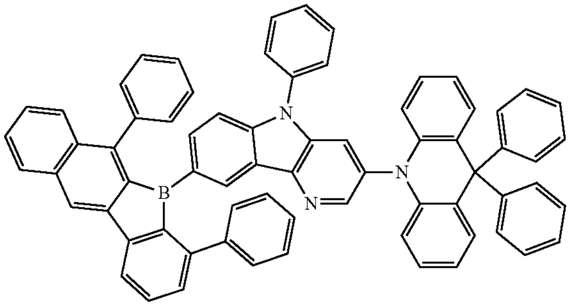

P105

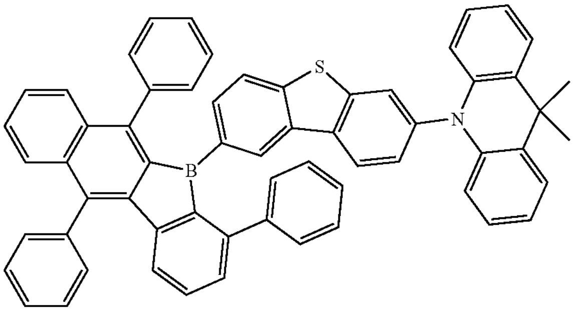

P106

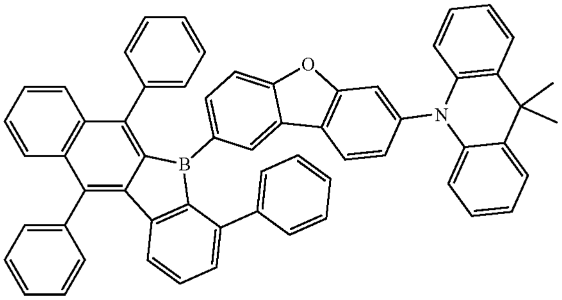

P107

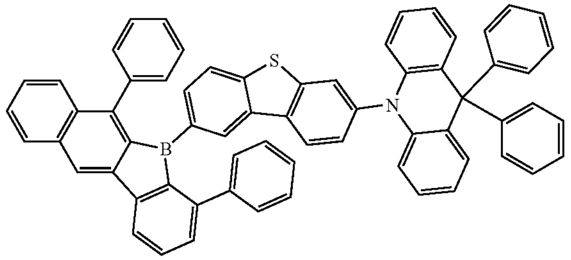

P108

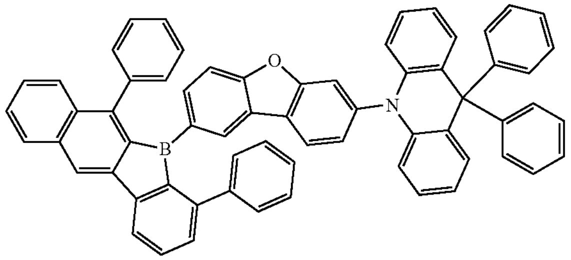

-continued

P109

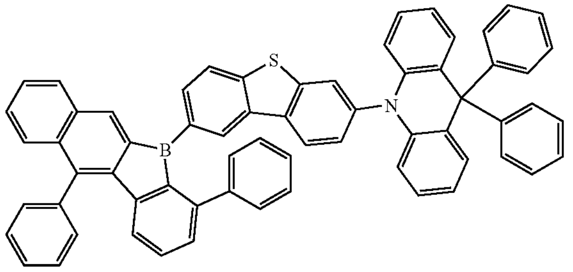

P110

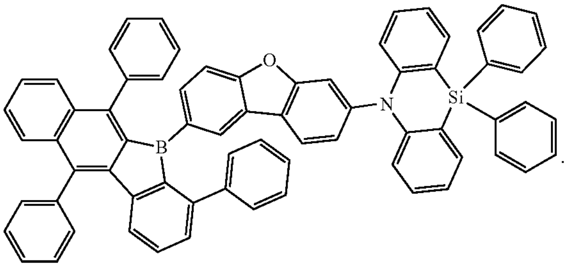

A second aspect of the present disclosure is to provide an OLED device. The OLED device includes an anode, a cathode, and an organic thin film layer disposed between the anode and the cathode, and the organic thin film layer includes at least one organic compound as described in the first aspect.

In an embodiment, the organic thin film layer includes a light-emitting layer, and the light-emitting layer includes at least one organic compound as described in the first aspect.

In an embodiment, the organic compound is a thermally activated delayed fluorescent (TADF) material, and the organic compound is a host material of the light-emitting layer.

In an embodiment, the organic thin film layer further includes any one or a combination of at least two of a hole transport layer, a hole injection layer, an electron blocking layer, a hole blocking layer, an electron transport layer or an electron injection layer.

In the OLED device of the present disclosure, the material of the anode may be a metal, a metal oxide or a conductive polymer, where the metal includes copper, gold, silver, iron, chromium, nickel, manganese, palladium, platinum, etc., as well as alloys thereof, the metal oxide includes indium tin oxide (ITO), indium zinc oxide (IZO), zinc oxide, indium oxide, indium gallium zinc oxide (IGZO), etc., and the conductive polymer includes polyaniline, polypyrrole, poly (3-methylthiophene), etc. In addition to the above materials that facilitate the hole injection and combinations thereof, the known material suitable to prepare the anode is also included.

In the OLED device, the material of the cathode may be a metal or a multilayer metal material, where the metal includes aluminum, magnesium, silver, indium, tin, titanium, etc., as well as alloys thereof, and the multilayer metal material includes LiF/Al, $LiO_2$/Al, $BaF_2$/Al, etc. In addition to the above materials that facilitate the electron injection and combinations thereof, the known material suitable to prepare the cathode is also included.

In the OLED device, the organic thin film layer includes at least one light-emitting layer (EML) and any one or a combination of at least two of a hole injection layer (HIL), a hole transport layer (HTL), an electron blocking layer (EBL), a hole blocking layer (HBL), an electron transport layer (ETL) or an electron injection layer (EIL) which is(are) disposed on two sides of the light-emitting layer, where the hole/electron injection and transport layers may be carbazole compounds, arylamino compounds, benzimidazole compounds, metal compounds, etc. The OLED device may further be optionally provided with a capping layer (CPL) disposed on the cathode (a side of the cathode away from the light-emitting layer).

With reference to the FIGURE, 110 may represent an anode, 120 may represent a first organic thin film layer, 130 may represent a light-emitting layer, 140 may represent a second organic thin film layer, and 150 may represent a cathode.

As shown in the FIGURE which is a schematic view of the OLED device, the OLED device includes an anode 110, a cathode 150, and a light-emitting layer 130 disposed between the anode 110 and the cathode 150. A first organic thin film layer 120 and a second organic thin film layer 140 are disposed on two sides of the light-emitting layer 130. The first organic thin film layer 120 is any one or a combination of at least two of a hole transport layer (HTL), a hole injection layer (HIL) or an electron blocking layer (EBL), and the second organic thin film layer 140 includes any one or a combination of at least two of a hole blocking layer (HBL), an electron transport layer (ETL) or an electron injection layer (EIL).

The OLED device may be prepared by the following method: forming an anode on a transparent or opaque smooth substrate, forming an organic thin layer on the anode, and forming a cathode on the organic thin layer. The organic thin layer may be formed by using known film-forming methods such as evaporation, sputtering, spin coating, dipping, and ion plating.

A third aspect of the present disclosure is to provide a display panel including the OLED device as described in the second aspect.

A fourth aspect of the present disclosure is to provide a display device including the display panel as described in the third aspect.

For example, the organic compound having the structure as shown in Formula I provided in the present disclosure may be prepared according to the following synthesis route:

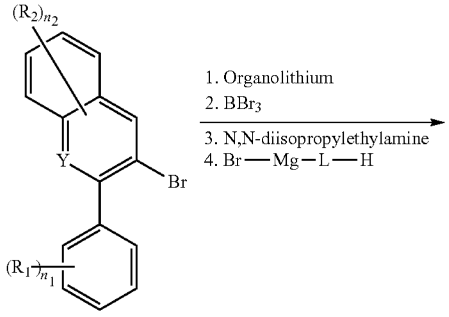

-continued

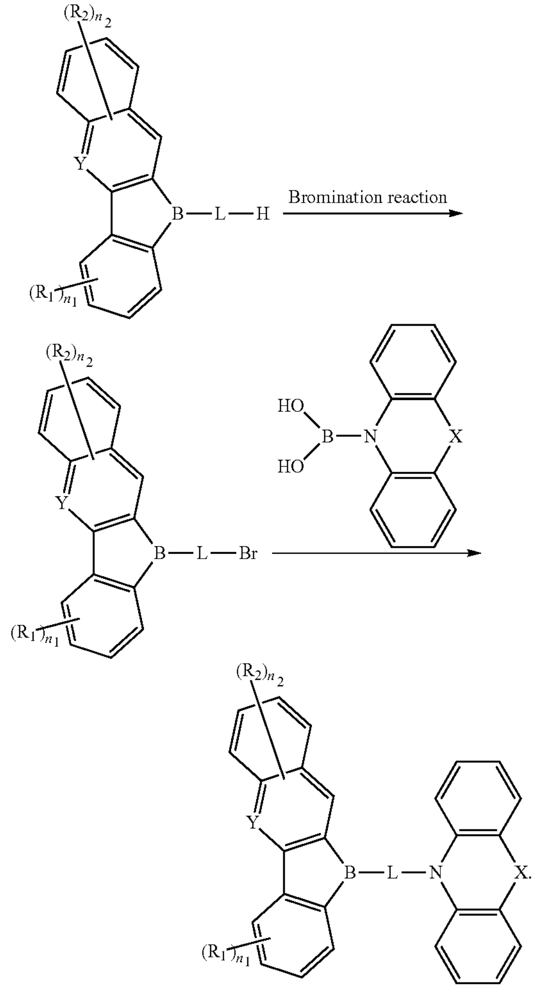

In the above synthesis route, Y, X, L, $R_1$, $R_2$, $n_1$, and $n_2$ have the same ranges as defined in Formula I.

Preparation examples of the organic compound of the present disclosure are described below for purposes of example.

Example 1

An organic compound P1 is provided, and the structure formula of the organic compound P1 is as follows:

P1

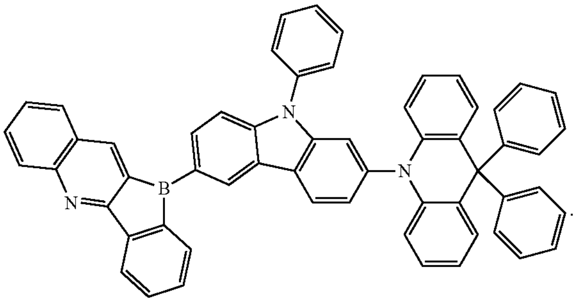

The preparation method of the organic compound P1 includes the steps described below.

(1)

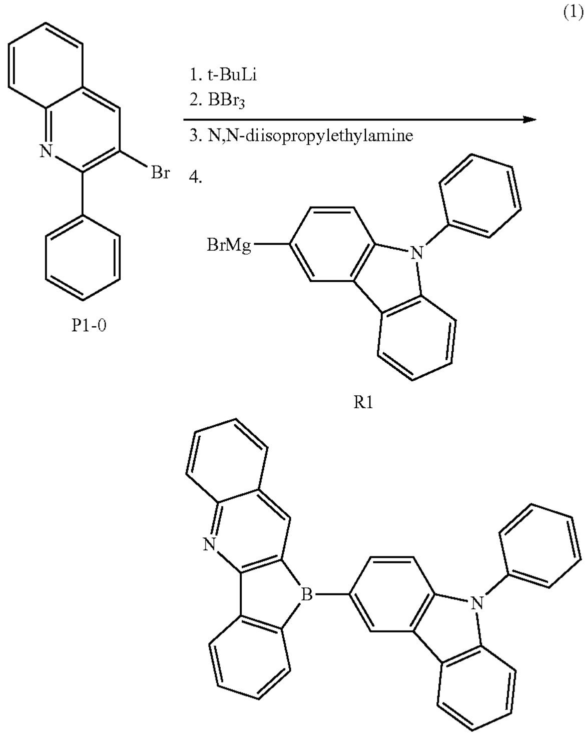

P1-0

R1

P1-1

The pentane solution of tert-Butyllithium (t-BuLi, 18.59 mL, 1.50 M, 27.89 mmol) was slowly added into the tert-Butylbenzene (70 mL) solution of P1-0 (4.98 mmol) at 0° C., and then the mixture was heated to 60° C. and reacted for 4 hours. After the reaction was completed, the mixture was cooled to −30° C., boron tribromide (19.86 mmol) was slowly added and then stirred at room temperature for 1 hour; N,N-diisopropylethylamine (19.86 mmol) was added at room temperature, and the reaction continued at 145° C. for 12 hours and then cooled to room temperature. In this state, R1 (19.86 mmol) was added, and the reaction continued for 2 hours and then stopped. The mixture was dried to remove solvent through rotary in vacuum and processed on a silica gel column to obtain the product P1-1.

(2)

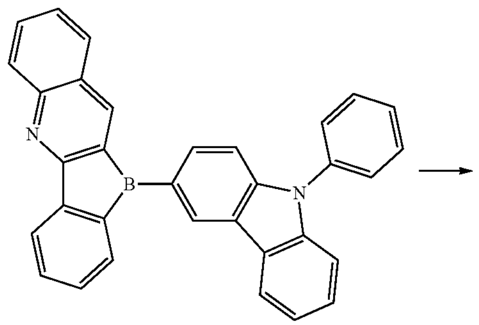

P1-1

-continued

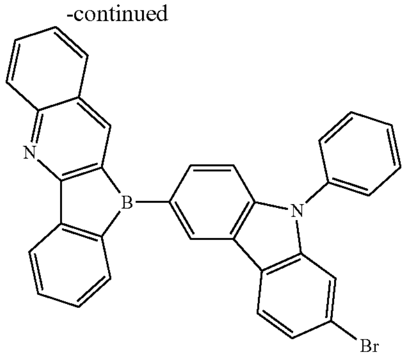

P1-2

The compound P1-1 (4 mmol) obtained in Step (1) and bis(triphenylphosphine)palladium dichloride ($Pd(PPh_3)_2Cl_2$, 0.15 mmol) were added into a three-mouth flask and dissolved by stirring with 300 mL of N,N-dimethylformamide (DMF), and under the protection of nitrogen, liquid bromine (2 mmol) was slowly dripped at room temperature. The reaction solution was stirred at room temperature for 2 hours and filtered by suction, and the filter cake was recrystallized with ethanol to obtain intermediate P1-2 as a solid.

(3)

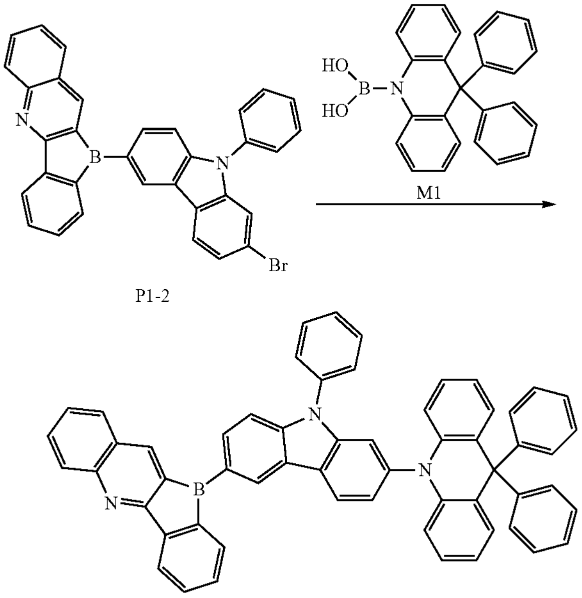

P1-2

M1

P1

In a 250 mL round-bottom flask, P1-2 (10 mmol) obtained in Step (2), Compound M1 (12 mmol), and $Na_2CO_3$ (80 mmol) were added successively into the solvent toluene/absolute ethanol (EtOH)/$H_2O$ (75/25/50 mL) to form a mixed solution. Then tetrakis(triphenylphosphine)palladium ($Pd(PPh_3)_4$, 0.48 mmol) was added to the above mixed solution. The mixed solution was subjected to the reflux and reacted for 20 hours in a nitrogen atmosphere to obtain an intermediate. The obtained intermediate was cooled to room temperature, added to water, filtered with a diatomite mat, extracted with dichloromethane, washed with water, dried with anhydrous magnesium sulfate, filtered and evaporated.

Then a crude product was purified by silica gel column chromatography to obtain the final product P1.

Elemental analysis results of the organic compound P1 are as follows: molecular formula $C_{58}H_{38}BN_3$, where the theoretical values were: C, 88.43, H, 4.86, B, 1.37, and N, 5.33, and the test values were: C, 88.43, H, 4.87, B, 1.37, and N, 5.33.

The relative molecular mass of the organic compound P1 was obtained by liquid chromatography-mass spectrometry, where the theoretical value was 787.32, and the test value was 787.34.

Example 2

An organic compound P4 is provided, and the structure formula of the organic compound P4 is as follows:

P4

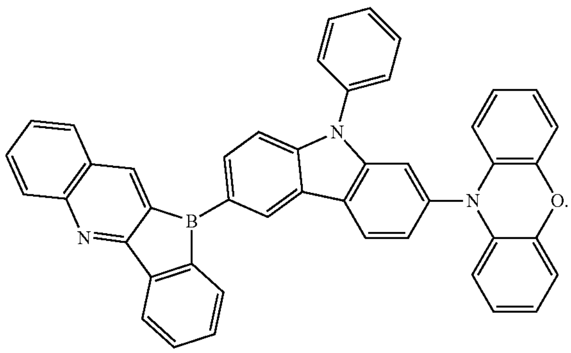

The preparation method of the organic compound P4 includes the steps described below.

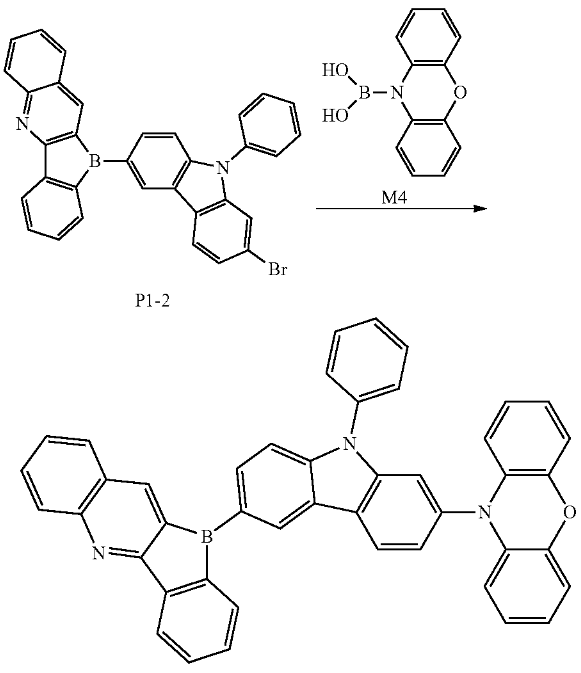

P1-2

P4

In a 250 mL round-bottom flask, P1-2 (10 mmol, which was prepared using the same method as in Example 1), Compound M4 (12 mmol), and $Na_2CO_3$ (80 mmol) were added successively into the solvent toluene/EtOH/$H_2O$ (75/25/50 mL) to form a mixed solution. Then $Pd(PPh_3)_4$ (0.48 mmol) was added to the above mixed solution. The mixed solution was subjected to the reflux and reacted for 20 hours in a nitrogen atmosphere to obtain an intermediate. The obtained intermediate was cooled to room temperature, added to water, filtered with a diatomite mat, extracted with dichloromethane, washed with water, dried with anhydrous magnesium sulfate, filtered and evaporated. Then a crude product was purified by silica gel column chromatography to obtain the final product P4.

Elemental analysis results of the organic compound P4 are as follows: molecular formula $C_{45}H_{28}BN_3O$, where theoretical values were: C, 84.78, H, 4.43, B, 1.70, N, 6.59, and O, 2.51, and the test values were: C, 84.78, H, 4.43, B, 1.70, N, 6.59, and O, 2.51.

The relative molecular mass of the organic compound P4 was obtained by liquid chromatography-mass spectrometry, where the theoretical value was 637.23, and the test value was 637.25.

Example 3

An organic compound P27 is provided, and the structure formula of the organic compound P27 is as follows:

P27

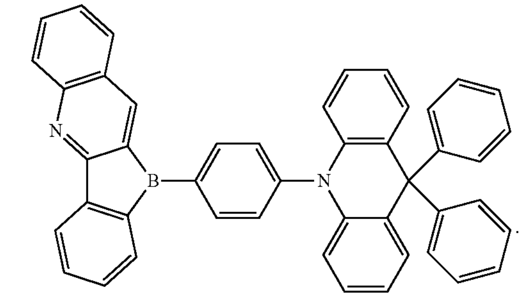

The preparation method of the organic compound P27 includes the steps described below.

(1)

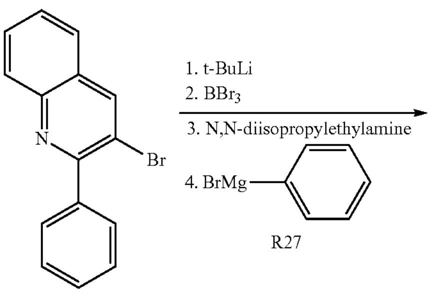

P1-0

R27

-continued

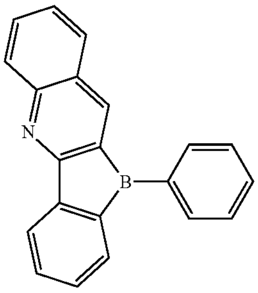

P27-1

The pentane solution of t-BuLi (18.59 mL, 1.50 M, 27.89 mmol) was slowly added into the tert-Butylbenzene (70 mL) solution of P1-0 (4.98 mmol) at 0° C., and then the mixture was heated to 60° C. and reacted for 4 hours. After the reaction was completed, the mixture was cooled to −30° C., boron tribromide (19.86 mmol) was slowly added and then stirred at room temperature for 1 hour; N,N-diisopropylethylamine (19.86 mmol) was added at room temperature, and the reaction continued at 145° C. for 12 hours and then cooled to room temperature. In this state, R27 (19.86 mmol) was added, and the reaction continued for 2 hours and then stopped. The mixture was dried to remove solvent through rotary in vacuum and processed on a silica gel column to obtain the product P27-1.

(2)

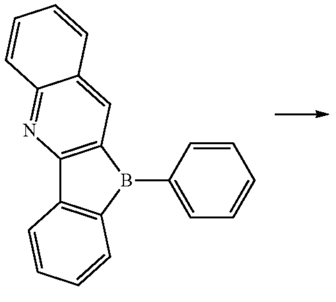

P27-1

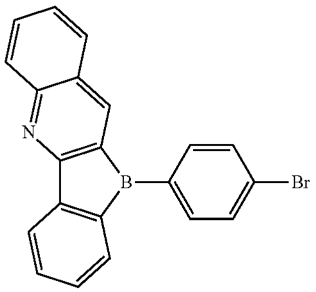

P27-2

P27-1 obtained in Step (1) was brominated to obtain P27-2 using the same method as in step (2) in Example 1.

(3)

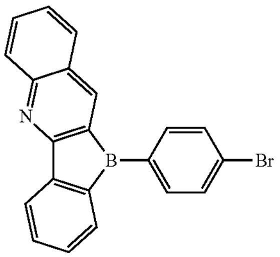

P27-2

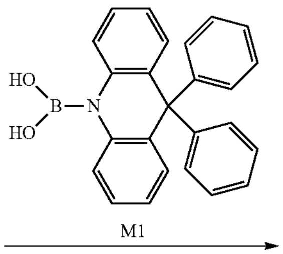

M1

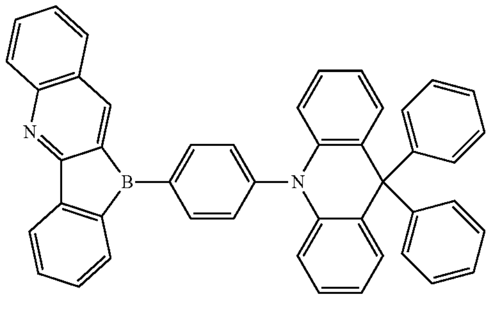

P27

In a 250 mL round-bottom flask, P27-2 (10 mmol) obtained in Step (2), Compound M1 (12 mmol), and $Na_2CO_3$ (80 mmol) were added successively into the solvent toluene/EtOH/$H_2O$ (75/25/50 mL) to form a mixed solution. Then $Pd(PPh_3)_4$ (0.48 mmol) was added to the above mixed solution. The mixed solution was subjected to the reflux and reacted for 20 hours in a nitrogen atmosphere to obtain an intermediate. The obtained intermediate was cooled to room temperature, added to water, filtered with a diatomite mat, extracted with dichloromethane, washed with water, dried with anhydrous magnesium sulfate, filtered and evaporated. Then a crude product was purified by silica gel column chromatography to obtain the final product P27.

Elemental analysis results of the organic compound P27 are as follows: molecular formula $C_{46}H_{31}BN_2$, where theoretical values were: C, 88.74, H, 5.02, B, 1.74, and N, 4.50, and the test values were: C, 88.74, H, 5.01, B, 1.74, and N, 4.50.

The relative molecular mass of the organic compound P27 was obtained by liquid chromatography-mass spectrometry, where the theoretical value was 622.26, and the test value was 622.24.

Example 4

An organic compound P52 is provided, and the structure formula of the organic compound P52 is as follows:

P52

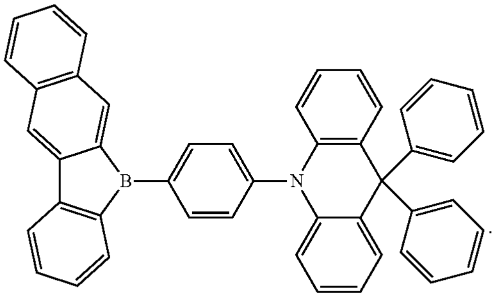

The preparation method of the organic compound P52 includes the steps described below.

(1)

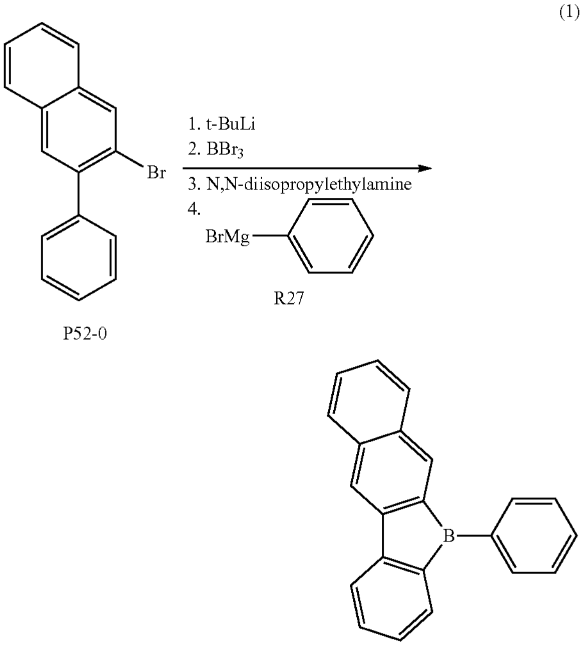

P52-0

R27

P52-1

The pentane solution of t-BuLi (18.59 mL, 1.50 M, 27.89 mmol) was slowly added into the tert-Butylbenzene (70 mL) solution of P52-0 (4.98 mmol) at 0° C., and then the mixture was heated to 60° C. and reacted for 4 hours. After the reaction was completed, the mixture was cooled to −30° C., boron tribromide (19.86 mmol) was slowly added and then stirred at room temperature for 1 hour; N,N-diisopropylethylamine (19.86 mmol) was added at room temperature, and the reaction continued at 145° C. for 12 hours and then cooled to room temperature. In this state, R27 (19.86 mmol) was added, and the reaction continued for 2 hours and then stopped. The mixture was dried to remove solvent through rotary in vacuum and processed on a silica gel column to obtain the product P52-1.

(2)

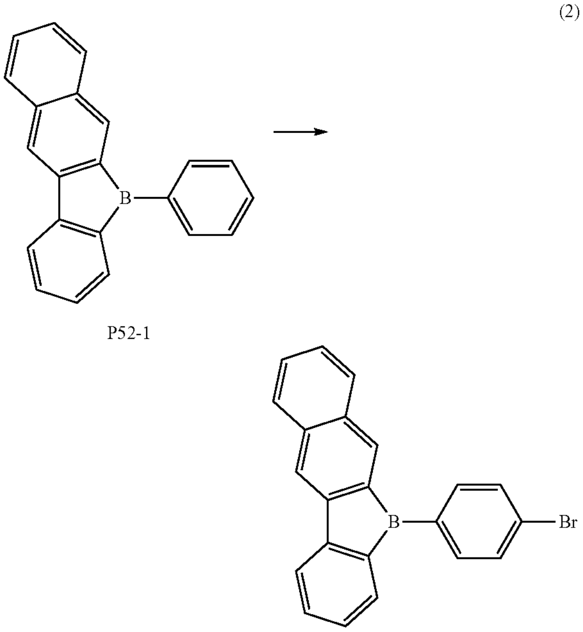

P52-1

P52-2

P52-1 obtained in Step (1) was brominated to obtain P52-2 using the same method as in step (2) in Example 1.

(3)

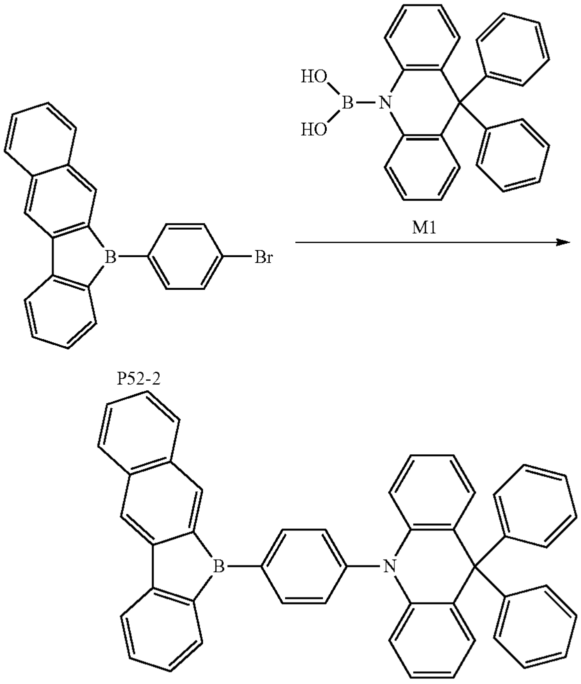

P52-2

M1

P52

In a 250 mL round-bottom flask, P52-2 (10 mmol) obtained in Step (2), Compound M1 (12 mmol), and $Na_2CO_3$ (80 mmol) were added successively into the solvent toluene/EtOH/$H_2O$ (75/25/50 mL) to form a mixed solution. Then $Pd(PPh_3)_4$ (0.48 mmol) was added to the above mixed solution. The mixed solution was subjected to the reflux and reacted for 20 hours in a nitrogen atmosphere to obtain an intermediate. The obtained intermediate was cooled to room temperature, added to water, filtered with a diatomite mat, extracted with dichloromethane, washed with water, dried with anhydrous magnesium sulfate, filtered and evaporated. Then a crude product was purified by silica gel column chromatography to obtain the final product P52.

Elemental analysis results of the organic compound P52 are as follows: molecular formula C47$H_{32}$BN, where theoretical values were: C, 90.82, H, 5.19, B, 1.74, and N, 2.25, and the test values were: C, 90.82, H, 5.18, B, 1.74, and N, 2.25.

The relative molecular mass of the organic compound P52 was obtained by liquid chromatography-mass spectrometry, where the theoretical value was 621.26, and the test value was 621.24.

Example 5

An organic compound P53 is provided, and the structure formula of the organic compound P53 is as follows:

P53

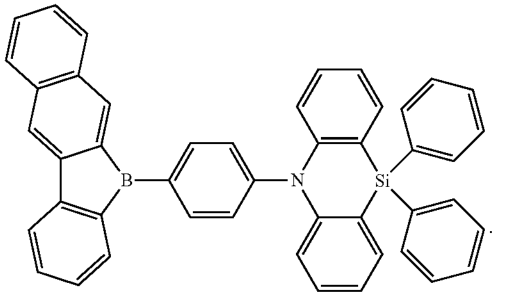

The preparation method of the organic compound P53 differs from the preparation method in Example 4 only in that Compound M1 in Step (3) was replaced by an equimolar amount of Compound M53

M53

( 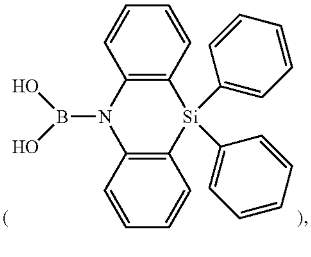 ), while other raw materials and preparation methods are the same as those in Example 4.

Elemental analysis results of the organic compound P53 are as follows: molecular formula $C_{46}H_{32}$BNSi, where theoretical values were: C, 86.65, H, 5.06, B, 1.70, N, 2.20, and Si, 4.40, and the test values were: C, 86.65, H, 5.05, B, 1.70, N, 2.20, and Si, 4.40.

The relative molecular mass of the organic compound P53 was obtained by liquid chromatography-mass spectrometry, where the theoretical value was 637.24, and the test value was 621.23.

Example 6

An organic compound P90 is provided, and the structure formula of the organic compound P90 is as follows:

P90

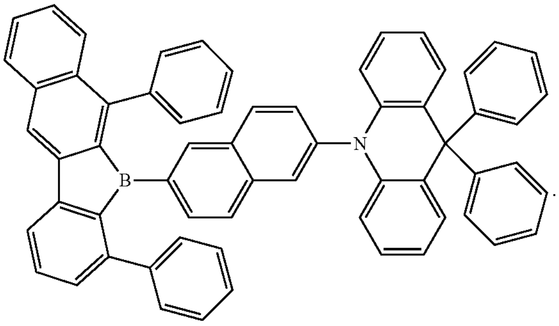

The preparation method of the organic compound P90 includes the steps described below.

(1)

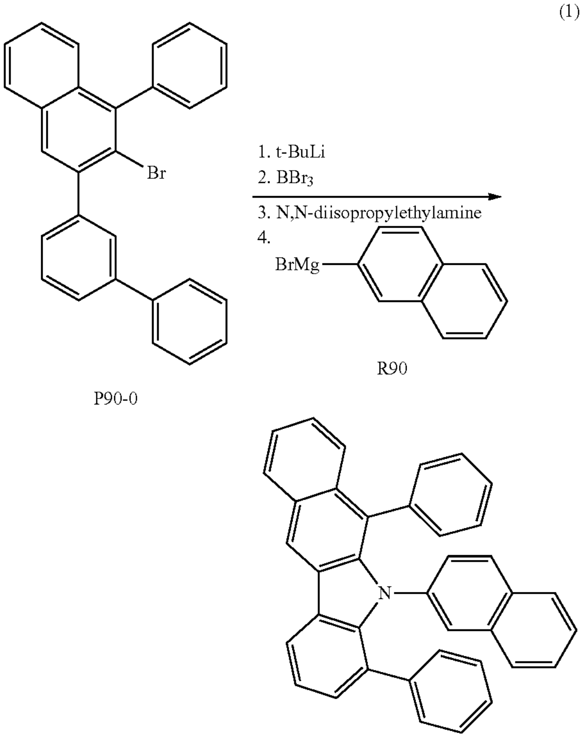

P90-1

The pentane solution of t-BuLi (18.59 mL, 1.50 M, 27.89 mmol) was slowly added into the tert-Butylbenzene (70 mL) solution of P90-0 (4.98 mmol) at 0° C., and then the mixture was heated to 60° C. and reacted for 4 hours. After the reaction was completed, the mixture was cooled to −30° C., boron tribromide (19.86 mmol) was slowly added and then stirred at room temperature for 1 hour; N,N-diisopropylethylamine (19.86 mmol) was added at room temperature, and the reaction continued at 145° C. for 12 hours and then cooled to room temperature. In this state, R90 (19.86 mmol) was added, and the reaction continued for 2 hours and then stopped. The mixture was dried to remove solvent through rotary in vacuum and processed on a silica gel column to obtain the product P90-1.

(2)

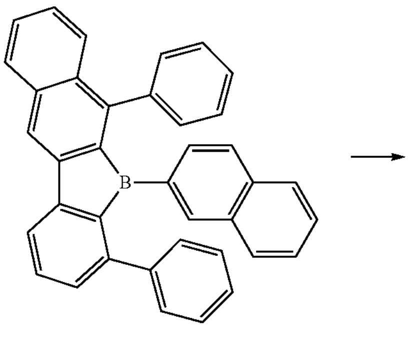

P90-1

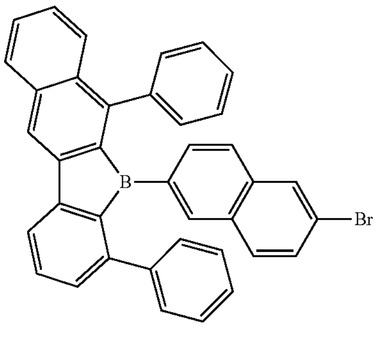

P90-2

P90-1 obtained in Step (1) was brominated to obtain P90-2 using the same method as in step (2) in Example 1.

(3)

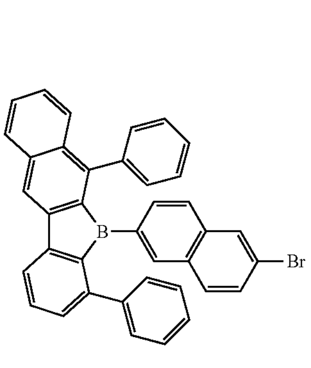

P90-2

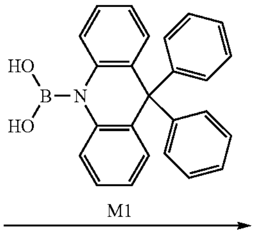

M1

-continued

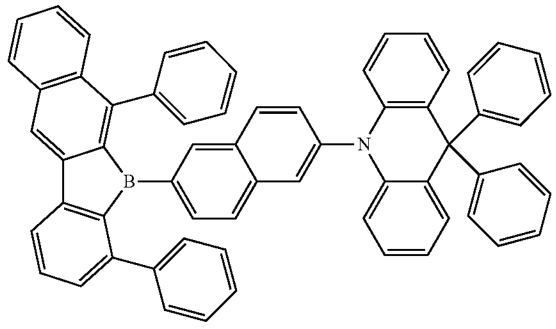

P90

In a 250 mL round-bottom flask, P90-2 (10 mmol) obtained in Step (2), Compound M1 (12 mmol), and $Na_2CO_3$ (80 mmol) were added successively into the solvent toluene/EtOH/$H_2O$ (75/25/50 mL) to form a mixed solution. Then $Pd(PPh_3)_4$ (0.48 mmol) was added to the above mixed solution. The mixed solution was subjected to the reflux and reacted for 20 hours in a nitrogen atmosphere to obtain an intermediate. The obtained intermediate was cooled to room temperature, added to water, filtered with a diatomite mat, extracted with dichloromethane, washed with water, dried with anhydrous magnesium sulfate, filtered and evaporated. Then a crude product was purified by silica gel column chromatography to obtain the final product P90.

Elemental analysis results of the organic compound P90 are as follows: molecular formula $C_{63}H_{42}BN$, where theoretical values were: C, 91.85, H, 5.14, B, 1.31, and N, 1.70, and the test values were: C, 91.85, H, 5.13, B, 1.31, and N, 1.70.

The relative molecular mass of the organic compound P90 was obtained by liquid chromatography-mass spectrometry, where the theoretical value was 823.34, and the test value was 823.32.

Example 7

An organic compound P96 is provided, and the structure formula of the organic compound P96 is as follows:

P96

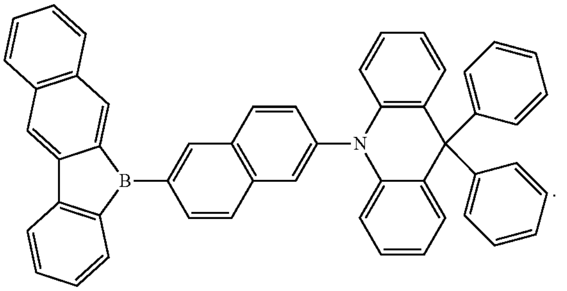

The preparation method of the organic compound P96 differs from the preparation method in Example 6 only in that P90-0 in Step (1) was replaced by an equimolar amount of P52-0

P52-0

( 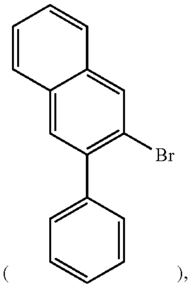 ), while other raw materials and preparation methods are the same as those in Example 6.

Elemental analysis results of the organic compound P96 are as follows: molecular formula $C_{51}H_{34}BN$, where theoretical values were: C, 91.20, H, 5.10, B, 1.61, and N, 2.09, and the test values were: C, 91.20, H, 5.10, B, 1.61, and N, 2.09.

The relative molecular mass of the organic compound P96 was obtained by liquid chromatography-mass spectrometry, where the theoretical value was 671.28, and the test value was 671.26.

Example 8

An organic compound P97 is provided, and the structure formula of the organic compound P97 is as follows:

P97

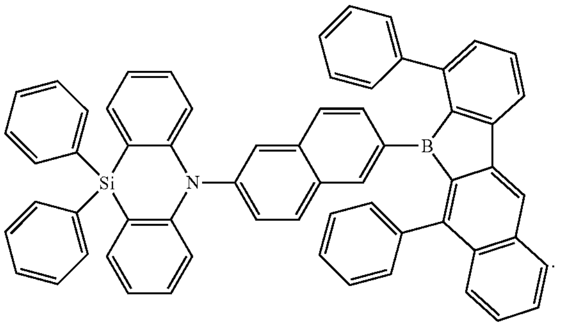

The preparation method of the organic compound P97 differs from the preparation method in Example 6 only in that Compound M1 in Step (3) was replaced by an equimolar amount of Compound M53

M53

( 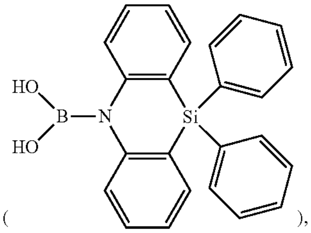 ), while other raw materials and preparation methods are the same as those in Example 6.

Elemental analysis results of the organic compound P97 are as follows: molecular formula $C_{62}H_{42}BNSi$, where theoretical values were: C, 88.66, H, 5.04, B, 1.29, N, 1.67, and Si, 3.34, and the test values were: C, 88.66, H, 5.04, B, 1.29, N, 1.67, and Si, 3.34.

The relative molecular mass of the organic compound P97 was obtained by liquid chromatography-mass spectrometry, where the theoretical value was 839.32, and the test value was 839.30.

Example 9

An organic compound P98 is provided, and the structure formula of the organic compound P98 is as follows:

P98

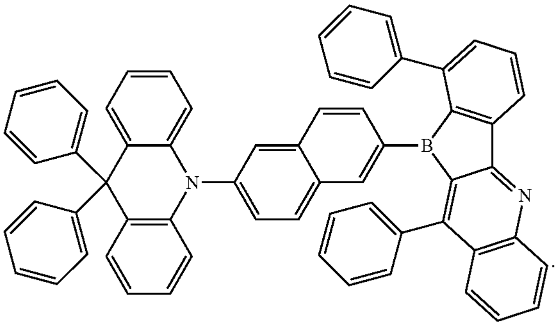

The preparation method of the organic compound P98 differs from the preparation method in Example 6 only in that P90-0 in Step (1) was replaced by an equimolar amount of P98-0

P98-0

( 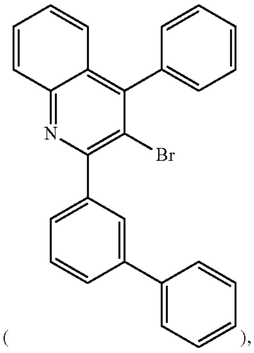 ), while other raw materials and preparation methods are the same as those in Example 6.

Elemental analysis results of the organic compound P98 are as follows: molecular formula $C62H_{41}BN_2$, where theoretical values were: C, 90.28, H, 5.01, B, 1.31, and N, 3.40, and the test values were: C, 90.28, H, 5.01, B, 1.31, and N, 3.40.

The relative molecular mass of the organic compound P98 was obtained by liquid chromatography-mass spectrometry, where the theoretical value was 824.34, and the test value was 824.31.

Example 10

An organic compound P92 is provided, and the structure formula of the organic compound P92 is as follows:

P92

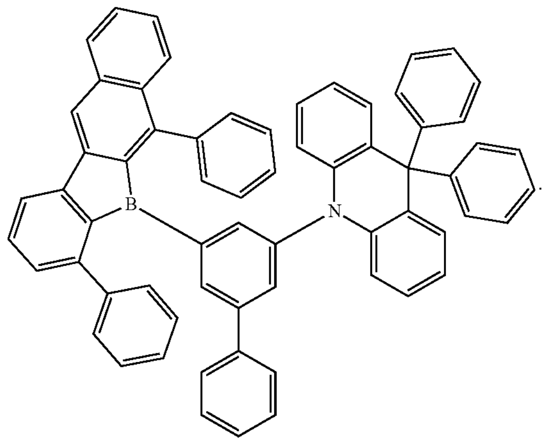

The preparation method of the organic compound P92 includes the steps described below.

(1)

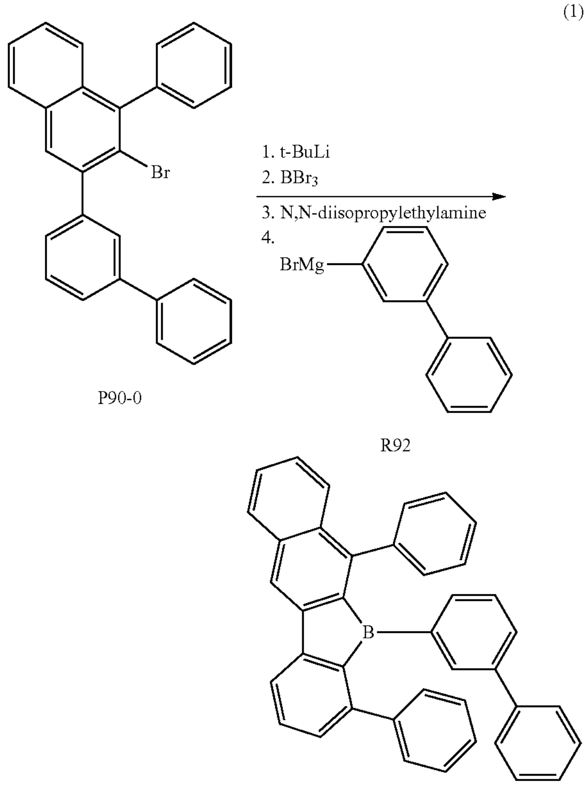

P90-0

R92

P92-1

The pentane solution of t-BuLi (18.59 mL, 1.50 M, 27.89 mmol) was slowly added into the tert-Butylbenzene (70 mL) solution of P90-0 (4.98 mmol) at 0° C., and then the mixture was heated to 60° C. and reacted for 4 hours. After the reaction was completed, the mixture was cooled to −30° C., boron tribromide (19.86 mmol) was slowly added and then stirred at room temperature for 1 hour; N,N-diisopropylethylamine (19.86 mmol) was added at room temperature, and the reaction continued at 145° C. for 12 hours and then cooled to room temperature. In this state, R92 (19.86 mmol) was added, and the reaction continued for 2 hours and then stopped. The mixture was dried to remove solvent through rotary in vacuum and processed on a silica gel column to obtain the product P92-1.

(2)

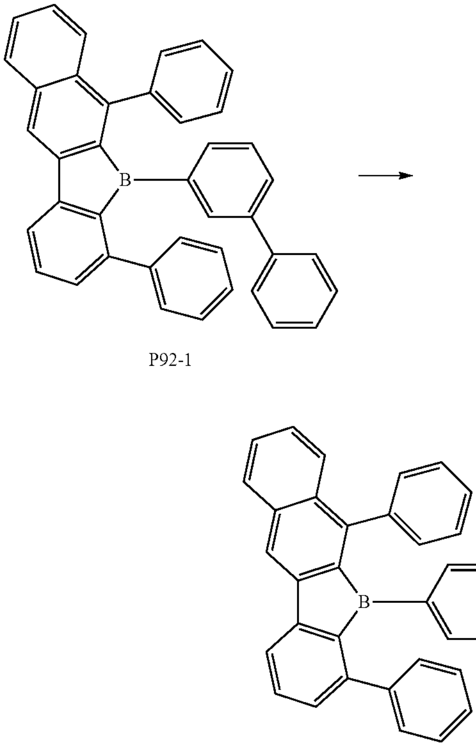

P92-1

P92-2

P92-1 obtained in Step (1) was brominated to obtain P92-2 using the same method as in step (2) in Example 1.

(3)

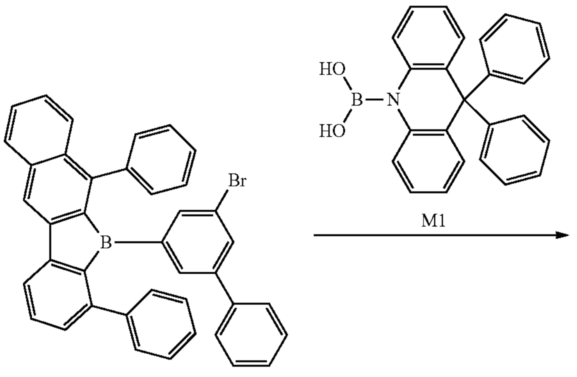

P92-2

-continued

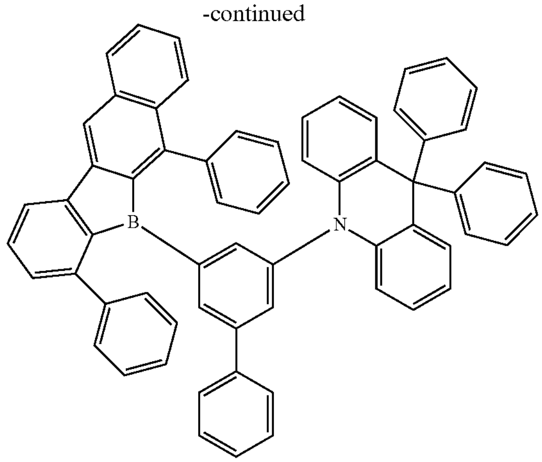

P92

In a 250 mL round-bottom flask, P92-2 (10 mmol) obtained in Step (2), Compound M1 (12 mmol), and $Na_2CO_3$ (80 mmol) were added successively into the solvent toluene/EtOH/$H_2O$ (75/25/50 mL) to form a mixed solution. Then $Pd(PPh_3)_4$ (0.48 mmol) was added to the above mixed solution. The mixed solution was subjected to the reflux and reacted for 20 hours in a nitrogen atmosphere to obtain an intermediate. The obtained intermediate was cooled to room temperature, added to water, filtered with a diatomite mat, extracted with dichloromethane, washed with water, dried with anhydrous magnesium sulfate, filtered and evaporated. Then a crude product was purified by silica gel column chromatography to obtain the final product P92.

Elemental analysis results of the organic compound P92 are as follows: molecular formula $C_{65}H_{44}BN$, where theoretical values were: C, 91.86, H, 5.22, B, 1.27, and N, 1.65, and the test values were: C, 91.86, H, 5.21, B, 1.27, and N, 1.65.

The relative molecular mass of the organic compound P92 was obtained by liquid chromatography-mass spectrometry, where the theoretical value was 849.36, and the test value was 849.34.

Example 11

An organic compound P93 is provided, and the structure formula of the organic compound P93 is as follows:

P93

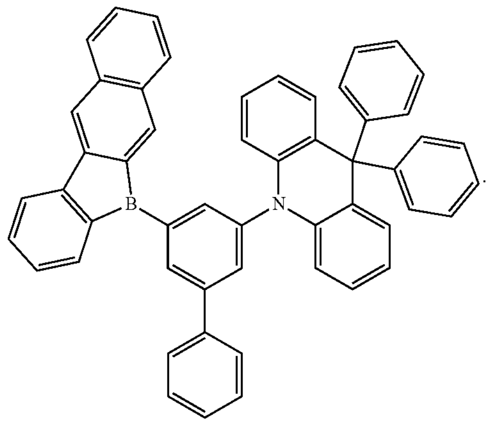

The preparation method of the organic compound P93 differs from the preparation method in Example 10 only in that P90-0 in Step (1) was replaced by an equimolar amount of P52-0

P52-0

( 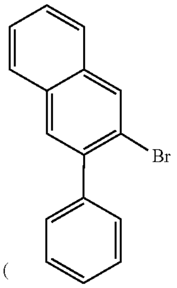 ), while other raw materials and preparation methods are the same as those in Example 10.

Elemental analysis results of the organic compound P93 are as follows: molecular formula $C_{53}H_{36}BN$, where theoretical values were: C, 91.24, H, 5.20, B, 1.55, and N, 2.01, and the test values were: C, 91.24, H, 5.20, B, 1.55, and N, 2.01.

The relative molecular mass of the organic compound P93 was obtained by liquid chromatography-mass spectrometry, where the theoretical value was 697.29, and the test value was 697.28.

Example 12

An organic compound P94 is provided, and the structure formula of the organic compound P94 is as follows:

P94

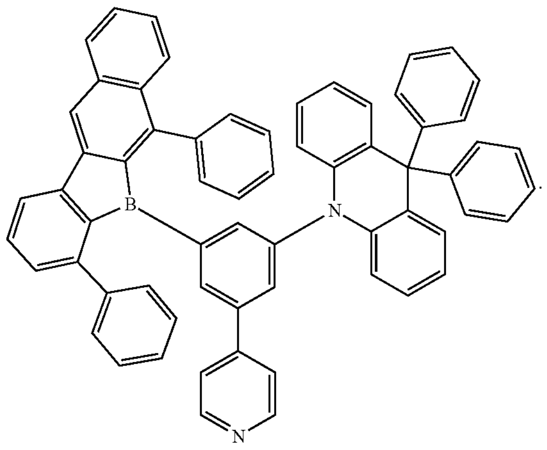

The preparation method of the organic compound P94 differs from the preparation method in Example 10 only in that R92 in Step (1) was replaced by an equimolar amount of R94

R94

(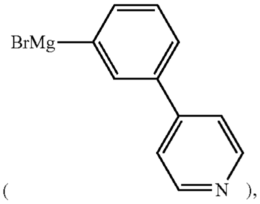), while other raw materials and preparation methods are the same as those in Example 10.

Elemental analysis results of the organic compound P94 are as follows: molecular formula $C_{64}H_{43}BN_2$, where theoretical values were: C, 90.34, H, 5.09, B, 1.27, and N, 3.29, and the test values were: C, 90.34, H, 5.09, B, 1.27, and N, 3.29.

The relative molecular mass of the organic compound P94 was obtained by liquid chromatography-mass spectrometry, where the theoretical value was 850.35, and the test value was 850.34.

Example 13

An organic compound P95 is provided, and the structure formula of the organic compound P95 is as follows:

P95

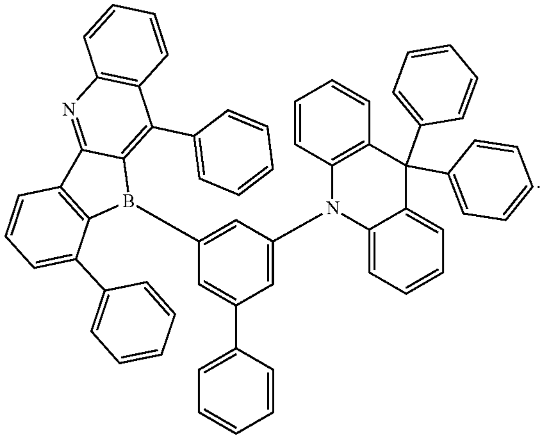.

The preparation method of the organic compound P95 differs from the preparation method in Example 10 only in that P90-0 in Step (1) was replaced by an equimolar amount of P98-0

P98-0

(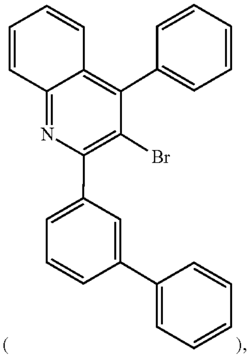), while other raw materials and preparation methods are the same as those in Example 10.

Elemental analysis results of the organic compound P95 ae as follows: molecular formula $C_{64}H_{43}BN_2$, where theoretical values were: C, 90.34, H, 5.09, B, 1.27, and N, 3.29, and the test values were: C, 90.34, H, 5.09, B, 1.27, and N, 3.29.

The relative molecular mass of the organic compound P95 was obtained by liquid chromatography-mass spectrometry, where the theoretical value was 850.35, and the test value was 850.35.

Example 14

An organic compound P83 is provided, and the structure formula of the organic compound P83 is as follows:

P83

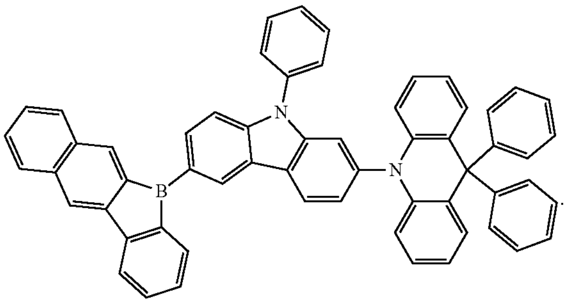.

The preparation method of the organic compound P83 includes the steps described below.

(1)

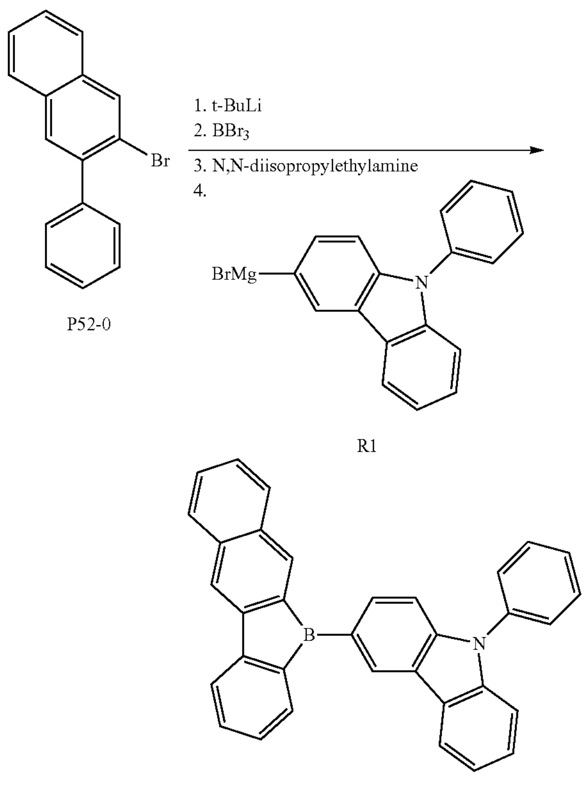

P52-0

R1

P83-1

The pentane solution of t-BuLi (18.59 mL, 1.50 M, 27.89 mmol) was slowly added into the tert-Butylbenzene (70 mL) solution of P52-0 (4.98 mmol) at 0° C., and then the mixture was heated to 60° C. and reacted for 4 hours. After the reaction was completed, the mixture was cooled to −30° C., boron tribromide (19.86 mmol) was slowly added and then stirred at room temperature for 1 hour; N,N-diisopropylethylamine (19.86 mmol) was added at room temperature, and the reaction continued at 145° C. for 12 hours and then cooled to room temperature. In this state, $R_1$ (19.86 mmol) was added, and the reaction continued for 2 hours and then stopped. The mixture was dried to remove solvent through rotary in vacuum and processed on a silica gel column to obtain the product P83-1.

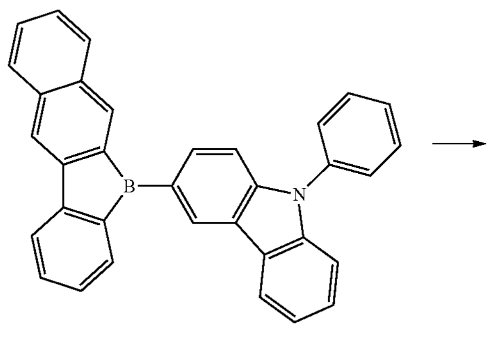

P83-1

-continued

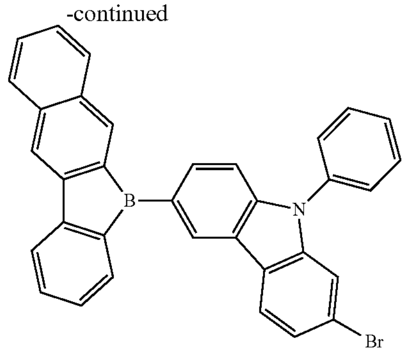

P83-2

P83-1 obtained in Step (1) was brominated to obtain P83-2 using the same method as in step (2) in Example 1.

(3)

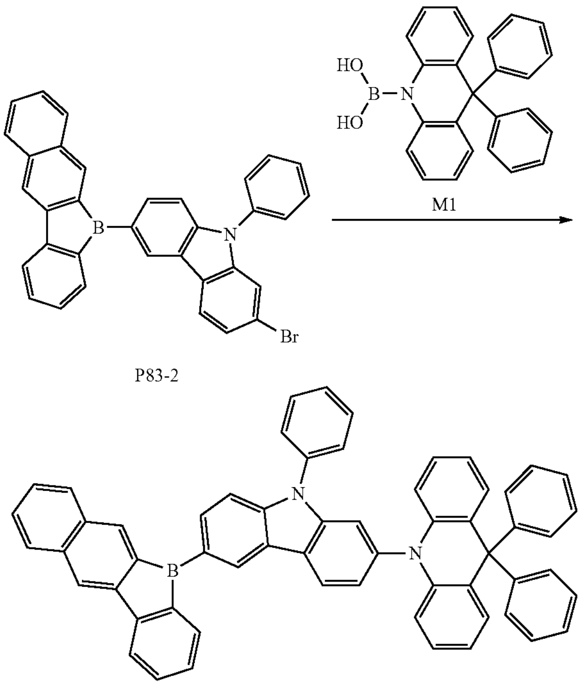

P83-2

M1

P83

In a 250 mL round-bottom flask, P83-2 (10 mmol) obtained in Step (2), Compound M1 (12 mmol), and $Na_2CO_3$ (80 mmol) were added successively into the solvent toluene/EtOH/$H_2O$ (75/25/50 mL) to form a mixed solution. Then $Pd(PPh_3)_4$ (0.48 mmol) was added to the above mixed solution. The mixed solution was subjected to the reflux and reacted for 20 hours in a nitrogen atmosphere to obtain an intermediate. The obtained intermediate was cooled to room temperature, added to water, filtered with a diatomite mat, extracted with dichloromethane, washed with water, dried with anhydrous magnesium sulfate, filtered and evaporated. Then a crude product was purified by silica gel column chromatography to obtain the final product P83.

Elemental analysis results of the organic compound P83 are as follows: molecular formula $C_{59}H_{39}BN_2$, where theoretical values were: C, 90.07, H, 5.00, B, 1.37, and N, 3.56, and the test values were: C, 90.07, H, 5.01, B, 1.37, and N, 3.56.

The relative molecular mass of the organic compound P83 was obtained by liquid chromatography-mass spectrometry, where the theoretical value was 786.32, and the test value was 786.36.

Example 15

An organic compound P103 is provided, and the structure formula of the organic compound P103 is as follows:

P103

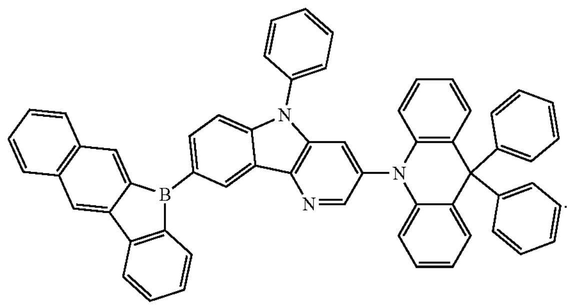

The preparation method of the organic compound P103 differs from the preparation method in Example 14 only in that $R_1$ in Step (1) was replaced by an equimolar amount of R103

R103

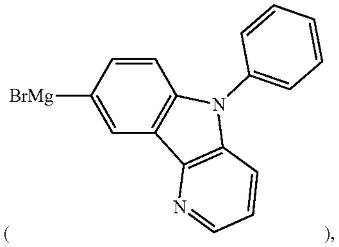

while other raw materials and preparation methods are the same as those in Example 14.

Elemental analysis results of the organic compound P103 are as follows: molecular formula $C_{58}H_{38}BN_3$, where theoretical values are: C, 88.43, H, 4.86, B, 1.37, and N, 5.33, and the test values are: C, 88.43, H, 4.86, B, 1.37, and N, 5.33.

The relative molecular mass of the organic compound P103 was obtained by liquid chromatography-mass spectrometry, where the theoretical value was 787.32, and the test value was 787.30.

Example 16

An organic compound P104 is provided, and the structure formula of the organic compound P104 is as follows:

P104

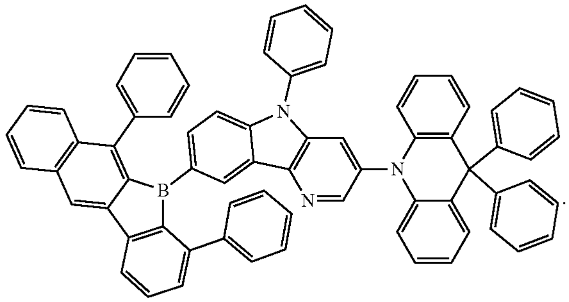

The preparation method of the organic compound P104 differs from the preparation method in Example 15 only in that P52-0 in Step (1) was replaced by an equimolar amount of P90-0

P90-0

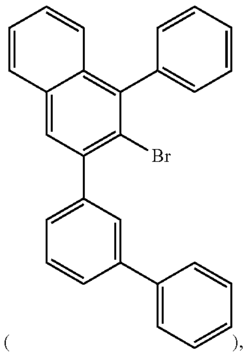

while other raw materials and preparation methods are the same as those in Example 15.

Elemental analysis results of the organic compound P104 are as follows: molecular formula $C_{70}H_{46}BN_3$, where theoretical values are: C, 89.45, H, 4.93, B, 1.15, and N, 4.47, and the test values are: C, 89.45, H, 4.93, B, 1.15, and N, 4.47.

The relative molecular mass of the organic compound P104 was obtained by liquid chromatography-mass spectrometry, where the theoretical value was 939.38, and the test value was 939.36.

Calculation Results of Compounds:

With the density functional theory (DFT), the distribution and energy levels of molecular frontier orbital HOMO and LUMO were optimized and calculated for the organic compounds provided by the present disclosure using a Guassian 09 package (Guassian Inc.) at a calculation level of B3LYP/6-31G(d). Meanwhile, based on the time-dependent density functional theory (TD-DFT), the singlet energy level $E_S$ and the triplet energy level $E_T$ of the compound molecule were simulated and calculated, and the energy level difference $\Delta E_{ST}$ was obtained. Results are shown in Table 1.

TABLE 1

| Compound | HOMO (eV) | LUMO (eV) | $E_S$ (eV) | $E_T$ (eV) | $\Delta E_{ST}$ (eV) |
|---|---|---|---|---|---|
| P1 | −2.21 | −4.93 | 2.454 | 2.4443 | 0.0097 |
| P4 | −2.11 | −4.57 | 2.1974 | 2.1969 | 0.0005 |
| P27 | −2.46 | −5.11 | 2.2123 | 2.2062 | 0.0061 |
| P52 | −2.31 | −5.05 | 2.3033 | 2.2967 | 0.0066 |
| P53 | −2.31 | −5.12 | 2.3688 | 2.3228 | 0.046 |
| P90 | −2.28 | −4.98 | 2.3898 | 2.3353 | 0.0545 |
| P96 | −2.32 | −5.06 | 2.3813 | 2.3219 | 0.0594 |
| P97 | −2.28 | −5.04 | 2.451 | 2.3353 | 0.1157 |
| P98 | −2.40 | −5.02 | 2.3166 | 2.3151 | 0.0015 |
| P92 | −2.22 | −4.96 | 2.3082 | 2.2896 | 0.0186 |
| P93 | −2.27 | −5.04 | 2.3023 | 2.2886 | 0.0137 |
| P94 | −2.32 | −5.06 | 2.3093 | 2.2904 | 0.0189 |
| P95 | −2.34 | −5.02 | 2.2464 | 2.2281 | 0.0183 |

As can be seen from the calculated results in Table 1, the overlap degree between HOMO and LUMO of each organic compound provided by the present disclosure was low, the energy level difference $\Delta E_{ST}$ between the singlet state energy level $E_S$ and the triplet state energy level $E_T$ can reach below 300 meV (0.3 eV) and even as low as 0.5 meV to 200 meV, thus the organic compounds had good TADF characteristics.

Application examples in which the organic compounds described in the present disclosure are applied to the OLED device are described below for purposes of example.

Application Example 1

An OLED device is provided. The OLED device includes the following structures deposited in order: a glass substrate, an indium tin oxide (ITO) anode with a thickness of 15 nm, a first hole transport layer with a thickness of 10 nm, a second hole transport layer with a thickness of 95 nm, a light-emitting layer with a thickness of 30 nm, a first electron transport layer with a thickness of 35 nm, a second electron transport layer with a thickness of 5 nm, a cathode (a magnesium-silver electrode at an Mg—Ag mass ratio of 1:9) with a thickness of 10 nm, and a capping layer (CPL) with a thickness of 100 nm.

The steps for preparing the OLED device are as follows:

(1) A glass substrate with an ITO anode was cut into the size of 50 mm×50 mm×0.7 mm, sonicated in isopropyl alcohol and deionized water for 30 minutes respectively, and cleaned with exposure to ozone for 10 minutes. The obtained glass substrate with the ITO anode was installed onto a vacuum deposition apparatus.

(2) The compound HAT-CN was deposited through vacuum evaporation on the ITO anode layer at a vacuum degree of $2\times10^{-6}$ Pa to serve as a first hole transport layer with a thickness of 10 nm.

(3) The compound TAPC was deposited through vacuum evaporation on the first hole transport layer to serve as a second hole transport layer with a thickness of 95 nm.

(4) A light-emitting layer was deposited through vacuum evaporation on the second hole transport layer with the organic compound P1 provided in Example 1 of the present disclosure as a host material and $Ir(piq)_2(acac)$ as a doped material, where the mass ratio of the organic compound P1 to $Ir(piq)_2(acac)$ was 19:1 and the thickness of the light-emitting layer was 30 nm.

(5) The compound BCP was deposited through vacuum evaporation on the light-emitting layer to serve as a first electron transport layer with a thickness of 35 nm.

(6) The compound $Alq_3$ was deposited through vacuum evaporation on the first electron transport layer to serve as a second electron transport layer with a thickness of 5 nm.

(7) The magnesium-silver electrode was deposited through vacuum evaporation on the second electron transport layer to serve as a cathode with a thickness of 10 nm, where the mass ratio of Mg to Ag was 1:9.

(8) The compound CBP with a high refractive index was deposited through vacuum evaporation on the cathode to serve as a cathode covering layer (that is, a capping layer (CPL)) with a thickness of 100 nm, so as to obtain the OLED device.

The structures of compounds used in the OLED devices are as follows:

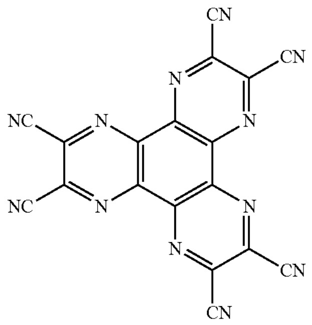

HAT-CN

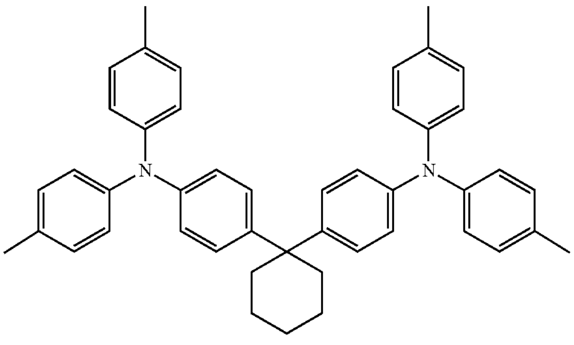

TAPC

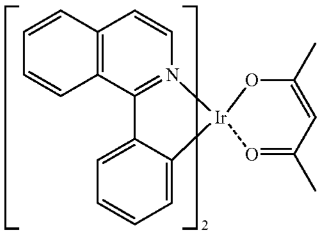

$Ir(piq)_2(acac)$

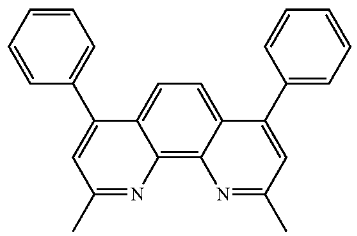

BCP

-continued

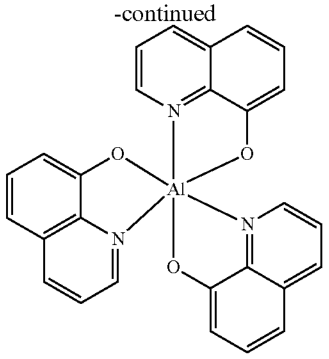

Alq3

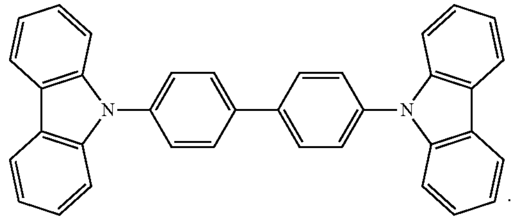

CBP

Application Examples 2 to 16

An OLED device is provided in each application example. Each of these application examples differs from Application Example 1 only in that the organic compound P1 in Step (4) was replaced by an equal amount of the organic compounds P4, P27, P52, P53, P90, P96, P97, P98, P92, P93, P94, P95, P83, P103, and P104, respectively, while other raw materials and preparation steps were the same.

Comparative Example 1

An OLED device is provided. Comparative Example 1 differs from Application Example 1 only in that the organic compound P1 in Step (4) was replaced by an equal amount of comparative compound M1

( 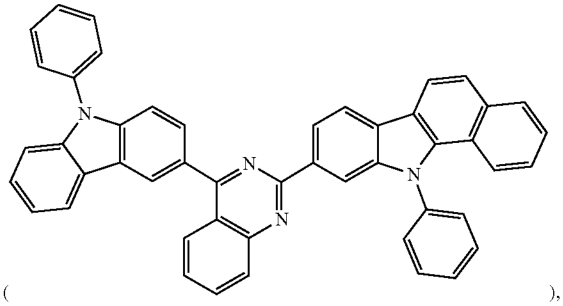 [SMILES: c1ccc(-n2c3ccccc3c3cc(-c4nc(-c5ccc6c7ccc8ccccc8c7n(-c7ccccc7)c6c5)nc5ccccc45)ccc32)cc1] ), while other raw materials and preparation steps were the same.

Performance Evaluation of the OLED Device:

Currents of each OLED device at different voltages were tested by the Keithley 2365A digital nanovoltmeter, and the current density of each OLED device at different voltages was obtained by dividing the current by the light-emitting area. The brightness and radiant energy density of each OLED device at different voltages were tested by the Konicaminolta CS-2000 spectroradiometer. According to the current densities and brightness of each OLED device at different voltages, the turn-on voltage V ($V_{ON}$, V) and current efficiency (CE, cd/A) of each OLED device at the same current density (10 $mA/cm^2$) were obtained. The lifetime LT95 (under a testing condition of 50 $mA/cm^2$) was obtained by measuring the time when the brightness of the OLED device reached 95% of its initial brightness. Test data is shown in Table 2.

TABLE 2

| OLED device | Light-emitting layer host material | Structure of the light-emitting layer host material | $V_{ON}$ (V) | CE (Cd/A) | LT95 (h) |
|---|---|---|---|---|---|
| Application Example 1 | P1 | 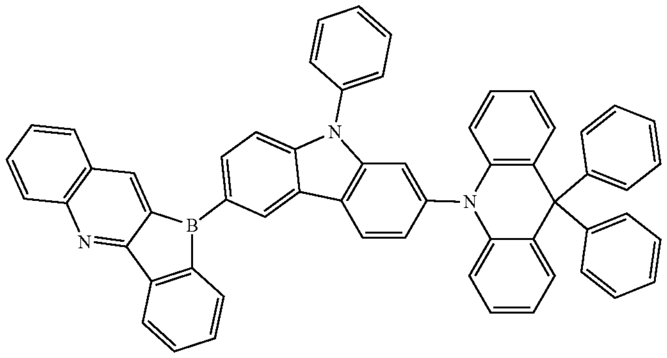 P1 | 3.88 | 44.2 | 146 |

TABLE 2-continued
| OLED device | Light-emitting layer host material | Structure of the light-emitting layer host material | $V_{ON}$ (V) | CE (Cd/A) | LT95 (h) |
|---|---|---|---|---|---|
| Application Example 2 | P4 | 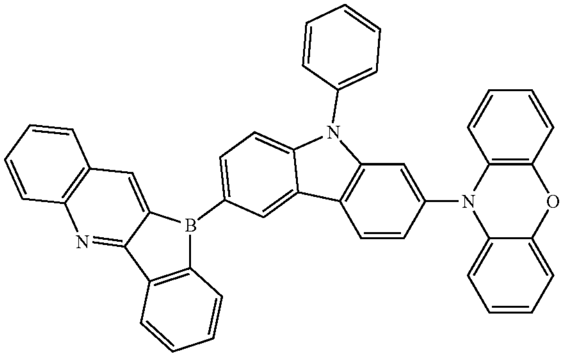 P4 | 3.86 | 44.0 | 144 |
| Application Example 3 | P27 | 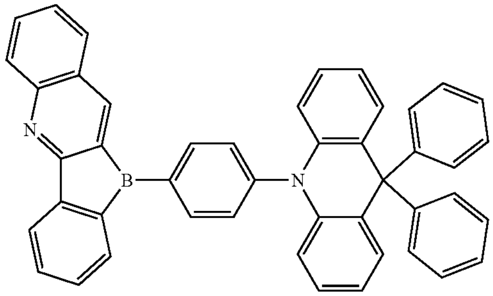 P27 | 3.93 | 43.8 | 149 |
| Application Example 4 | P52 | 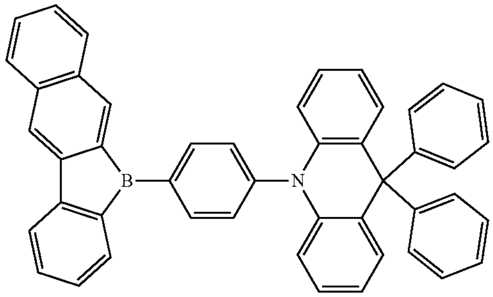 P52 | 3.83 | 44.7 | 150 |
| Application Example 5 | P53 | 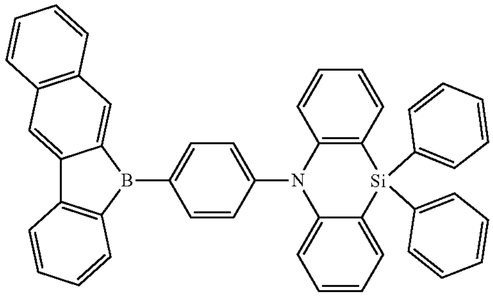 P53 | 3.86 | 44.4 | 148 |

TABLE 2-continued
| OLED device | Light-emitting layer host material | Structure of the light-emitting layer host material | $V_{ON}$ (V) | CE (Cd/A) | LT95 (h) |
|---|---|---|---|---|---|
| Application Example 6 | P90 | 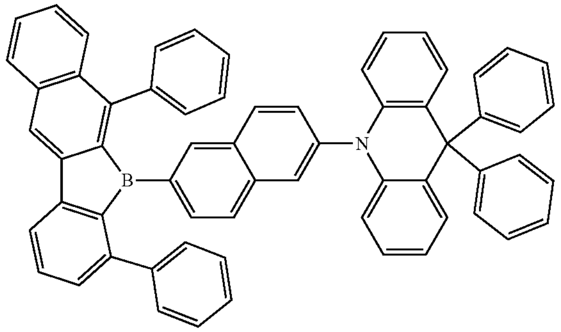 P90 | 3.89 | 43.4 | 147 |
| Application Example 7 | P96 | 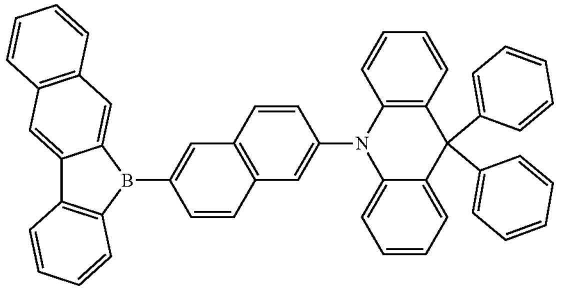 P96 | 3.91 | 42.8 | 143 |
| Application Example 8 | P97 | 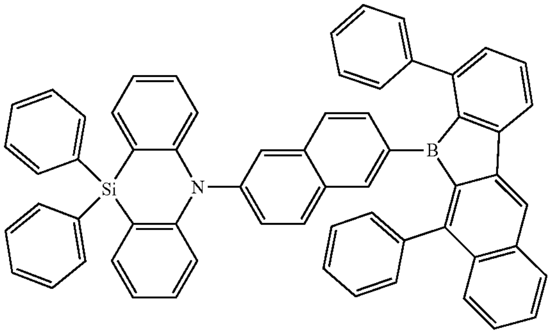 P97 | 3.87 | 43.1 | 149 |
| Application Example 9 | P98 | 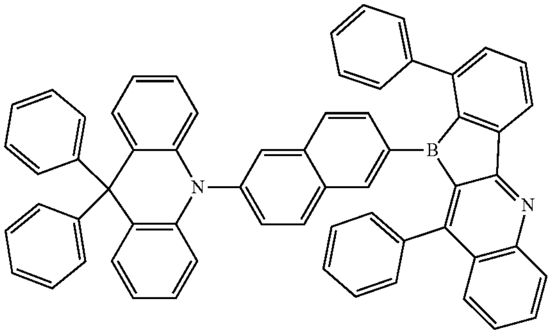 P98 | 3.92 | 42.9 | 147 |

TABLE 2-continued
| OLED device | Light-emitting layer host material | Structure of the light-emitting layer host material | $V_{ON}$ (V) | CE (Cd/A) | LT95 (h) |
| --- | --- | --- | --- | --- | --- |
| Application Example 10 | P92 | 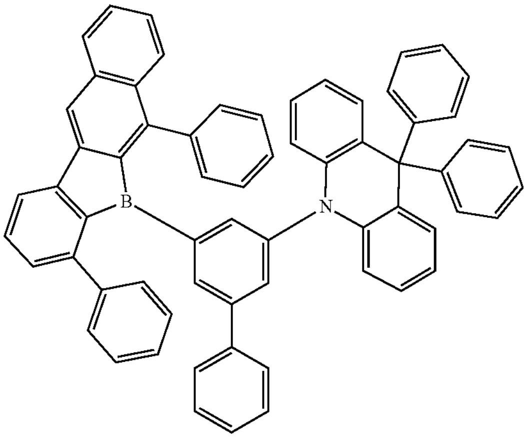 P92 | 3.85 | 45.3 | 151 |
| Application Example 11 | P93 | 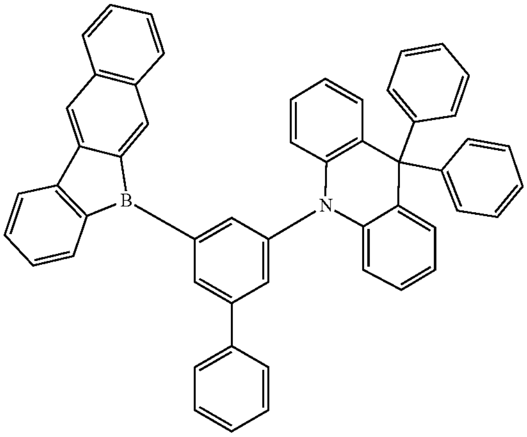 P93 | 3.87 | 44.9 | 147 |
| Application Example 12 | P94 | 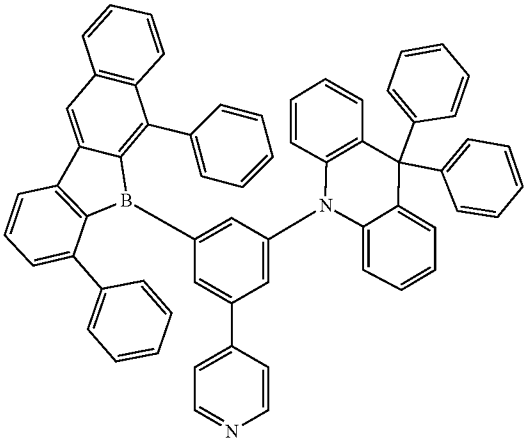 P94 | 3.89 | 43.8 | 152 |

TABLE 2-continued
| OLED device | Light-emitting layer host material | Structure of the light-emitting layer host material | $V_{ON}$ (V) | CE (Cd/A) | LT95 (h) |
|---|---|---|---|---|---|
| Application Example 13 | P95 | 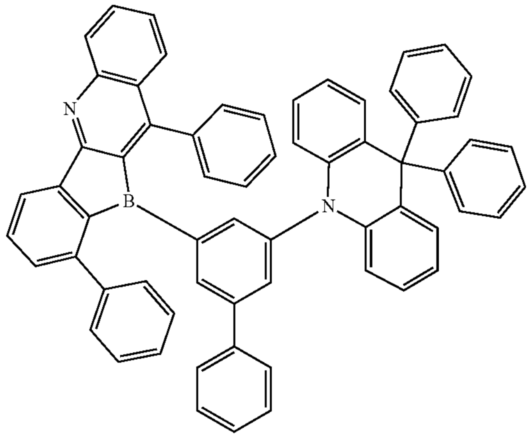 P95 | 3.85 | 45.6 | 154 |
| Application Example 14 | P83 | 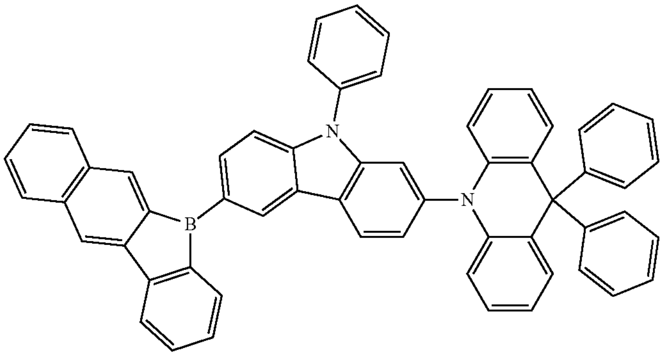 P83 | 3.82 | 43.5 | 148 |
| Application Example 15 | P103 | 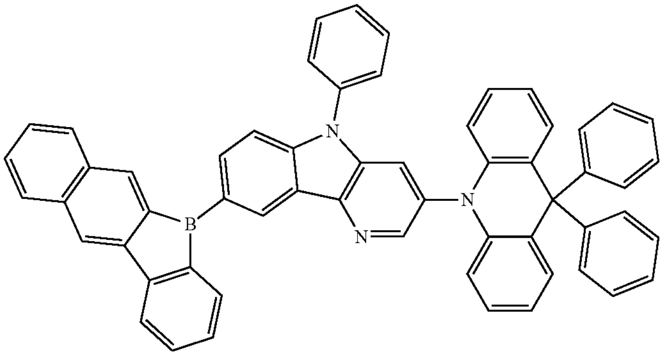 P103 | 3.84 | 43.7 | 145 |

TABLE 2-continued

| OLED device | Light-emitting layer host material | Structure of the light-emitting layer host material | $V_{ON}$ (V) | CE (Cd/A) | LT95 (h) |
|---|---|---|---|---|---|
| Application Example 16 | P104 | 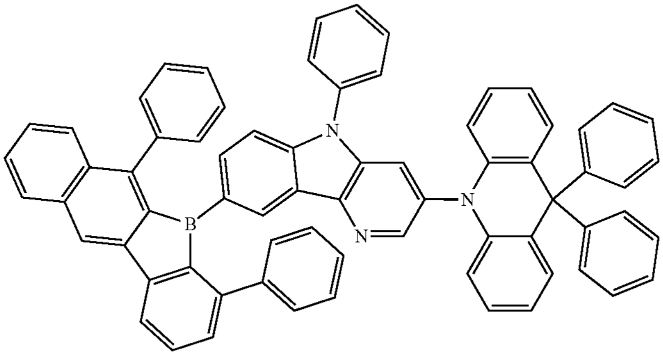 P104 | 3.84 | 43.4 | 147 |
| Comparative Example 1 | M1 | 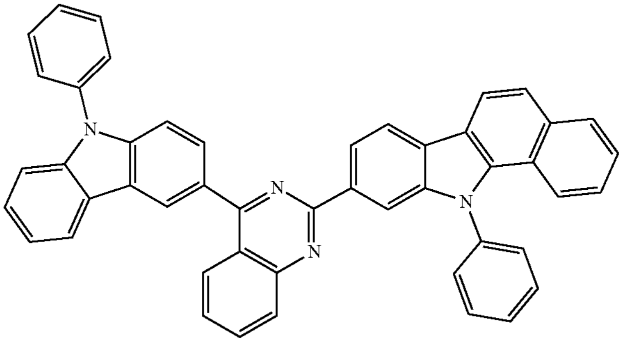 | 4.12 | 40.2 | 135 |

As can be seen from the data in Table 2, compared with the device in the comparative example, the OLED device prepared by using the organic compound of the present disclosure had a lower turn-on voltage which was less than 3.95 V and was reduced by about 5%, so the power consumption of the device can be effectively reduced. The OLED device prepared by using the organic compound of the present disclosure had a higher current efficiency, the CEs of OLED devices in some examples reached 42.8 Cd/A to 45.6 Cd/A, and the CE was improved by about 8% compared with the CE of the device in the comparative example. The OLED device prepared by using the organic compound of the present disclosure had a longer service life, and the LT95 service life of OLED devices in some examples reached more than 150 hours, which was prolonged by about 10% compared with the service life of the device in the comparative example.

To sum up, the organic compound provided by the present disclosure has excellent carrier transport performance and balance and stability of electron mobility and hole mobility. As the host material of the light-emitting layer, the organic compound can significantly improve the luminous efficiency of the device, reduce the turn-on voltage (drive voltage) and energy consumption, and prolong the working life of the device, and thus is a host material with excellent performance.

The applicant has stated that although the organic compound and the application thereof in the present disclosure are described through the embodiments described above, the present disclosure is not limited to the processes and steps described above, which means that the implementation of the present disclosure does not necessarily depend on the processes and steps described above. It should be apparent to those skilled in the art that any improvements made to the present disclosure, equivalent replacements of raw materials selected in the present disclosure and addition of adjuvant ingredients thereof, selections of specific methods, etc., all fall within the protection scope and the disclosed scope of the present disclosure.

What is claimed is:

1. An organic compound, having a structure as shown in Formula I:

Formula I

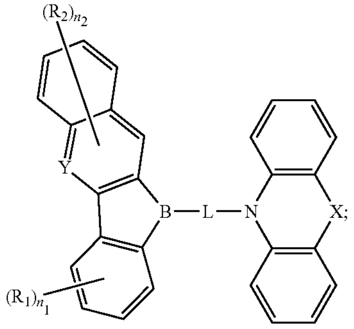

wherein Y is N or CR;

wherein X is selected from O, S, $NR_N$, $CR_{C1}R_{C2}$ or $SiR_{S1}R_{S2}$;

wherein R, $R_N$, $R_{C1}$, $R_{C2}$, $R_{S1}$, and $R_{S2}$ are each independently selected from any one of hydrogen, deuterium, substituted or unsubstituted C1 to C30 linear or branched alkyl, substituted or unsubstituted C6 to C40 aryl, or substituted or unsubstituted C3 to C40 heteroaryl;

wherein $R_1$ and $R_2$ are each independently selected from any one of deuterium, halogen, cyano, substituted or unsubstituted C1 to C30 linear or branched alkyl, C1 to C30 alkoxy, substituted or unsubstituted C6 to C40 aryl, or substituted or unsubstituted C3 to C40 heteroaryl;

wherein $n_1$ is a first integer selected from 0 to 4;

wherein $n_2$ is a second integer selected from 0 to 5; and wherein L is selected from any one of the following groups or any one of the following groups substituted with a substituent:

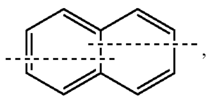
,

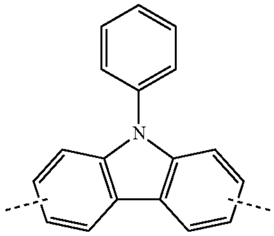
,
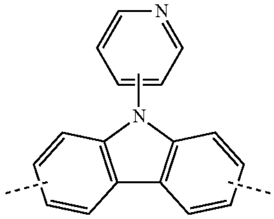
,

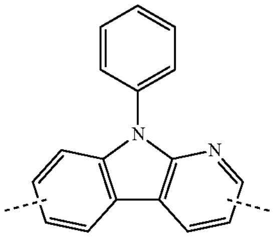
,
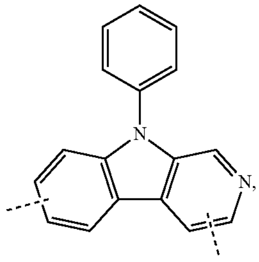
,

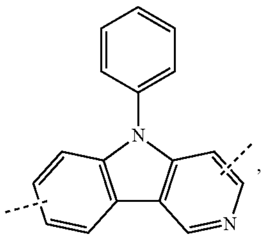
,
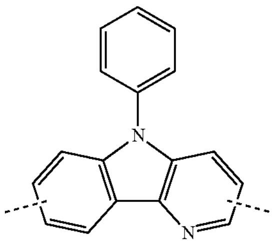
,

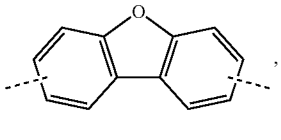
,

-continued

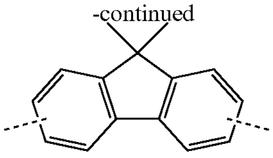
,

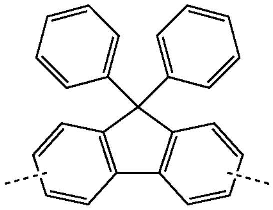
, and

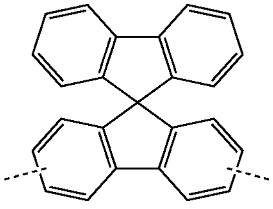
, wherein dashed lines of each group represent linkage sites of the group.

2. The organic compound according to claim 1, wherein substituted substituents in R, $R_N$, $R_{C1}$, $R_{C2}$, $R_{S1}$, $R_{S2}$, L, $R_1$, and $R_2$ are each independently selected from at least one of deuterium, halogen, cyano, C1 to C10 linear or branched alkyl, C3 to C20 cycloalkyl, C1 to C10 alkoxy, C1 to C10 alkylthio, C6 to C20 aryl, C2 to C20 heteroaryl, or C6 to C20 arylamino.

3. The organic compound according to claim 1, wherein Y is N or CR, and R is selected from any one of hydrogen, deuterium, phenyl, pyridyl, biphenyl or naphthyl.

4. The organic compound according to claim 1, wherein $R_N$, $R_{C1}$, $R_{C2}$, $R_{S1}$, and $R_{S2}$ are each independently selected from any one of C1 to C6 linear or branched alkyl, substituted or unsubstituted C6 to C18 aryl, or substituted or unsubstituted C3 to C18 heteroaryl; and wherein substituted substituents are each independently selected from at least one of deuterium, C1 to C6 linear or branched alkyl, C3 to C6 cycloalkyl, C1 to C6 alkoxy, C1 to C6 alkylthio, or C6 to C18 arylamino.

5. The organic compound according to claim 4, wherein $R_N$, $R_{C1}$, $R_{C2}$, $R_{S1}$, and $R_{S2}$ are independently selected from any one of methyl, ethyl, phenyl, biphenyl, naphthyl, anthryl, phenanthryl, pyrenyl or pyridyl.

6. The organic compound according to claim 1, wherein the substituent for L is each independently selected from at least one of deuterium, C1 to C6 linear or branched alkyl, C3 to C6 cycloalkyl, C1 to C6 alkoxy, C1 to C6 alkylthio, C6 to C20 aryl, C2 to C20 heteroaryl, or C6 to C18 arylamino.

7. The organic compound according to claim 1, wherein $R_1$ and $R_2$ are each independently selected from any one of deuterium, halogen, cyano, C1 to C10 linear or branched alkyl, C1 to C10 alkoxy, phenyl, biphenyl, naphthyl, pyridyl, phenylpyridyl or pyridylphenyl.

8. The organic compound according to claim 1, wherein $n_1$ is 0 or 1, and $n_2$ is selected from 0 to 2.

9. The organic compound according to claim 1, having a structure as shown in Formula II:

Formula II

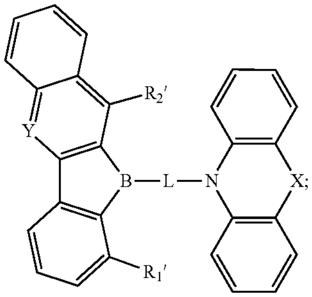

wherein Y, X, and L have the same ranges as defined in Formula I;

wherein $R_1$' and $R_2$' are each independently selected from any one of hydrogen, deuterium, halogen, cyano, substituted or unsubstituted C1 to C30 linear or branched alkyl, C1 to C30 alkoxy, substituted or unsubstituted C6 to C40 aryl or substituted or unsubstituted C3 to C40 heteroaryl; and wherein substituted substituents in $R_1$' and $R_2$' are each independently selected from at least one of deuterium, halogen, C1 to C10 linear or branched alkyl, C3 to C20 cycloalkyl, C1 to C10 alkoxy, C1 to C10 alkylthio, C6 to C20 aryl, C2 to C20 heteroaryl, or C6 to C20 arylamino.

10. The organic compound according to claim 9, wherein $R_1$' and $R_2$' are each independently selected from any one of hydrogen, deuterium, halogen, cyano, C1 to C6 linear or branched alkyl, phenyl, biphenyl, naphthyl or pyridyl.

11. The organic compound according to claim 1, wherein the organic compound is selected from any one of compounds P1 to P5, P46 to P51, P62 to P71, P73 to P91, P96 to P104, P106, P108, and P110;

P1

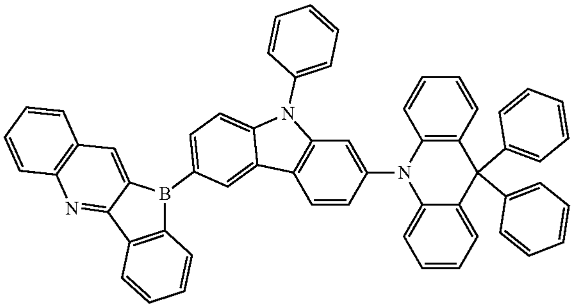

-continued

P2

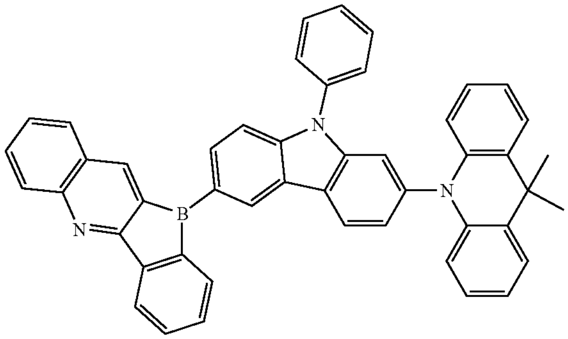

P3

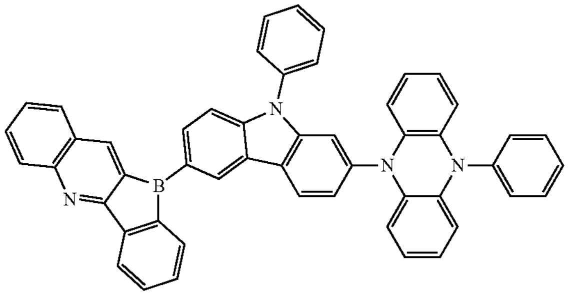

P4

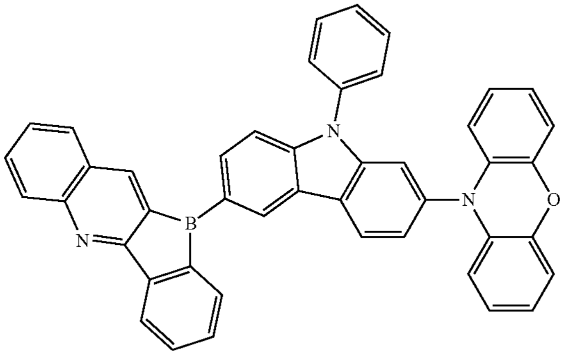

P5

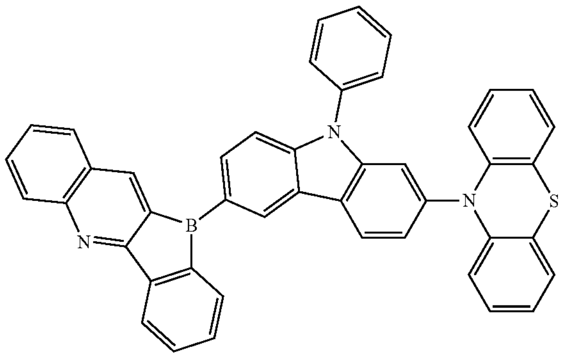

-continued
P46
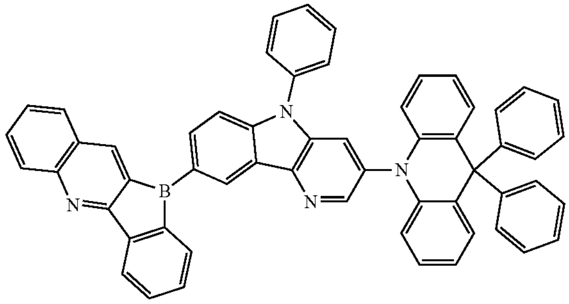
P47
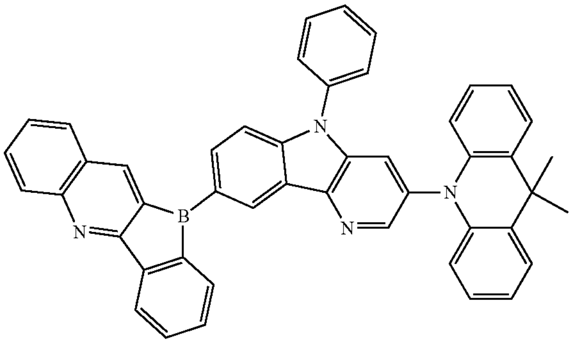
P48
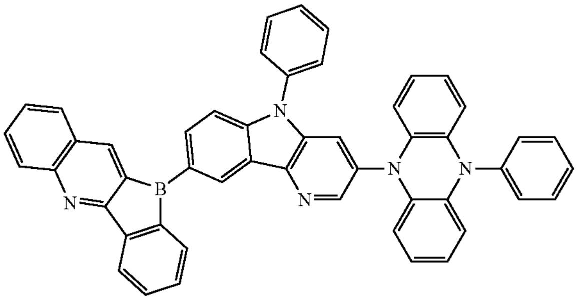
P49
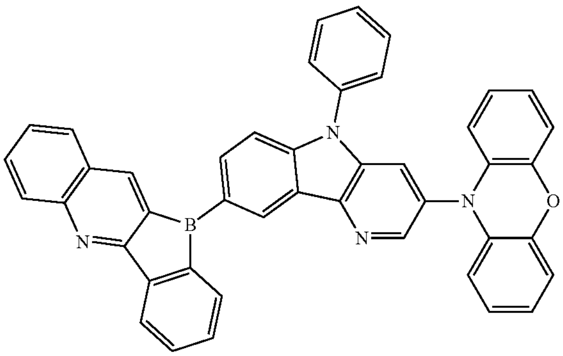
-continued
P50
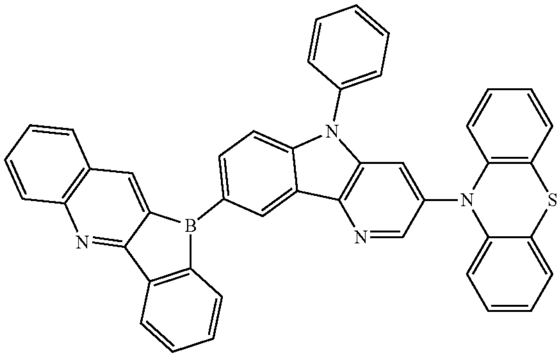
P51
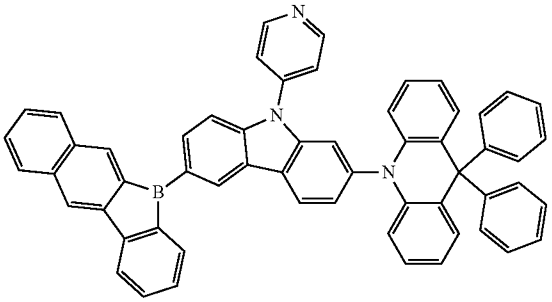
P62
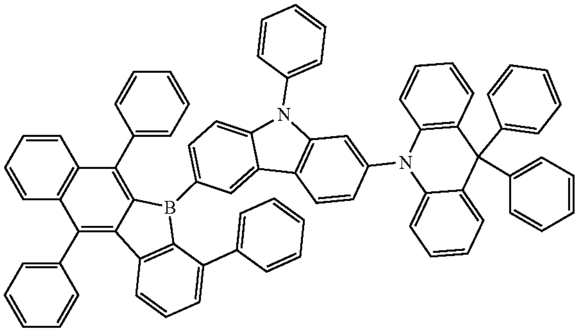
P63
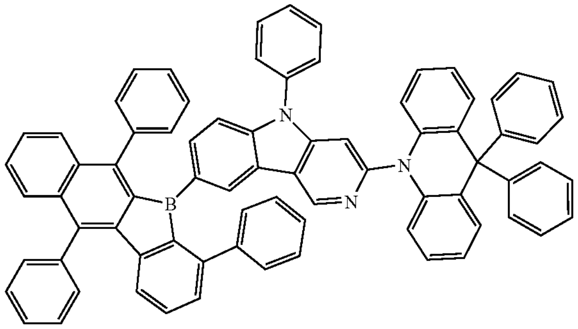

-continued
P64
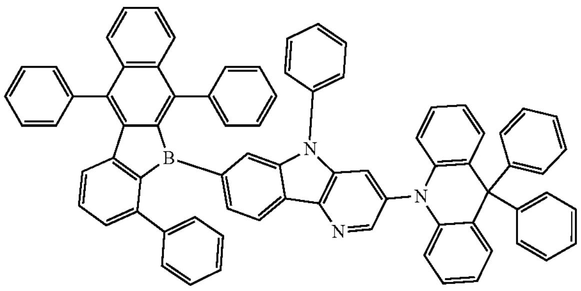
P65
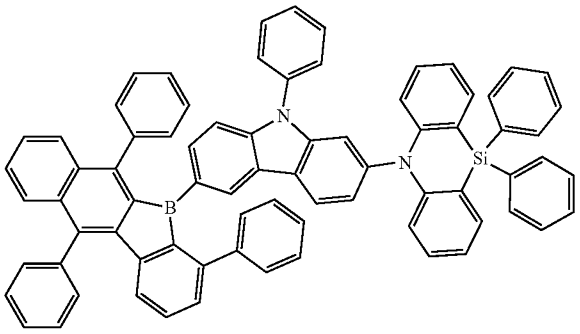
P66
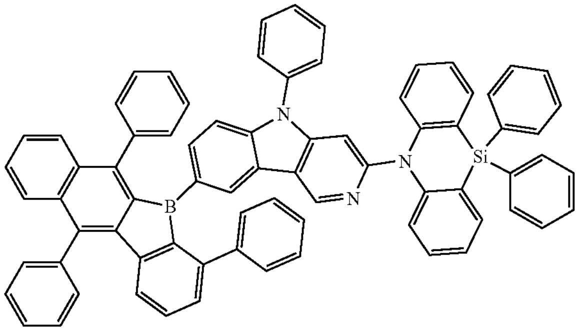
P67
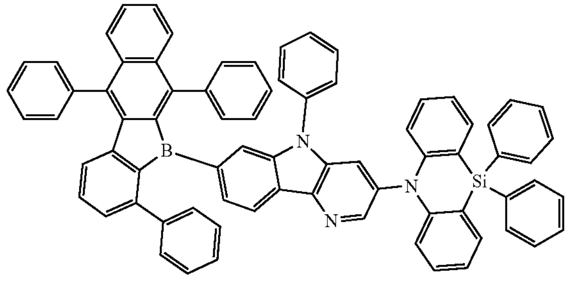
-continued
P68
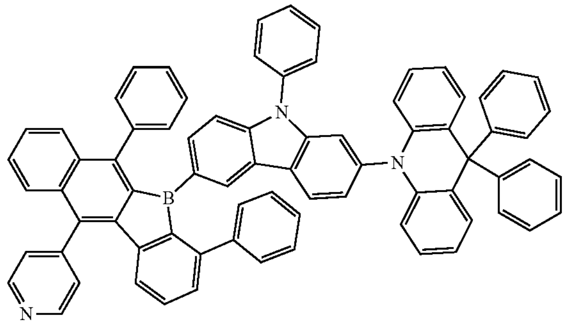
P69
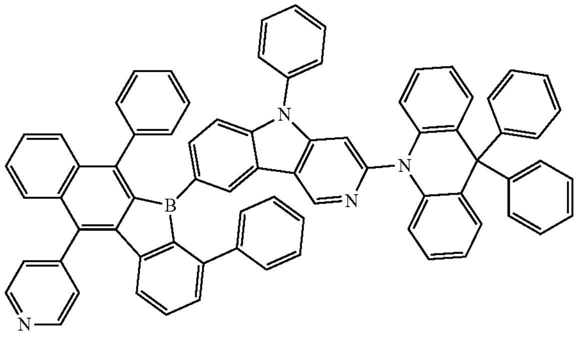
P70
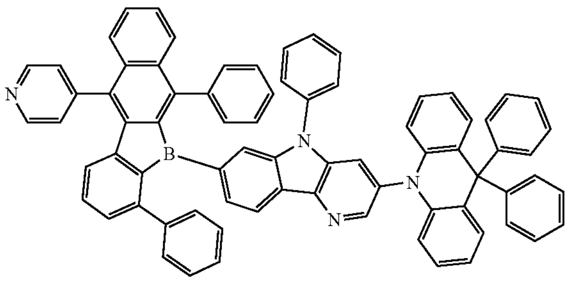
P71
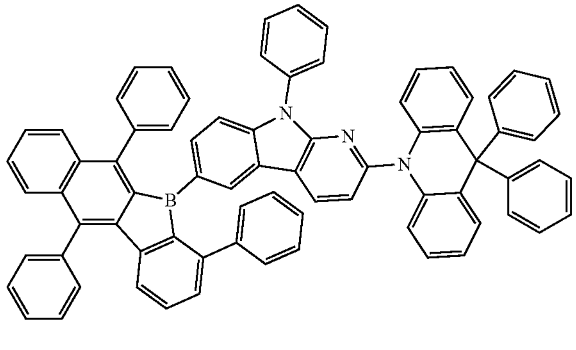

-continued
P73
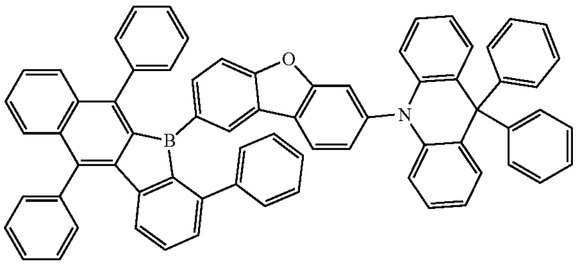
P74
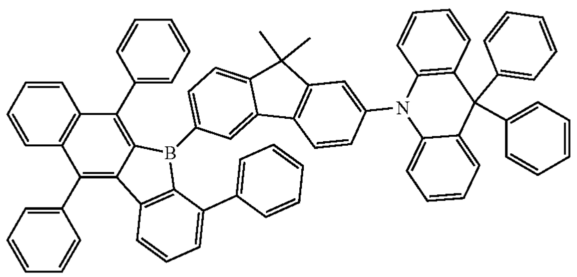
P75
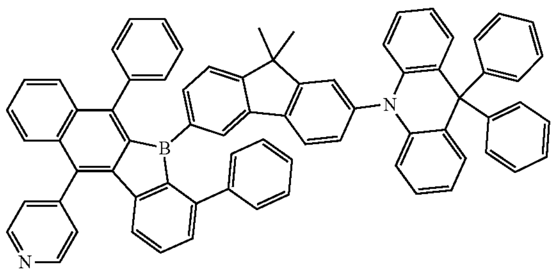
P76
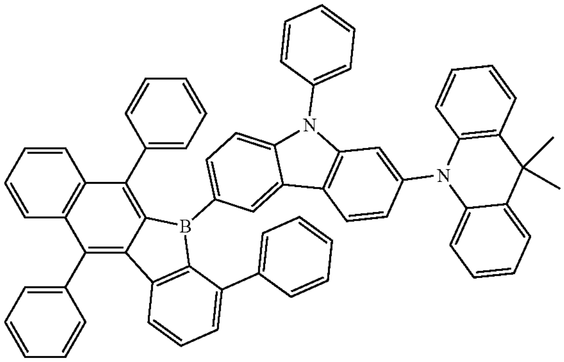
P77
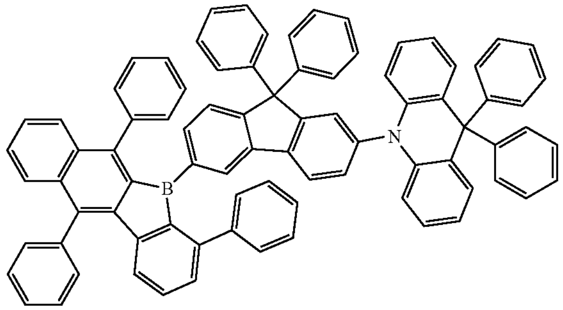
-continued
P78
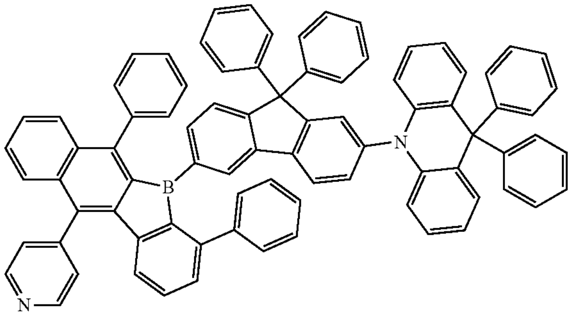
P79
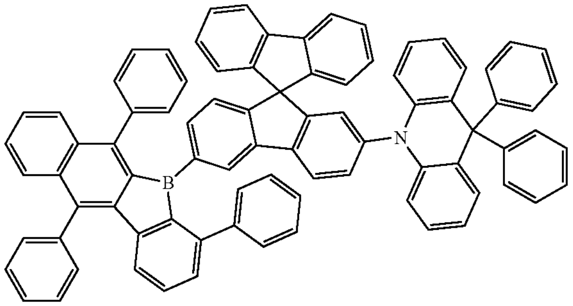
P80
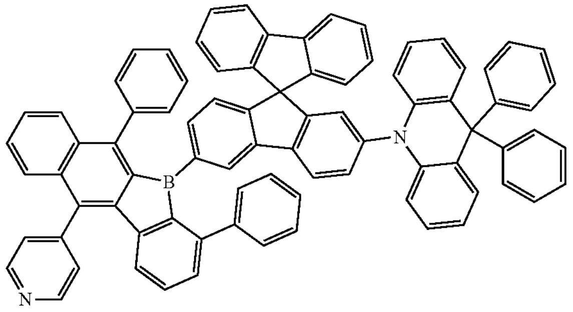
P81
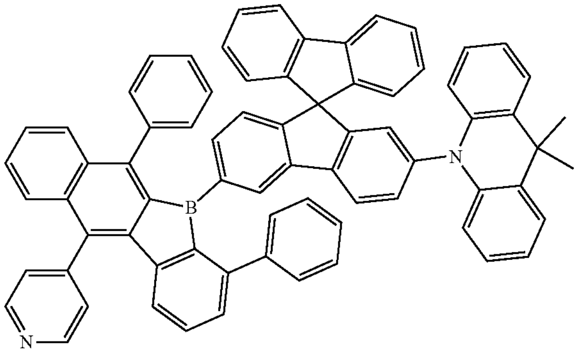

-continued
P82
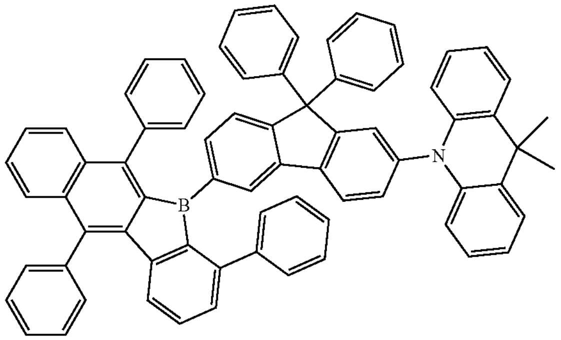
P83
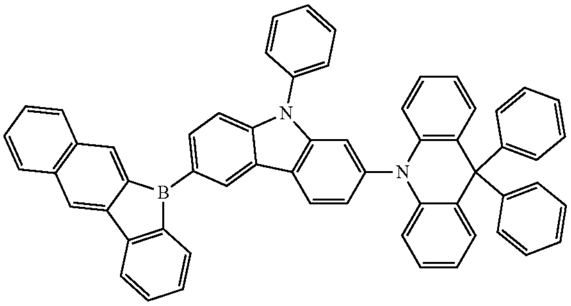
P84
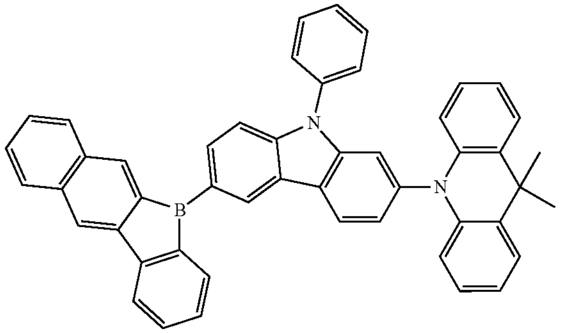
P85
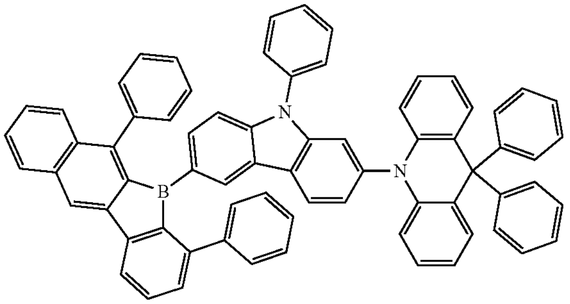
-continued
P86
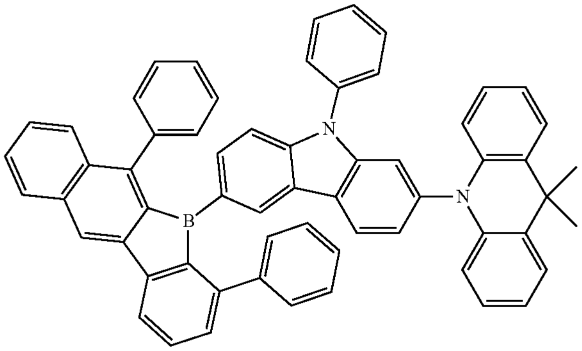
P87
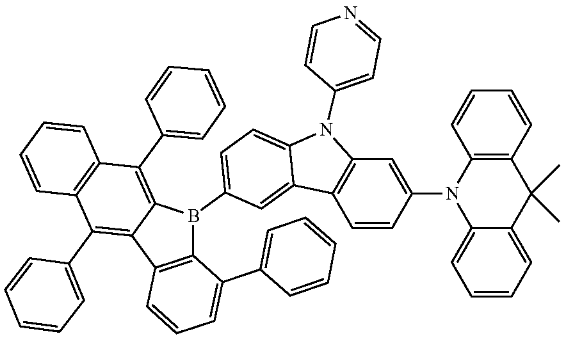
P88
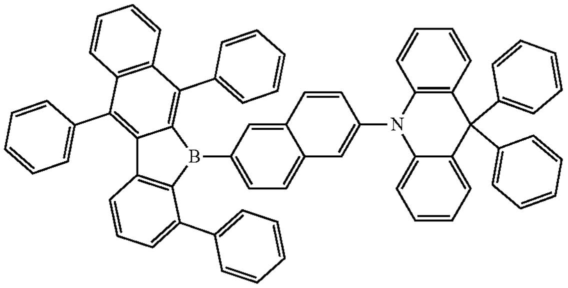
P89
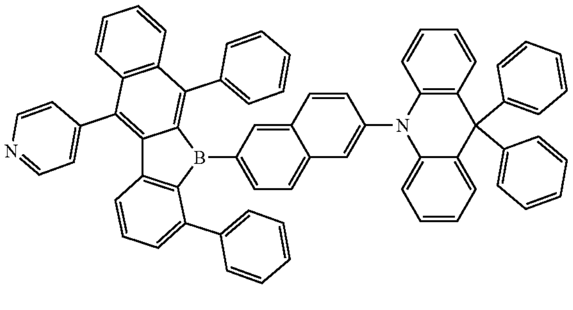

-continued
P90
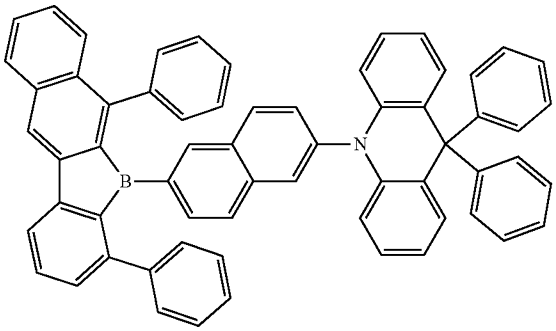
P91
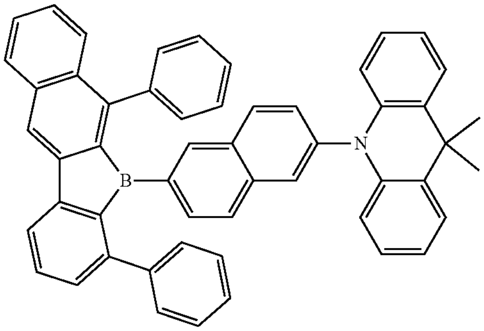
P96
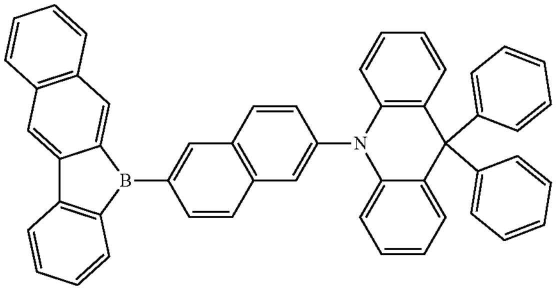
P97
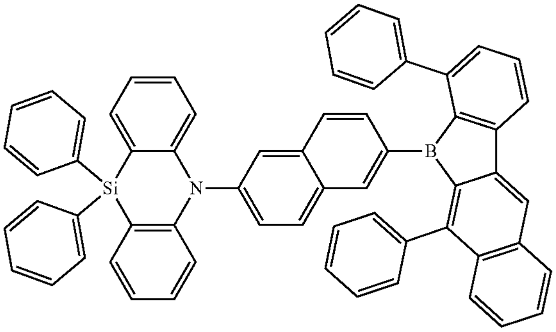
-continued
P98
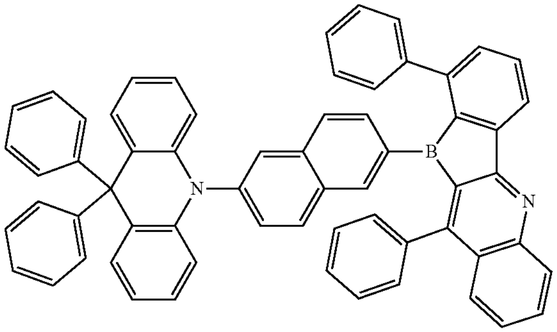
P99
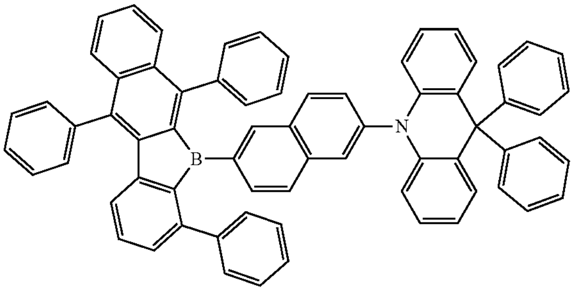
P100
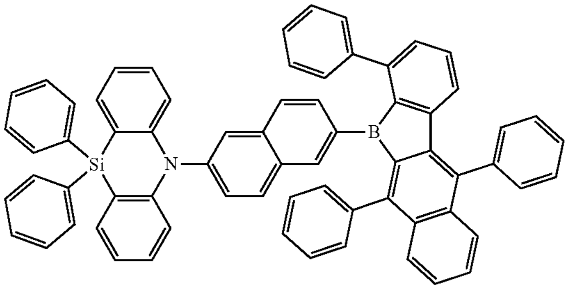
P101
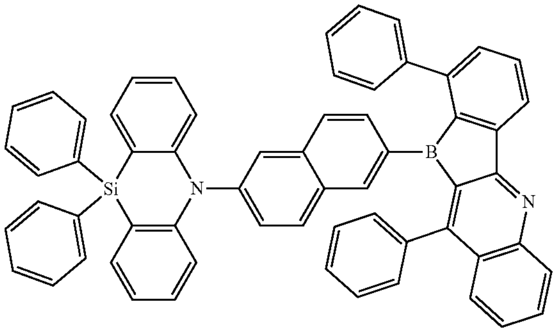

-continued

P102

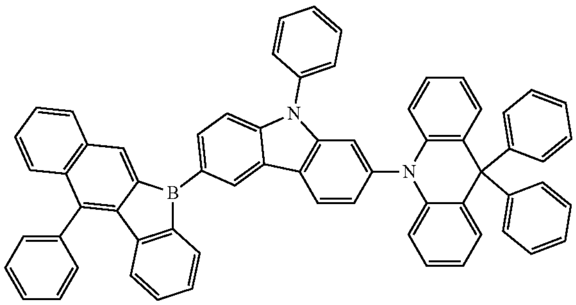

P103

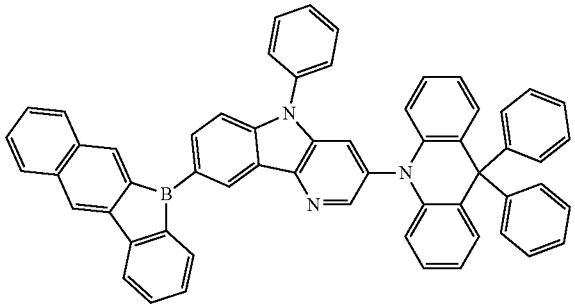

P104

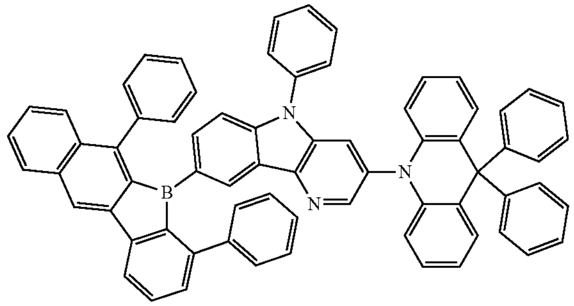

-continued

P106

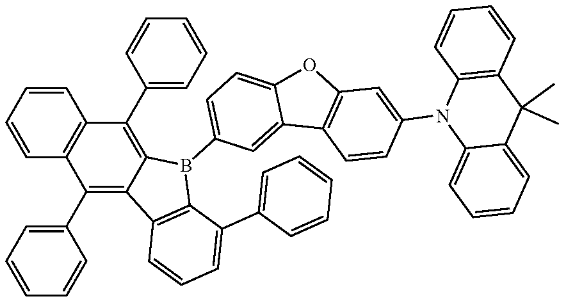

P108

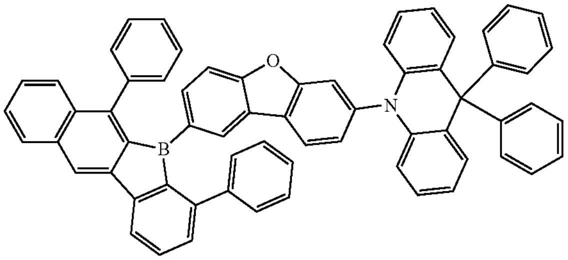

P110

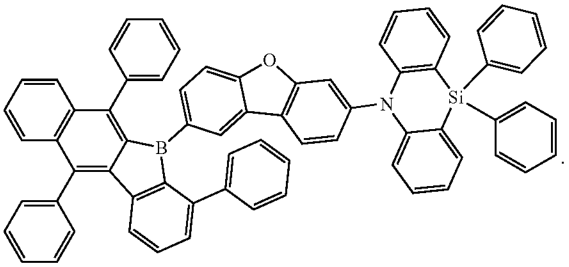

12. An OLED device, comprising an anode, a cathode, and an organic thin film layer disposed between the anode and the cathode, wherein the organic thin film layer comprises at least one organic compound according to claim 1.

13. The OLED device according to claim 12, wherein the organic thin film layer comprises a light-emitting layer, and the light-emitting layer comprises at least one of the organic compound.

14. A display panel, comprising the OLED device according to claim 12.

15. A display device, comprising the display panel according to claim 14.

* * * * *